United States Patent
Narui et al.

(10) Patent No.: US 6,411,543 B2
(45) Date of Patent: Jun. 25, 2002

(54) DYNAMIC RANDOM ACCESS MEMORY (RAM), SEMICONDUCTOR STORAGE DEVICE, AND SEMICONDUCTOR INTEGRATED CIRCUIT (IC) DEVICE

(75) Inventors: Seiji Narui; Osamu Nagashima, both of Hamura; Masatoshi Hasegawa, Ome; Hiroki Fujisawa, Ome; Shinichi Miyatake, Ome; Tsuyuki Suzuki, Akishima; Yasunobu Aoki; Tsutom Takahashi, both of Tachikawa; Kazuhiko Kajigaya, Iruma, all of (JP)

(73) Assignees: Hitachi, Ltd.; Hitachi ULSI Engineering Corp., both of Tokyo (JP)

( * ) Notice: Subject to any disclaimer, the term of this patent is extended or adjusted under 35 U.S.C. 154(b) by 0 days.

(21) Appl. No.: 09/755,170

(22) Filed: Jan. 8, 2001

Related U.S. Application Data

(63) Continuation of application No. 09/101,009, filed on Feb. 8, 1999.

(30) Foreign Application Priority Data

Dec. 28, 1995 (JP) .............................................. 7-353808

(51) Int. Cl.[7] .............................................. G11C 11/24
(52) U.S. Cl. ................... 365/149; 365/230.06; 365/226
(58) Field of Search ............................ 365/149, 230.06, 365/226, 207, 203, 194

(56) References Cited

U.S. PATENT DOCUMENTS 5,295,111 A * 3/1994 Tsujimoto .................... 365/226

FOREIGN PATENT DOCUMENTS

| JP | 3-214669 | 9/1991 |
| JP | 5-12866 | 1/1993 |
| JP | 5-62467 | 3/1993 |

(List continued on next page.)

OTHER PUBLICATIONS

Aoki et al., "A 1.5K DRAM for Battery–Based Applications", 1989 IEEE Int'l Solid–State Circuits Conference, pp. 238–239 & 349.

Asakura et al., "A 34ns 256Mb DRAM with Boosted Sense–Ground Scheme", 1994 IEEE Int'l Solid–State Circuits Conference.

Tsukude et al., "Automatic Voltage–swing Reduction (AVR) Scheme for Ultra Low Power DRAMs", 1994 Symposium on VLSI Circuits Digest of Technical Papers.

(List continued on next page.)

*Primary Examiner*—A. Zarabian
(74) *Attorney, Agent, or Firm*—Antonelli, Terry, Stout & Kraus, LLP

(57) ABSTRACT

There is produced a first internal voltage having a difference relative to a power supply voltage, the difference being substantially equal to a threshold voltage of an address selection MOSFET of a dynamic memory cell. The first voltage is supplied to a sense amplifier as an operating voltage on a high-level side thereof. There is produced a second internal voltage having a predetermined difference relative to a circuit ground potential. The second voltage is supplied to the sense amplifier as an operating voltage on a low-level side thereof. A write signal having a high level corresponding to the first internal voltage and a low level corresponding to the second internal voltage is generated by a write amplifier to be transferred to a pair of complementary data lines connected to the dynamic memory cell. A high level, e.g., the power supply voltage representing a selection level and a low level, e.g., the circuit ground level indicating a non-selection level are supplied to a word line connected to the dynamic memory cell.

18 Claims, 41 Drawing Sheets

U.S. PATENT DOCUMENTS

| JP | 5-109274 | 4/1993 |
| JP | 5-128857 | 5/1993 |
| JP | 5-291534 | 11/1993 |
| JP | 6-76574 | 3/1994 |
| JP | 7-57461 | 3/1995 |
| JP | 7-240093 | 9/1995 |

OTHER PUBLICATIONS

Asakura et al., "An Experimental 256–Mb DRAM with Boosted Sense–Ground Scheme", Jrnl of Solid–State Circuits, vol. 29, No. 11, Nov. 1994.

Ooishi et al., "An Automatic Temperature Compensation of Internal Sense Ground for Subquarter Micron DRAMs", IEEE Journal of Solid–State Circuits, vol. 30, No. 4, Apr. 1995, pp. 471–479.

* cited by examiner

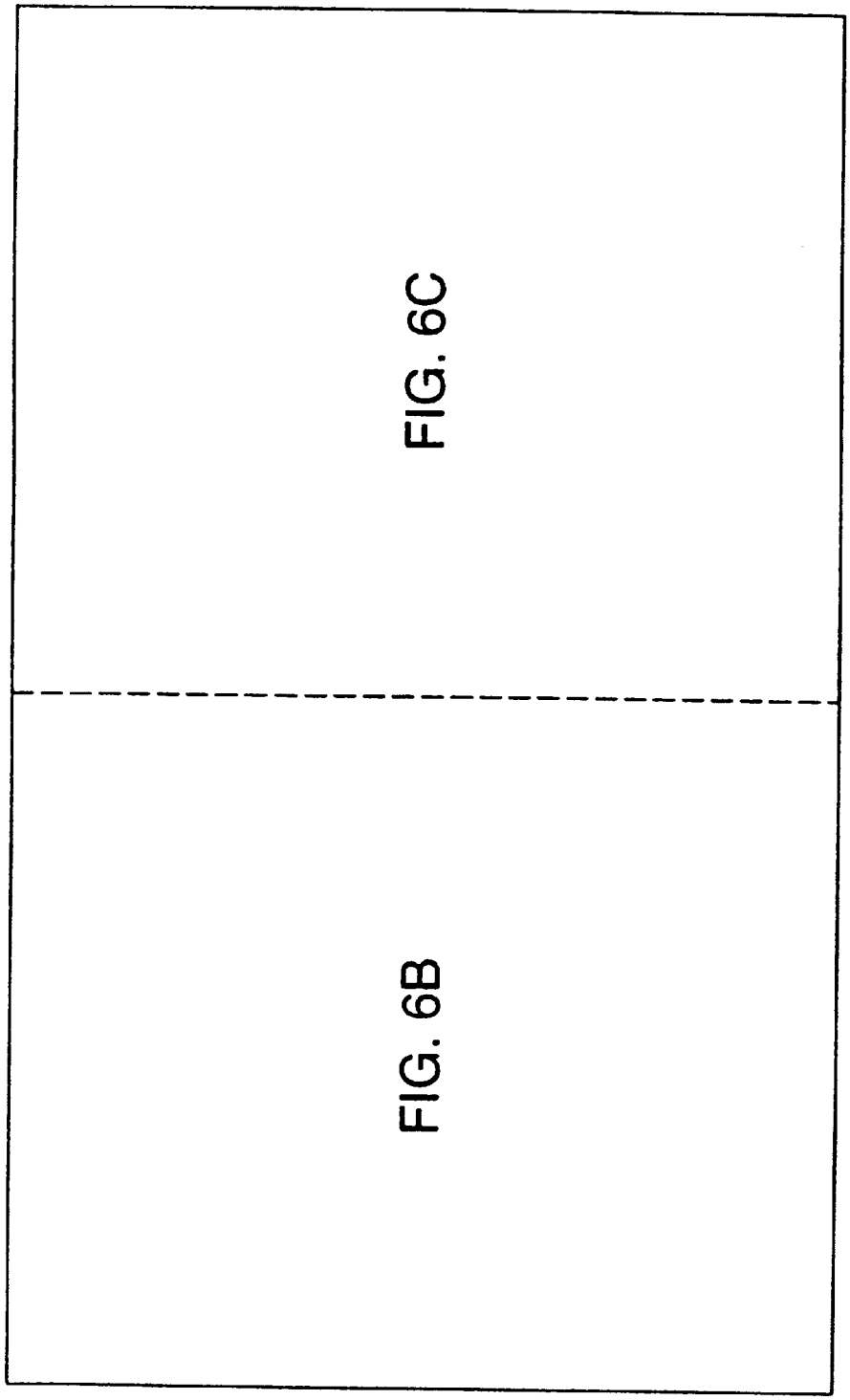

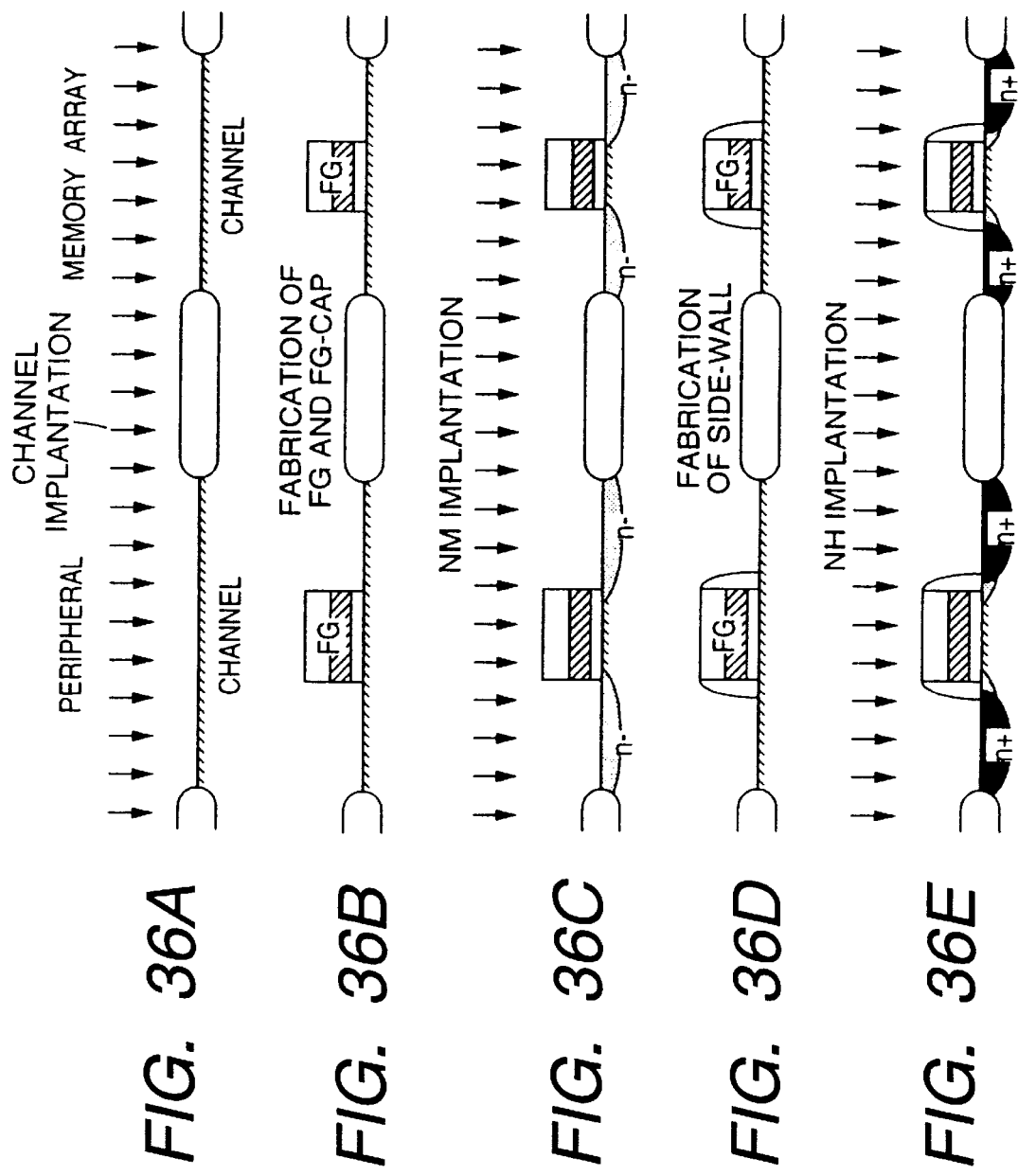

DYNAMIC RANDOM ACCESS MEMORY (RAM), SEMICONDUCTOR STORAGE DEVICE, AND SEMICONDUCTOR INTEGRATED CIRCUIT (IC) DEVICE

CROSS-REFERENCE TO RELATED APPLICATION

This application is a continuation of application Ser. No. 09/101,009, filed on Feb. 8, 1999, the entire disclosure of which is hereby incorporated by reference.

TECHNICAL FIELD OF THE INVENTION

The present invention relates to a dynamic RAM (DRAM), a semiconductor storage device, and a semiconductor IC device and to a technology to be efficiently applied to a memory access scheme to access dynamic memory cells.

BACKGROUND OF THE INVENTION

There is type of a dynamic RAM having a voltage generator circuit including charge pump circuits for producing a back bias voltage to be supplied to a substrate of the RAM and a boosting voltage to generate a selection voltage boosted for a word line of the RAM. JP-A-3-214669 describes an example of such a dynamic RAM. In the dynamic memory described in JP-A-5-291534, the substrate voltage is set to 0 volt (V), the data line has a high-level potential of 2 V and a low-level potential of 1 V, and the word line possesses a selection level of 3 V. In the publication "ISSCC '94/Session 8/DRAMs and Non-Volatile Memories/Paper TA 8.2", there has been described a boosted sense-ground technology. On the other hand, JP-A-7-57461 is directed to a technology related to a memory array in which the amplitude of the data line voltage is set such that the high and low levels of the data line are respectively set to 1.5 V and 0 V and the amplitude of the word line voltage is selected such that the high and low levels of the word line are respectively set to 2 V V and –0.5 V. In JP-A-5-12866, there has been described a dynamic RAM in which neither a substrate biasing circuit nor a word boosting circuit are employed. JP-A-7-240093 discloses a dynamic RAM in which a memory array including bit lines, a memory cell, and a sense amplifier are supplied with a low-level potential which is higher than the ground potential of the RAM chip.

A dynamic memory cell includes address selecting metal-oxide field-effect transistors (MOSFETs) and an information storing capacitor to achieve information storage according to the presence or absence of an electric charge in the capacitor. To keep information in the form of charge for a long period of time, it is required to supply a negative back bias to a substrate gate (corresponding to a channel region) on which the address selection MOSFETs are fabricated so as to increase the value of the effective threshold voltage of the MOSFETs.

In such MOSFETs which constitute a peripheral circuit to achieve an operation to select an address of the dynamic memory cell and which constitute a sense amplifier and a main amplifier, when a negative back bias voltage is supplied to the substrate gate, the threshold voltage is increased according to the supplied voltage. This leads to reduction in conductance in the on state thereof and hence the operation speed of the circuit is accordingly lowered. To avoid this drawback, there has been proposed a method in which a negative back bias voltage is applied to the memory array section including the dynamic memory cells. However, in such a case in which, for example, different bias voltages are supplied respectively to a substrate of the memory array section and a substrate of the peripheral circuit section, it is required to separate a well region as a substrate of the memory array section and a well region as a substrate of the peripheral circuit section. This disadvantageously complicates the production process of the semiconductor devices.

In a high-level write operation for the dynamic memory cell, since the information storage capacitor is charged up via the address selection MOSFET, it is necessary to set the gate potential of the MOSFET to an appropriate level. When this operation is not conducted, the charge-up level is lowered according to the voltage corresponding to the threshold voltage of the MOSFET, and hence the amount of the information charge is reduced. To prevent such a level reduction, the selection level of the word line connected to the gate of the MOSFET is set to a voltage obtained by adding at least the threshold voltage to the high-level voltage applied to the bit line. As indicated above, in the conventional dynamic RAM, a voltage boosting operation for the word line selection is required. To generate such a boosting voltage for the word lines and the substrate back bias voltage, there are respectively required charge pump circuits. This resultantly leads to a relatively large area increase in current consumoption current, which is a distinct drawback.

SUMMARY OF THE INVENTION

It is therefore an object of the present invention to provide a dynamic RAM which capable of an improved degree of circuit integration and an increase in the operation speed without complicating the production process.

Another object of the present invention is to provide a semiconductor IC device including a dynamic RAM in which the degree of circuit integration is improved and the operation speed is increased without complicating the production process.

The above and other objects, as well as other novel features of the present invention, will be more easily understood in conjunction with the following description and accompanying drawings.

In short, the present invention will be representatively described as follows. Namely, there is included a dynamic RAM on a semiconductor substrate and at least a memory control circuit mounted on the substrate. In the dynamic RAM, a first internal voltage is produced to have a voltage difference relative to a power source voltage, the voltage difference being substantially equal to the threshold voltage of the address selection MOSFET in a dynamic memory cell such that the first internal voltage is supplied to the sense amplifier as a high-level operation voltage. A second internal voltage is created to have a predetermined voltage difference relative to the circuit ground potential and is supplied to the sense amplifier as a low-level operation voltage. A write amplifier produces a write signal of which the high and low levels correspond to the first and second internal voltages, respectively. The write signal is transferred to complementary bus lines. On the other hand, a word line connected to the dynamic memory cell receives a word line selection signal or a memory selection signal of which a high level, such as the level of the power source voltage, is set as a selection level and a low level, such as that of the circuit ground potential, is selected as a non-selection level.

BRIEF DESCRIPTION OF THE DRAWINGS

These and other objects and advantages of the present invention will become apparent by reference to the following description and accompanying drawings wherein:

FIG. 6A is a diagram showing a relationship between memory arrays respectively of FIGS. 6B and 6C;

FIG. 7A is a diagram showing the layout of another embodiment of the dynamic RAM according to the present invention;

FIG. 8A is a diagram showing the layout of still another embodiment of the dynamic RAM according to the present invention;

FIGS. 36A to 36E are cross-sectional diagrams of the primary section of the semiconductor IC device according to the present invention for explaining an embodiment of the production process thereof;

DESCRIPTION OF THE PREFERRED EMBODIMENTS

Figure 1:
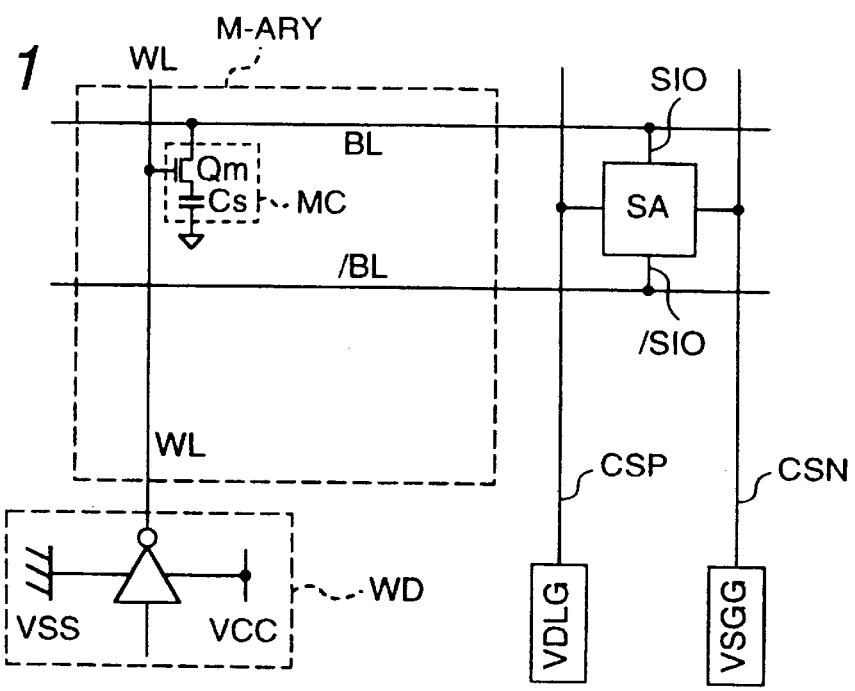
FIG. 1 is a schematic diagram showing the primary portion of an embodiment of the dynamic RAM according to the present invention.

FIG. 1 shows a simplified circuit diagram of the primary section of the dynamic RAM according to the present invention. In this diagram, there are representatively shown a pair of complementary bit lines BL and /BL, a word line WL, a word driver WD for generating a selection signal of the word line WL, a dynamic memory cell MC disposed at a crosspoint between one of the complementary bit lines BL and the word line WL, a sense amplifier SA provided for the complementary bit lines (a pair of complementary data lines) BL and /BL, and a first voltage generator circuit VSGG and a second voltage generator circuit VDLG for generating an operation voltage of the sense amplifier SA.

Using operating voltages including a power source voltage (second voltage) VCC and a circuit ground potential (first voltage) VSS, the word driver WD generates at reception of an output signal from a decoder, not shown, a selection level similar to the level of the voltage VCC or a nonselection level like the level of the ground potential VSS and then sends the signal of the selected level to the word line WL. On the other hand, the sense amplifier SA uses as the operation voltages, in place of the power source voltage VCC and ground potential VSS, a voltage VDL obtained by reducing a threshold voltage of a selection MOSFET Qm of the dynamic memory cell from the power source voltage VCC and a voltage VSG attained by adding, though the invention is not particularly limited thereto, the threshold voltage of the selection MOSFET Qm to the ground potential VSS.

Figure 2:
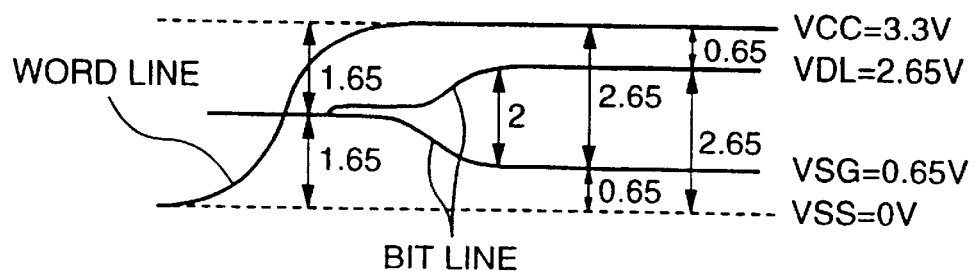
FIG. 2 is a diagram showing signal waveforms for explaining the memory of FIG. 1.

FIG. 2 shows signal waveforms for explaining the dynamic RAM according to the present invention. In the operation waveforms of FIG. 2, there is actually shown a relationship in potential between the operating voltage of the peripheral circuit represented by the word driver WD and that of the sense amplifier SA. Although the invention is not particularly limited thereto, the operating voltage VCC of the peripheral circuit is set to 3.3 V. In relation thereto, the high-level operating voltage VDL of the sense amplifier SA is set to 2.65 V which is attained by subtracting 0.65 V from the power source voltage VCC (=3.3 V) according to the threshold voltage of the selection MOSFET Qm. The circuit ground potential VSG is 0 V and the low-level operating voltage VSG of the sense amplifier SA is set to 0.65 V which is attained by adding 0.65 V to the circuit ground potential VSS (=0 V).

As a result of the voltage thus established above, for the nonselection level (=0 V) and selection level (=3.3 V) of the word line WL, the high level of the amplified signals supplied to the complementary bit lines BL and /BL through the amplification of the sense amplifier SA is set to 2.65, whereas the low level thereof is set to 0.65 V corresponding to the operating voltage VSG. Consequently, thanks to the amplifying operation of the sense amplifier SA, there appears a voltage difference of 2 V between the complementary bit lines BL and /BL. That is, although the dynamic RAM according to the present invention is operated with 3.3 V of the power source voltage VCC, the voltage difference between the complementary bit lines BL and /BL is limited to 2 V while each the high and low levels has an offset voltage of 0.65 V.

Figure 3:
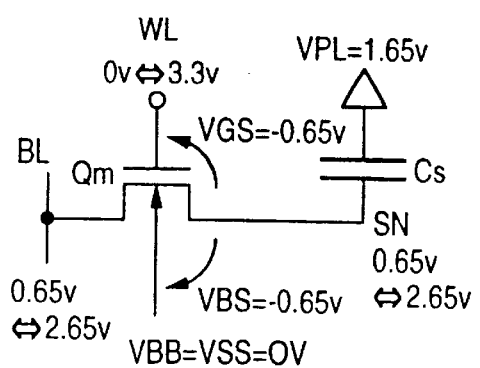
FIG. 3 is a circuit diagram for explaining a potential relationship between electrodes of the dynamic memory cell of FIG. 1.

FIG. 3 is a circuit diagram showing a potential relationship between the respective electrodes of the dynamic memory cell. The gate of the address selection MOSFET Qm is connected to the word line WL. The gate voltage connected to the word line WL is set to 3.3 V for the selection level or to 0 V corresponding to the nonselection level. In contrast therewith, either one of the source and the drain paired therewith of the MOSFET Qm is connected to the bit line BL. The potential thereof is set to a low level of 0.65 V associated with the voltage VSG or a high level of 2.65 related to the voltage VDL. Like the n-channel MOSFET in the peripheral circuit, the address selection MOSFET Qm is adjusted to have a low threshold voltage. Thanks to this, to control the impurity concentration of the channel regions of the MOSFET Qm of the memory cell and the n-channel MOSFET of the peripheral circuit, the ion implantation process can be achieved in a shared manner.

The remaining one of the regions, i.e., the source or drain of the MOSFET Qm is linked with an accumulation node SN of the information storage capacitor Cs. The potential of the node SN is set to a low level of 0.65 corresponding to the voltage VSG supplied from the bit line BL or a high level of 2.65 associated with the voltage VDL. The other electrode of the capacitor Cs, which is shared with other capacitors, is supplied with a plate voltage VPL. The voltage VPL is set to, although the invention is not particularly limited thereto, a middle point voltage of 1.65 related to a precharge voltage VMP of the complementary bit line BL.

The voltage VGS between the gate coupled with the word line WL of the MOSFET Qm and the source or drain (on the side of accumulation node SN) is a reverse bias voltage of −0.65 when the word line WL is at 0 V indicating the nonselection level and the node SN is kept at the low level (0.65 V). This means that the voltage VGS between the gate connected to the word line WL of MOSFET Qm and the remaining source or drain (on the side of bit line BL) is also a reverse bias voltage, not the negative back bias voltage VBB. Therefore, the substrate gate (channel) of the MOSFET Qm can be set to the circuit ground potential VSS (=0 V). In addition, since the source potential of the MOSFET Qm includes an offset value, the nonselection level of the word line WL prevents an increase in the leakage current of the MOSFET Qm connected to the nonselection word line even when the potential of the nonselection word line is increased due to the capacitive coupling between the selection word lines. This leads to an advantageous result in that the information can be kept in the capacitor for a longer period of time.

As above, when the circuit ground potential (GND) VSS is applied to the substrate gate of the address selection MOSFET, it is possible to remove the substrate back bias voltage generator employed in the conventional dynamic RAM. In general, for example, to prevent the substrate bias voltage from changing between the memory access and non-access situations due to low power consumption, the substrate back bias voltage generator circuit includes a substrate voltage generator circuit having a current supply associated with the leakage current in the non-access operation and a substrate back bias voltage generator circuit having a relatively large current supply corresponding to the substrate current which becomes relatively large in the memory access operation. In the dynamic RAM according to the present invention, the substrate back bias voltage generator can be removed and hence the circuit configuration is simplified and the required current is lowered.

The gate linked with the word line WL of the address selection MOSFET Qm is supplied with 3.3 V as the selection level or 0 V as the nonselection level. The bit line BL is supplied with 2.65 for the high level and 0.65 V for the low level. In consequence, when the word line WL is at 3.3 V (selection level) and the bit line (data line) BL is at 2.65 V (high level), the accumulation node SN (connection point between MOSFET Qm and one of the electrodes of storage capacitor CS) is set to a potential of 2.65 V. Additionally, when the word line WL is at 3.3 V (selection level) and the bit line (data line) BL is at 0.65 V (low level), the accumulation node SN is set to a potential of 0.65 V. In short, the potential of the accumulation node SN is identical to that of the bit line (data line). Moreover, the potential of the node SN is not lower than that of the bit line BL due to the threshold voltage of the MOSFET Qm. As above, the power supply voltage VCC can be directly adopted as the operating voltage of the word driver to drive the word line WL. In consequence, it is possible to remove the conventional booster circuit employing a charge pump circuit for the operating voltage of the word driver. This advantageously results in the simplification of the circuit structure and the reduction of the current consumption.

The embodiment will be described in more detail.

First, as can be seen from FIG. 1, the memory array M-ARY is constructed in a so-called two crosspoint system or a so-called folded bit line configuration.

That is, the bit lines BL and /BL constitute complementary bit lines which have an electrically complementary relationship therebetween and extend in parallel with each other on a semiconductor substrate of the memory array M-ARY. On the substrate, the word line WL is extended to substantially vertically intersect the direction of the complementary bit lines BL and /BL. The dynamic memory cell MC is provided at either one of the crosspoints between the bit lines BL and /BL and the word line WL.

Unlike the memory array of the so-called one crosspoint or open bit line configuration, the memory array of the two cross point or folded bit line construction is capable of fully avoiding influence from noise disadvantageously applied to the respective bit lines due to undesirable coupling between the word line and the complementary bit lines. Consequently, the present invention is quite suitable for a memory array configuration in which the charge of information is reduced in the memory cell and the level of the signal read from the memory cell is relatively lowered as in the embodiment.

The memory cell MC is a so-called one MOS dynamic memory cell including one selection MOSFET Qm and one information storage capacitor Cs.

In the memory cell MC, the gate of the selection MOSFET Qm is used as a selection terminal of the memory cell MC and the electrode of Qm coupled with the bit line BL functions as a data terminal of the memory cell MC.

The MOSFET Qm includes an n-channel enhancement-mode MOSFET and is constructed in a device structure substantially similar to that of the n-channel enhancement-mode MOSFET of the peripheral circuit including the word driver WD described above.

The information storage capacitor Cs includes one electrode connected to the MOSFET Qm, the other electrode thereof forming a shared plate electrode together with the associated electrodes of the other capacitors Cs in the remaining memory cells, not shown. The latter is linked with a plate bias power source, not shown. The plate bias power source receives the power supply voltage VCC of the dynamic RAM from an external device and generates therefrom a bias voltage having a voltage level (VCC/2) which is half that of the voltage VCC.

The capacitors Cs are fabricated on an insulation film on the semiconductor substrate of the memory array M-ARY in a stacked capacitor configuration.

In the capacitor such as the stacked capacitor manufactured on the semiconductor substrate with an insulation layer formed between the substrate and the capacitor, the electrodes thereof are insulated from the semiconductor substrate by the insulating layer and hence the leakage current thereof is minimized. Therefore, the capacitors of this type are especially suitable for the memory cells for which the amount of information charge is reduced as in the embodiment above.

The dynamic RAM of the embodiment is operable with a relatively low value of 3.3 V of the external power source voltage VCC.

As a result, the dynamic RAM of the embodiment is suitably applicable to an electronic system such as a system centered on a microcomputer in which the operating voltage supplied from the power source is lowered in association with characteristics of the power consumption and operation speed.

To fully operate with a low power supply voltage, the MOSFET of the dynamic RAM of the embodiment has a threshold voltage set to a relatively small value of, for example, 0.65 V. On the other hand, when the threshold voltage of the MOSFET is lowered, it is required to pay attention to the sub-threshold leakage current which appears between the drain and the source thereof even when the gate-source voltage is 0 V. The sub-threshold leakage current causes an increase in the operating current in such peripheral circuits of the dynamic RAM as a buffer circuit for data and addresses, an address decoder circuit, a control circuit to generate a predetermined timing signal, and a voltage generator circuit. However, the sub-threshold leakage current exerts a more adverse influence on the operation of the memory cell.

That is, due to the sub-threshold leakage current, the selection MOSFET Qm of the dynamic memory cell constitutes a leakage current path between the bit line BL or /BL and the information storage capacitor Cs. This prevents the information charge being held in the capacitor Cs for a long period of time.

In this embodiment, although the invention is not particularly so restricted, the peripheral circuit of the dynamic RAM is basically manufactured in a complementary MOS (CMOS) configuration similar to that of the ordinary CMOS circuit.

In contrast therewith, the memory cell is fabricated to accomplish a sufficient memory operation.

Namely, the substrate gate of the selection MOSFET is kept at the circuit ground potential VSS in the memory cell and hence a back bias voltage generator is unnecessary. The low level of the bit lines BL and /BL is set to a predetermined value slightly higher than the circuit ground potential and hence the sub-threshold leakage current is sufficiently lowered or suppressed.

The amount of potential shift of the bit line BL toward the high potential side may be set to an arbitrary value. However, to favorably control the value in a stable state by a circuit fabricated in a semiconductor IC device together with the dynamic RAM, it is desirable to set the value to be substantially equal to the threshold value of the MOSFET such as the selection MOSFET. The reason for this will be explained more in detail with reference to a detailed example of a circuit, which will be described later.

In the embodiment, the low level of the bit lines BL and /BL is increased in potential and the high level thereof is shifted toward a value less than the power supply voltage VCC as above. The high level of the bit lines BL and /BL leads to the reduction of the power consumption of the dynamic RAM and has a technological meaning to establish an appropriate circuit operation characteristic, which will be more clearly described below. Although the shift amount can be appropriately selected, it is more desirable to set the value to be substantially equal to the threshold value of the selection MOSFET as described above.

In other words, in a case in which high-level information is to be written via the bit line BL in the information storage capacitor Cs in the memory cell MC, when the accumulation potential of the capacitor Cs is lower than the potential of the word line WL and the discrepancy therebetween is equal to or more than the threshold voltage of the MOSFET Qm, the MOSFET Qm becomes conductive. On the other hand, when the difference between the potential of the word line WL and the accumulation potential of the capacitor Cs is lower than the threshold voltage of the MOSFET Qm, the MOSFET Qm becomes non-conductive. Since the selection level of the word line WL is equal to the power source voltage VCC and the selection MOSFET Qm develops the above-mentioned operation characteristic, when the high level of the bit line BL is equal to or more than VCC−Vth (where, Vth is the threshold voltage of MOSFET Qm), the maximum value of the high-level voltage which can be supplied via the MOSFET Qm to the capacitor Cs is VCC−Vth.

Even with the restricted value of the high level to be supplied to the capacitor Cs, when the high level of the bit line exceeds the maximum value, there arises the following problem.

That is, while FIG. 1 includes only the minimum structure necessary for the description, the memory array M-ARY of the dynamic RAM fabricated as an actual semiconductor IC device ordinarily includes quite a large number of memory cells and a large number of bit and word lines. Accordingly, the length of each bit line becomes greater and hence the bit line has a floating capacitance which cannot be ignored. Moreover, due to the parasitic capacitance of the data terminals of the plural memory cells, there occurs a coupling between the parasitic capacitance.

This results in an undesired capacitance having a relatively large value.

The undesired capacitance of each bit line is charged or discharged to supply an amplification signal to the bit line by the sense amplifier SA and is similarly charged or discharged to supply a write signal to the bit line by a write circuit, now shown.

Since the undesired capacitance of each bit line is charged or discharged according to the required signal, the dynamic RAM consumes an excessive power. As widely well known, in a dynamic RAM including dynamic memory cells of the one MOS structure, in operations such as the read, write, and refresh operations, overall circuit operations are carried out including the precharge of the plural bit lines, word line selection, and operations of the plural sense amplifiers after the word line selection. Namely, the precharge, charge, and discharge operations are achieved for the bit lines in a large unit corresponding to one memory array. Consequently, a relatively large power is required to charge and to discharge the undesired capacitance of the respective bit lines.

In this embodiment, the voltage amplitude of each bit line is relatively small due to the setting or limitation of the high and low levels of the voltage. Therefore, it is possible to reduce the power consumed to charge and to discharge the undesired capacitance of the respective bit lines.

The potential shift of the high and low levels of the bit lines BL and /BL reduces the power consumption as indicated above. Moreover this indicates that the amplification signal supplied from the bit line related to the sense amplifier SA may have a small amplitude or a small variation width and the write signal supplied to the bit line from an associated write circuit, not shown, may have a small amplitude or a small variation width. This resultantly leads to an increase in the read and write operations.

The sense amplifier SA includes a pair of input and output nodes SIO and /SIO connected to the complementary bit lines BL and /BL, and amplifies, to the high or low level, the read signal at quite a low level read from a memory cell selected through the word line selection and transferred to the associated bit line. Moreover, in the data write operation, the sense amplifier SA amplifies, at an early point of time to a predetermined high or low level, the signal supplied from a write circuit, not shown, to the bit line. Consequently, data read from the selected memory cell is amplified to the restored level by the sense amplifier SA to be written again via the bit line in the memory cell and the write data is amplified by the sense amplifier SA to the predetermined high and low levels to be thereafter written in the memory cell.

The sense amplifier SA can be constructed in an appropriate structure to generate signals at the predetermined levels. In this embodiment, the sense amplifier SA as a favorable example includes a sense amplifier of a flip flop circuit configuration in which a pair of input and output terminals of a CMOS inverter, not shown in detail, are connected in a cross-connected manner. Supplied to a ground potential terminal is an internal voltage from a first voltage generator VSGG via a first voltage wiring or line CSN, the internal voltage being at a level substantially equal to the predetermined low level above. A power supply potential terminal is supplied with an internal voltage from a second voltage generator VDLG via a second voltage line CSP, the internal voltage being at a level substantially equal to the predetermined high level indicated above. As a result, the sense amplifier SA outputs to the input and output nodes an amplification signal at a low level substantially equal to the voltage from the first voltage generator VSGG and an amplification signal at a high level substantially equal to the voltage from the second voltage generator VDLG.

In consideration of the number of circuit elements, operating conditions, simplicity of layout on the semiconductor substrate, and size thereof, the sense amplifier usage technology above is superior to the technology using the amplifier to which other considerations are to be given as follows.

Namely, the amplifier to which other considerations are to be given may be an amplifier configured, for example, such that the input/output nodes have level limitation elements or circuits, such that when the bit lines BL and /BL are about to be set to the specified high level, the level limiting circuits stop the driving of the bit lines BL and /BL and when the bit lines BL and /BL are about to be set to the specified low level, the level limitation circuits stop the driving of the bit lines BL and /BL. However, since the sense amplifier of the I/O node level limiting type requires the level limiting elements or circuits, the number of circuit elements and the layout area associated therewith are required to be taken into consideration. For the sense amplifier of this kind, it is required to give consideration to possibility of increased complexity of the circuit operation due to the complicated structure thereof.

Like the sense amplifier in the ordinary dynamic RAM, the sense amplifier SA of the embodiment performs an operation which is controlled in a switching manner. To control the operation of the sense amplifier SA, there is provided, although the invention is not limited thereto, a switch MOSFET, not shown, to control an output from eac of the first and second voltage generators VSGG and VDLG. In the configuration in which the switch MOSFET is disposed in each of the first and second voltage generators VSGG and VDLG to control the output therefrom, it is not necessary to provide an operation control switch in each sense amplifier. This consequently leads to an advantage that the number of circuit elements is decreased and there are required on the semiconductor substrate only the first voltage wiring CSN and the second voltage wiring CSP as the control signal lines to control the operation of the sense amplifiers SAs.

The first voltage generator VSGG is operated, although the invention is not particularly limited thereto, by the power supply voltage VCC externally supplied to the dynamic RAM. When set to a voltage output state by a switching MOSFET therein, the generator VSGG outputs a voltage having a potential level shifted in the positive potential direction relative to the specified low level, i.e., the circuit ground potential, and the difference therebetween is equal to the threshold voltage of the selection MOSFET Qm of the memory cell. In a non-output state, the generator VSGG produces an output in a high impedance or floating state.

The second voltage generator VDLG is similarly driven, although the invention is not particularly limited thereto, by the power supply voltage VCC. When set to a voltage output state by a switching MOSFET therein, the generator VDLG outputs a voltage having a potential level decreased relative to the specified high level, i.e., the power supply voltage VCC, and the difference therebetween is equal to the threshold voltage of the selection MOSFET Qm. In a non-output state, like the first voltage generator VSGG, the generator VDLG produces an output in a high impedance or floating state.

In these first and second voltage generators VSGG and VDLG, there are used potential shifts respectively relative to the circuit ground potential VSS and power supply voltage VCC to produce the output voltages in association with the threshold value of the MOSFET Qm. Consequently, the circuit to regulate the output voltage can be configured in a simple structure and the level of output voltage can be obtained in a relatively stable state.

Each of the first and second voltage generators VSGG and VDLG may be basically constructed in a simplified circuit constitution employing only the threshold value of the MOSFET Qm.

In other words, for example, the first voltage generator VSGG may be manufactured in quite a simple structure including only one p-channel MOSFET (to be referred to as VSGG MOSFET herebelow) including a source connected to the first voltage wiring CSN, a drain linked with the circuit ground potential VSS, and a gate coupled with the control line for the sense amplifier operation. On this occasion, the VSSG MOSFET accomplishes two functions, i.e., a function to create the shift potential and a function to achieve the switching operation. Namely, in a state in which the sense amplifier operation control line is at a low level, for example, at the ground potential VSS, when the source potential of the VSSG MOSFET, i.e., the potential of the first voltage wiring CSN, is increased and is about to be equal to or more than the threshold potential, the VSGG MOSFET is conductive to resultantly limit the potential of the first voltage wiring CSN according to the threshold voltage. That is, the VSSG MOSFET conducts an operation similar to the operation of a so-called diode-connection MOSFET having a connection between a gate and a drain thereof, thereby supplying the first voltage wiring CSN with a shift potential associated with the threshold voltage. When the sense amplifier operation control line is at the high level such as the level of power source voltage VCC, the VSGG MOSFET is kept in a non-conductive state regardless of the source potential thereof.

Similarly, the second voltage generator VDLG may be manufactured in quite a simplified structure including only one n-channel MOSFET having a drain linked with the power source potential VCC, a source connected to the second voltage wiring CSP, a gate linked with a control line supplied with a control signal having a phase opposite to that of the signal on the sense amplifier operation control line. The MOSFET, namely, VDLG MOSFET achieves a potential shift operation as well as a switching operation.

Using the potential shifts created by the first and second voltage generators VSGG and VDLG configured in a simple structure as above, it is possible to sufficiently depress the leakage current of the selection MOSFET Qm in the dynamic memory cell.

However, in the simplified constitution, the potential of each of the first and second voltage wirings CSN and CSP is possibly varied in a relatively wide range. In other words, the gate-source voltage of the VSGG MOSFET is regarded as a function of the source-drain current. Therefore, when the source-drain current changes in accordance with a change in the current supplied from the sense amplifier SA, the gate-source voltage is accordingly varied. Similarly, the potential of the second voltage wiring CSP is also changed. As a result, the output level of the sense amplifier SA develops a relatively large variation.

In the embodiment, the first and second voltage generators VSGG and VDLG are fabricated not in the simple structure indicated above, but in a structure in which the current delivery and absorption are simultaneously possible, i.e., in a configuration capable of carrying out a pushpull operation. On this occasion, although the circuit construction is slightly complicated, the potential shift values for the first and second voltage wirings CSN and CSP can be relatively stabilized, which leads to a stable operation and a high-speed operation of the dynamic RAM.

Figure 4A:
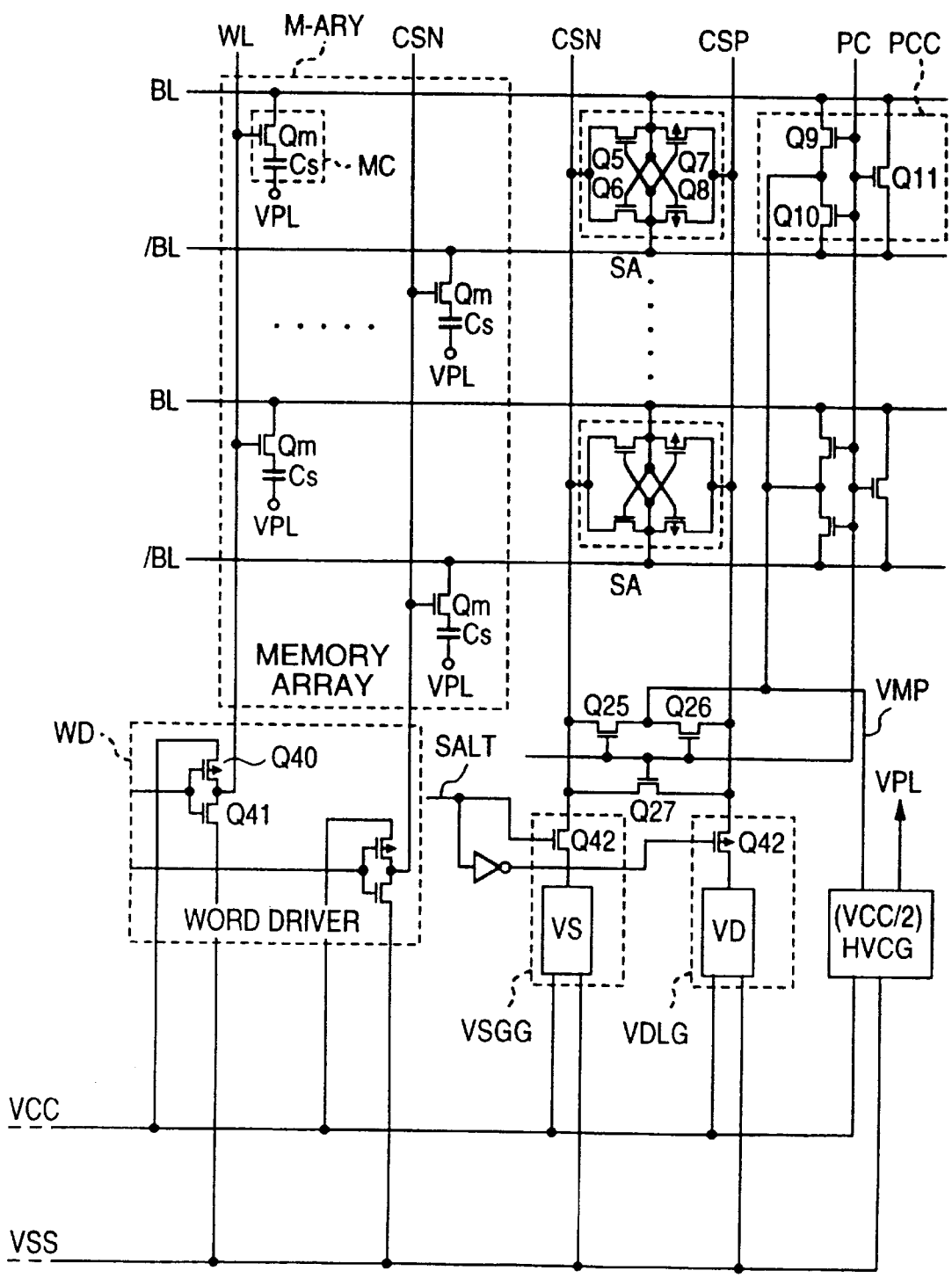
FIG. 4A is a circuit diagram specifically showing the embodiment of the dynamic RAM according to the present invention.

FIG. 4A shows the circuit of the embodiment more in detail. This diagram includes a plurality of pairs of complementary bit lines BL and /BL and a plurality of word lines. A word line driver WD to create selection signals for the plural word lines WLs includes a p-channel MOSFET Q40 and an n-channel MOSFET Q41 and receives a power supply voltage VCC and a ground potential VSS to accordingly achieve its operation.

Provided at a crosspoint between the complementary bit line BL and the word line WL is a dynamic memory cell MC.

For each pair of complementary bit lines (complementary data line pair) BL and /BL, there is arranged a sense amplifier including p-channel MOSFETs Q5 and Q6 and n-channel MOSFETs Q7 and Q8.

Disposed for each pair of complementary bit lines (complementary data line pair) BL and /BL is a precharge circuit PCC for pre-charging the bit lines including the n-channel MOSFETs Q9 to Q11.

The system further includes n-channel MOSFETs Q25 to Q27 constituting a precharge circuit for pre-charging common source lines. The circuit supplies a precharge voltage to common source lines CSN and CSP of the sense amplifier SA, namely, the first and second voltage wirings CSN and CSP shown in FIG. 1.

The first voltage generator VSGG includes a MOSFET Q43 and a ground potential generator VS and the second voltage generator VDLG includes a MOSFET Q42 and a power supply voltage generator VD. The first voltage generator VSGG receives a ground potential (first voltage) VSS from a device externally disposed with respect to the semiconductor chip as described above and an externally supplied power supply voltage (second voltage) VCC to resultantly create an internal voltage (third voltage) VSG and then outputs the internal voltage (third voltage) to the first common source line (first voltage wiring) CSN.

Similarly, The second voltage generator VDLG receives the ground potential (first voltage) VSS externally supplied and the external power supply voltage (second voltage) VCC to resultantly generate an internal voltage (fourth voltage) VDL so as to output the internal voltage (fourth voltage) to the second common source line (second voltage wiring) CSP.

Figure 14:
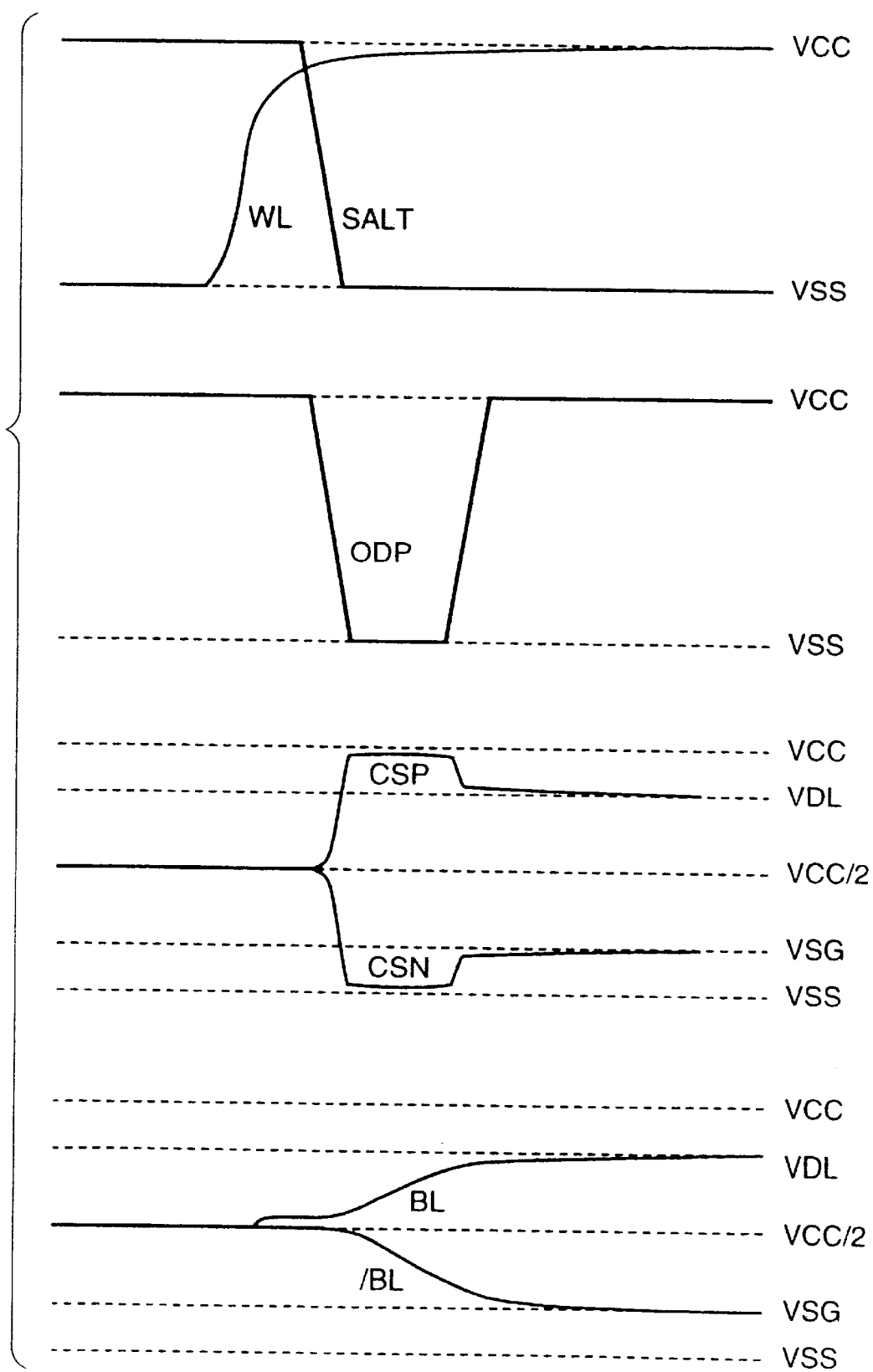
FIG. 14 is a diagram of signal waveforms for explaining in detail the circuit operation related to FIG. 13.

Further included in the configuration is a half-VCC generator HVCG which receives the power source voltage VCC and ground potential VSS to produce an intermediate voltage VCC/2 (fifth voltage) substantially at a middle point between the power supply voltage VCC and the ground potential VSS. The half-VCC generator HVCG creates and supplies, although the invention is not particularly limited thereto, a plate voltage VPL of the dynamic memory cell MC and a voltage VMP to precharge the wirings CSN and CSP supplying voltages to the precharge circuit PCC and sense amplifier SA. FIG. 14A representatively shows an example of the circuit constitution indicated above.

Figure 4B:
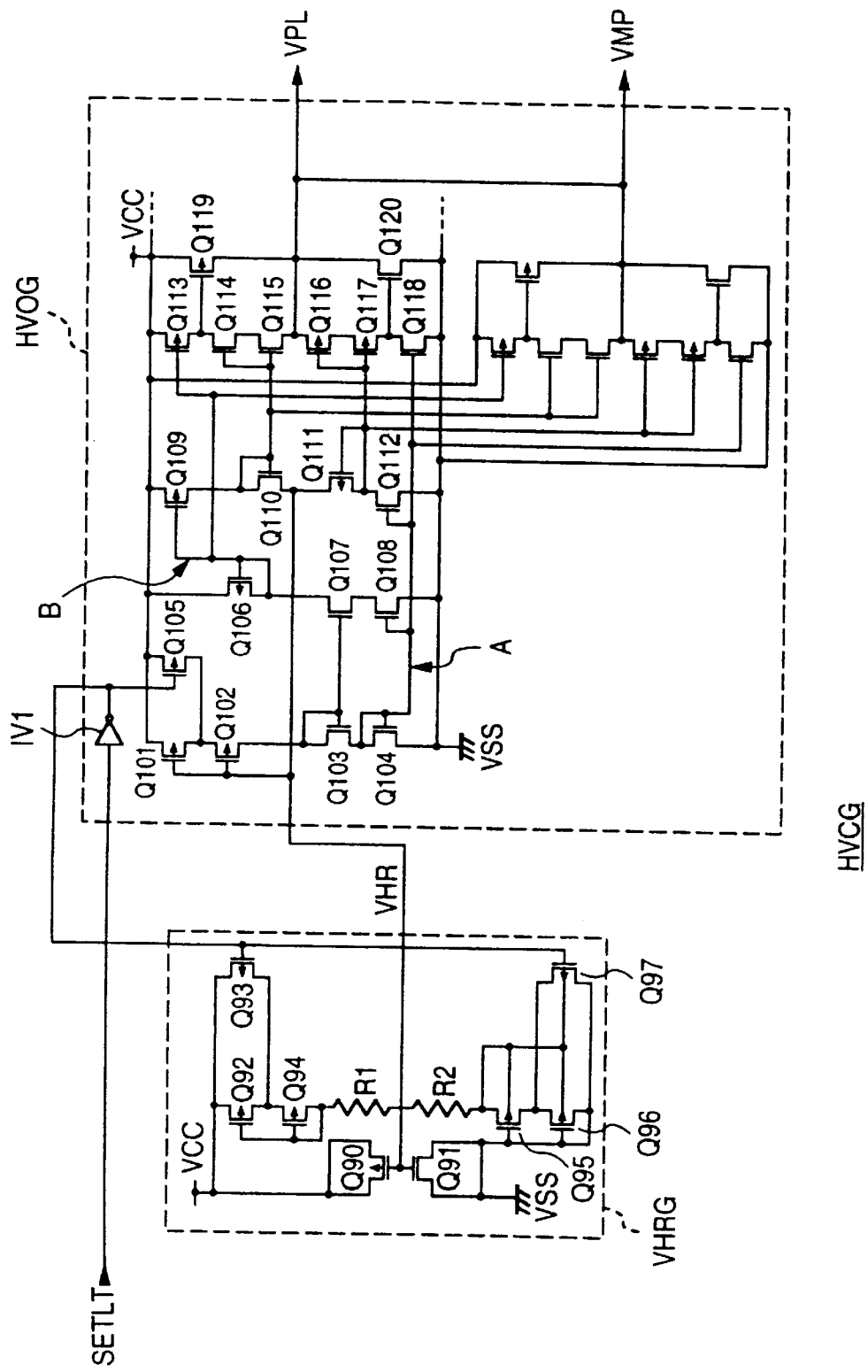
FIG. 4B is a circuit diagram for explaining a circuit to produce VCC/2 of the dynamic RAM according to the present invention.

FIG. 4B is a circuit diagram showing in detail the VCC/2 voltage generator HVCG of FIG. 4A.

The generator HVCG operates, although the invention is not particularly limited thereto, under control of a control signal SETLT.

The signal SETLT is created from a power on sensor circuit, not shown, provided on the dynamic RAM chip. Details of the power on sensor are not directly related to the present invention and this element is not shown in the drawings. However, when the power supply voltage VCC of the dynamic RAM is turned on, the sensor produces the control signal SETLT which is set substantially to the level of power supply voltage VCC, namely, the high level or start level for a predetermined period of time and which is thereafter set substantially to the level of circuit ground potential VSS, i.e., the low level or stationary or fixed level.

When the signal SETLT is at the high level, the half-voltage generator HVCG is accordingly set to a low-output impedance state to intensively drive the plate electrode and precharge circuit indicated above. In this situation, the circuit HVCG itself operates with a relatively large operating current.

When the signal SETLT is at the low level, the generator HVCG is set to a high-output impedance state to operate with a relatively large operating current.

The control operation of the generator HVCG is relatively important in that the dynamic RAM can be utilized at an early point of timing when the system is powered and the power consumption is minimized in the steady operation state.

In other words, the plate electrode of the dynamic RAM serves as a common or shared electrode of the information storage capacitors of the respective memory cells and hence has a remarkably large value of capacitance. Therefore, in response to the power on operation, quite a large charging current is required to increase the potential level from the initial level of about 0 V to the steady bias level of VCC/2. Since each of the bit lines possesses a large value of parasitic capacitance, a considerably large charging current is also required for the bit line precharge circuit at the power on state.

The VCC/2 voltage generator HVCG includes, although the invention is not particularly limited thereto, a reference voltage generator VHRG and an output circuit HVOG as shown in FIG. 4B.

As can be seen from this diagram, the reference voltage generator VHRG includes p-channel MOSFETs Q90 and Q92 to Q97, an n-channel MOSFET Q91, and voltage dividing resistors R1 and R2.

When the control signal SETLT is at the high level, the output from an inverter IV1 is set to a low level and hence the p-channel MOSFETS Q93 and Q97 are turned on. In this situation, of the two MOSFETs Q92 and Q93 in the diode and series connection, the MOSFET Q92 is placed in a short-circuited or conductive state due to the MOSFET Q93 and hence supplies a relatively large bias current to the divider resistor R1. In this state, moreover, since the MOSFET Q97 as well as the MOSFETS Q95 and Q96 in the diode and series connection are in the on state, a relatively large bias current path is constructed by the MOSFETS Q95 to Q97 between the resister R2 and the point of circuit ground potential VSS.

In consequence, the reference voltage generator VHRG produces an output signal VHR at the VCC/2 level with a relatively low output impedance. In this regard, the MOSFETs Q90 and Q91 operate as a ripple absorbing capacitor in the connection shown in the circuit diagram and hence absorbs the ripple component of the output VHR.

When the control signal SETLT is at the low level, the output from an inverter IV1 is set to a high level and hence the p-channel MOSFETs Q93 and Q97 are turned off. On this occasion, the two MOSFETs Q92 and Q94 in the diode and series connection only supplies a relatively small bias current to the divider resistor R1. In a similar manner, the MOSFETs Q95 and Q96 in the diode connection supplies only a small bias current to the resister R2. Therefore, the reference voltage generator VHRG creates an output signal VHR at the VCC/2 level with a relatively high output impedance and operates with a low power consumption.

The output circuit HVOG of the voltage generator HVCG can be regarded as a type of impedance transformer circuit which receives the output VHR to generate an output signal at the level of VHR.

MOSFETs Q113 to Q120 constitute a pushpull output stage, whereas MOSFETs Q109 to Q112 form a bias stage for the output stage. Additionally, MOSFETs Q101 to Q108 constitute a bias regulating stage.

In the output stage, the n-channel MOSFETs Q114 and Q115 form a source-follower or common-drain output transistor. The p-channel MOSFET Q119 is linked with the n-channel MOSFETs Q114 and Q115 in the inverted Darlington connection to amplify the current flowing through the n-channel MOSFETs Q114 and Q115. The p-channel MOSFET Q113 is a bias source for the circuit configured in the inverted Darlington connection.

Similarly, the p-channel MOSFETs Q116 and Q117 form a source-follower output transistor. The n-channel MOSFET Q120 is coupled with the MOSFETs Q116 and Q117 in the inverted Darlington connection to amplify the current passing through the MOSFETs Q116 and Q117. The n-channel MOSFET Q118 serves as a bias source for the circuit including the inverted Darlington connection.

In the bias stage, the p-channel MOSFET Q109 and n-channel MOSFET Q112 function to create bias currents and supply the bias currents respectively to the n-channel MOSFET Q110 and the p-channel MOSFET Q111 in the diode connection to achieve a level shift operation. Thanks to the configuration, the MOSFET Q110 produces a bias output between the gate and drain thereof, the bias output having an increased level. Namely, the output is obtained by adding the threshold voltage to the output VHR from the reference voltage generator VHRG. Similarly, the MOSFET Q111 generates a bias output between the gate and drain thereof, the bias output being decreased relative to the output VHR as described above.

The output stage produces an output substantially identical to the output VHR in accordance with the output delivered via the bias stage.

In the bias adjuster stage, the p-channel MOSFETs Q101, Q102, and Q105 form a control current source which conducts an operation under control of the control signal SETLT according to the configuration shown in the drawing, whereas the n-channel MOSFETs Q103 and Q104 in the diode connection form a first voltage transformer element to receive an output from the control current source. The n-channel MOSFETs Q107 and Q108 form, as shown in the drawing, a current mirror circuit together with the MOSFETs Q103 and Q104. The p-channel MOSFET Q106 in the diode connection serves as a second voltage transformer element.

Due to the connection shown in the drawing, the bias regulating stage supplies nodes A and B with an output from the control current source, i.e., a bias voltage at a level proportional to the drain current of the p-channel MOSFET Q102.

While the MOSFET Q118 of the output stage and the MOSFET Q112 of the bias stage are coupled via node A with the MOSFET Q104 of the bias regulator stage in a current mirror connection, the MOSFET Q113 of the output stage and the MOSFET Q109 of the bias stage are coupled via node B with the MOSFET Q106 of the bias regulator stage in a current mirror connection. Resultantly, the MOSFETs Q118, Q112, Q113, and Q109 generate an operating current proportional to the current from the control current source of the bias regulator stage.

In short, the overall operation of the output stage HVOG is as follows.

In a period immediately after the power is turned on, the control signal SETLT is at a high level as described above and the output from the inverter IV1 is accordingly at a low level almost equal to the circuit ground potential VSS. Since the MOSFET Q105 of the control current source of the bias regulator stage is turned on in response to a low-level output from the inverter IV1, the current source produces a relatively large current from its output (i.e., the drain of MOSFET Q102).

In response thereto, the bias regulating stage sets the operating currents of the MOSFETs Q118, Q112, Q113, and Q109 of the output and bias stages to relatively large values to thereby fully reduce the output impedance of the output stage.

In the steady state after the system is thus powered, the control signal SETLT is set to a low level and the output from the inverter IV1 is set to a high level substantially equal to the power supply voltage VCC. The MOSFET Q105 of the bias regulating stage is turned off in response to the high-level output from the inverter IV1. In this situation, the control current source outputs a current determined by the p-channel MOSFETs Q101 and Q102 in the series connection. According to the values appropriately set to the conductance of the p-channel MOSFETs Q101 and Q102, the combined resistance of these MOSFETs Q101 and Q102 takes a relatively large value. Accordingly, the potential of node A of the current mirror circuit including the n-channel MOSFETs Q103, Q104, Q107, and Q108 is set to a low value. Therefore, the n-channel MOSFETs Q118 and Q112 operate with a small current in a state similar to the off state.

Conversely, the potential of node B is increased such that the p-channel MOSFETs Q113 and Q109 operate with a small current in a state analogous to the off state. Moreover, when the p-channel MOSFET Q109 is almost in the off state as indicated above, the n-channel MOSFET Q110 also enters a state similar to the off state. The n-channel MOSFET Q110 produces only a small bias voltage and hence the n-channel MOSFETs Q114 and Q115 of the output stage are set to an operation state analogous to the off state. Since the gate potential of the p-channel MOSFET Q111 is increased according to the reduced potential of node B, the p-channel MOSFETs Q116 and Q117 operate almost in the off state. As indicated above, the p-channel MOSFET Q113, n-channel MOSFETs Q114 and Q115, p-channel MOSFETs Q116 and Q117, and n-channel MOSFET Q118 respectively operate in a state like the off state, which leads to reduction of the current flowing through the circuit.

As can be seen from the drawing, the VCC/2 voltage VMP is, although not specifically described, analogous to the VCC/2 voltage VPL.

Figure 5:
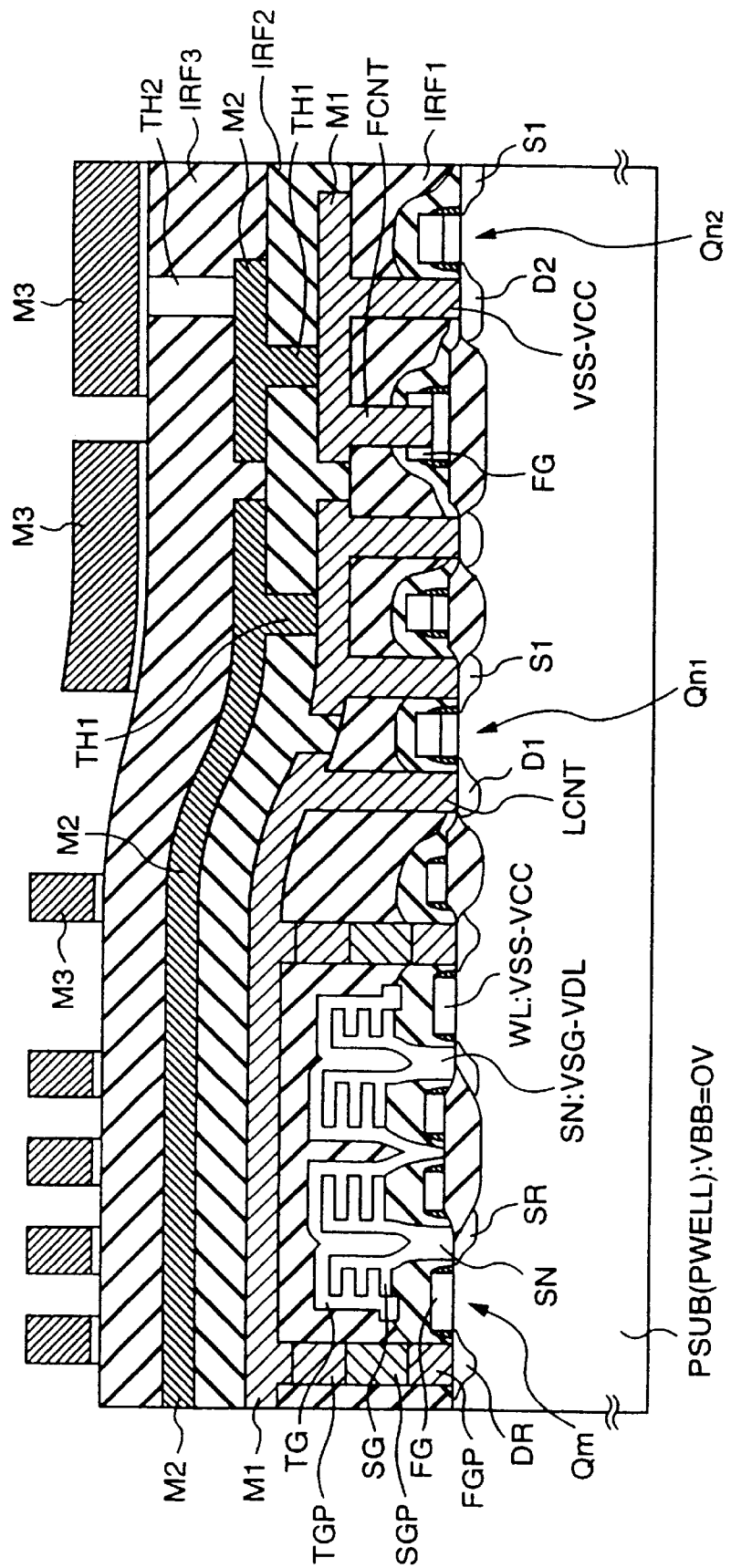
FIG. 5 is a cross-sectional view of constituent elements for explaining the dynamic RAM according to the present invention.

FIG. 5 shows in a cross-sectional view the device configuration of the embodiment of the dynamic RAM according to the present invention. This diagram representatively shows the device structure of the memory array and peripheral sections described above.

The dynamic RAM of the embodiment is manufactured according to known technologies including a well region fabricating technology using impurity ion implantation, selective oxidation, polycrystalline silicon layer fabrication, and multi-layer wiring technology.

The memory array M-ARY includes an information storage capacitor and a selection MOSFET, which will be described in detail later with reference to FIG. 34, and which are formed in a p-type well region fabricated on a surface of a p-type semiconductor substrate made of a monocrystalline silicon. The peripheral section includes an n-channel MOSFET, which is also manufactured on a p-type well region fabricated on a surface of a p-type semiconductor substrate.

The p-channel MOSFET is formed on an n-type well region manufactured on a surface of a p-type semiconductor substrate.

In the storage capacitor of the memory cell, a second layer, i.e., a polycrystalline silicon layer SG is used as a storage node SN. The layer SG is connected to either one of the source and drain of the address selection MOSFET Qm. Although the invention is not especially limited thereto. the layer functioning as the storage node of the capacitor is fabricated in a fin structure such that a surface of the polycrystalline silicon layer is enclosed with a third layer, i.e., a polycrystalline silicon layer TG. Disposed therebetween is a thin dielectric layer including an oxidation layer similar to a thin gate insulation layer. The layer TG serves as a plate electrode of the storage capacitor. The gate of the MOSFET Qm is formed with a first layer, i.e., a polycrystalline layer FG. The source and drain of the address selection MOSFET respectively include n-type semiconductor regions fabricated on a surface of the p-type well region by known technologies including the impurity ion implantation and annealing technology. The remaining one of the source and drain of the MOSFET Qm, which is formed with the n-type semiconductor region DR is linked with a first layer, i.e., a metal wiring layer M1 made of aluminum or the like. Disposed therebetween are the first, second, and third polycrystalline silicon layers FGP, SGP, and TGP which are possibly fabricated with the first, second, and third polycrystalline silicon layers FG, SG, and TG at the same time. The aluminum wiring layer M1 forms the bit line BL (or the data or digit line). The first polycrystalline silicon layer FG serves as the word line WL of FIG. 4. Supplied to the third polycrystalline silicon layer TG functioning as the plate electrode is the plate voltage VPL of FIG. 4.

The MOSFETs constituting the peripheral section includes two n-channel MOSFETs Qn1 and Qn2 in FIG. 5. The first wiring layer M1 is connected via a contact LNCT region to the drain D1 of the MOSFET Qn1. The first wiring layer M1 is connected, when necessary, to the first polycrystalline silicon layer FG via a contact region FCNT of a contact hole region formed in a first inter-layer insulation film IRF1. The first and second wiring layers M1 and M2 are electrically connected to each other via a first through hole TH1 created in a second inter-layer insulation film IRF2, whereas the second and third wiring layers M2 and M3 are electrically connected to each other via a second through hole TH2 created in a third inter-layer insulation film IRF3. Although the invention is not particularly limited thereto, to supply an input signal via the second wiring layer M2 to the gate electrode of a MOSFET such as the MOSFET Qn2, the second wiring layer M2 is linked via the first through hole TH1 with the first wiring layer M1, which is coupled via the contact region LCNT to the first polycrystalline silicone layer FG serving as the gate electrode.

The third wiring layer M3 to supply the input signal is electrically connected to the first wiring layer M1 via the second wiring layer M2 and the second through hole TH2. For example, when an output signal is supplied to a circuit in the subsequent stage, the first wiring layer M1 is linked with the second wiring layer M2 as a dummy layer or an intervening layer via the first through hole TH1 and is further connected via the second through hole TH2 to the third wiring layer M3. According to the wiring connection method employing the intermediate wiring layers as indicated above, the surface of the wiring region becomes smooth and hence it is possible to advantageously prevent undesired disconnection of the wirings.

In the embodiment, the bias voltage VBB applied to the p-type substrate PSUB (or the p-type well region (PWELL) formed on an n-type semiconductor substrate) is not a negative back bias voltage, but is the circuit ground potential VSS (0 V). In contrast with the configuration of FIG. 5, the high and low levels of the voltage applied to the storage node SN of the information storage capacitor are set to an intermediate potential value, i.e., VDL-VSG. The high and low levels of the word line WL connected to the gate (FG) of the address selection MOSFET Qm are set to a level of VSS (0 V)—VCC like the case of the signal of the peripheral circuit.

The high and low levels supplied to the bit line are also set to an intermediate potential such as VDL-VSG. When the MOSFET Qm to transmit a high level signal of such an intermediate voltage is to be turned on, the voltage supplied to the gate thereof is at the selection level of the word line WL, namely, the VCC level which is obtained by adding the threshold voltage to the high level of the bit line. Consequently, the high level can be written in the storage node SN without any level loss. When the word line WL is at the non-selection, level such as the level of ground potential VSS, the potential of the bit line BL or storage node SN is shifted in potential, i.e., at a low level VSG. Consequently, according to the low level VSG and the non-selection level VSS of the word line WL, there is set an offset to apply a reverse bias between the gate and source of the address selection MOSFET Qm, which improves the off characteristics of the MOSFET Qm.

In the embodiment, the MOSFETs configuring the dynamic memory cells and the peripheral circuit can be fabricated in the semiconductor substrate PSUB or p-type well region. In this situation, the gates of the n-channel MOSFETs of the peripheral circuit are supplied with the ground potential VSS, not with the negative back bias of the circuit. Therefore, a high level of, for example, the power supply voltage VCC is applied to the gate thereof. When turned on, the MOSFET can effect an operation with a large conductance. Accordingly, when turned on, the MOSFET can supply a large operating current. This enables the capacitive load to be discharged or charged up at a high speed and hence the circuit operation speed is increased.

Figure 6B:
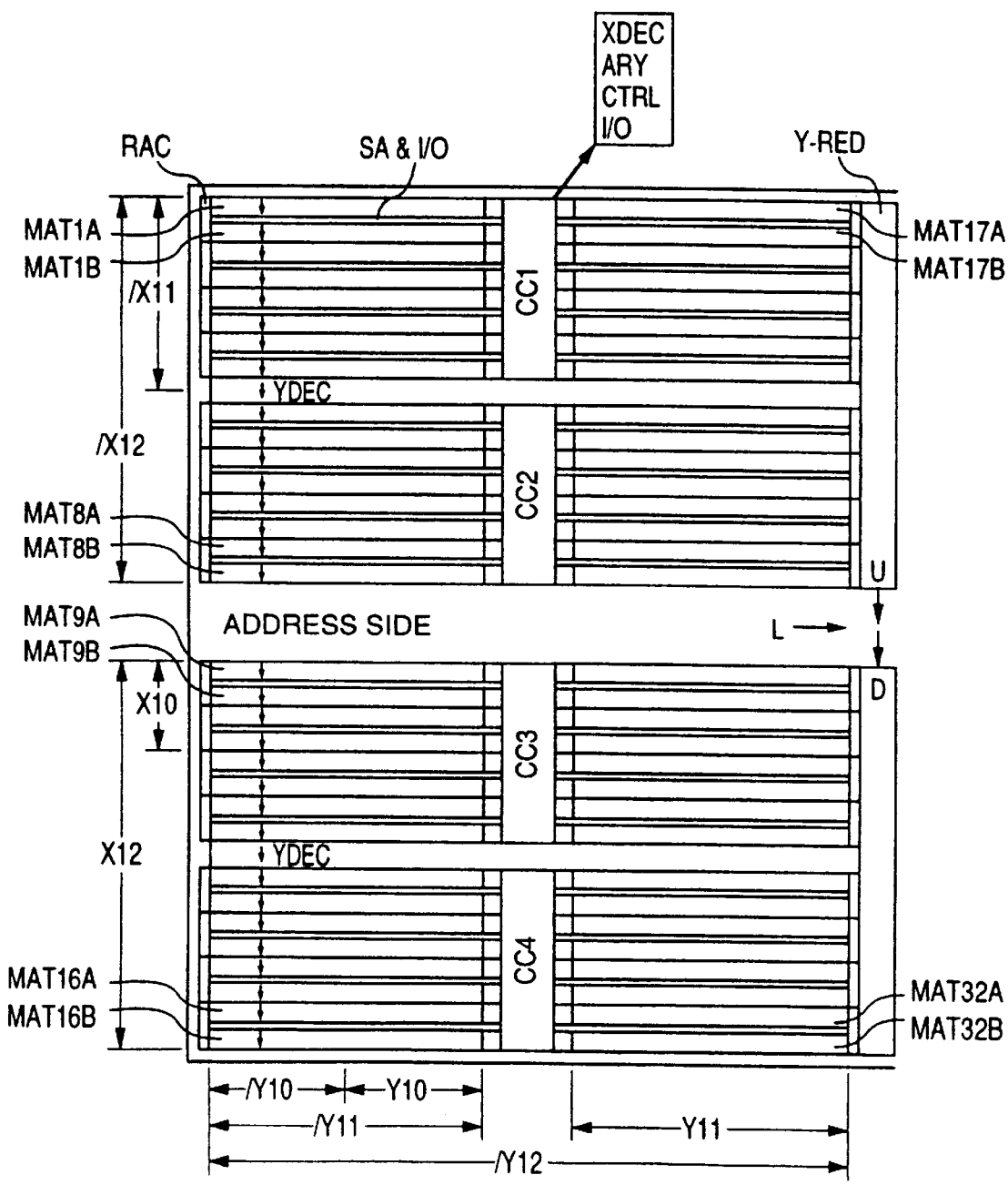
FIG. 6B is a layout diagram showing a section of a memory array of the dynamic RAM according to the present invention.
Figure 6C:
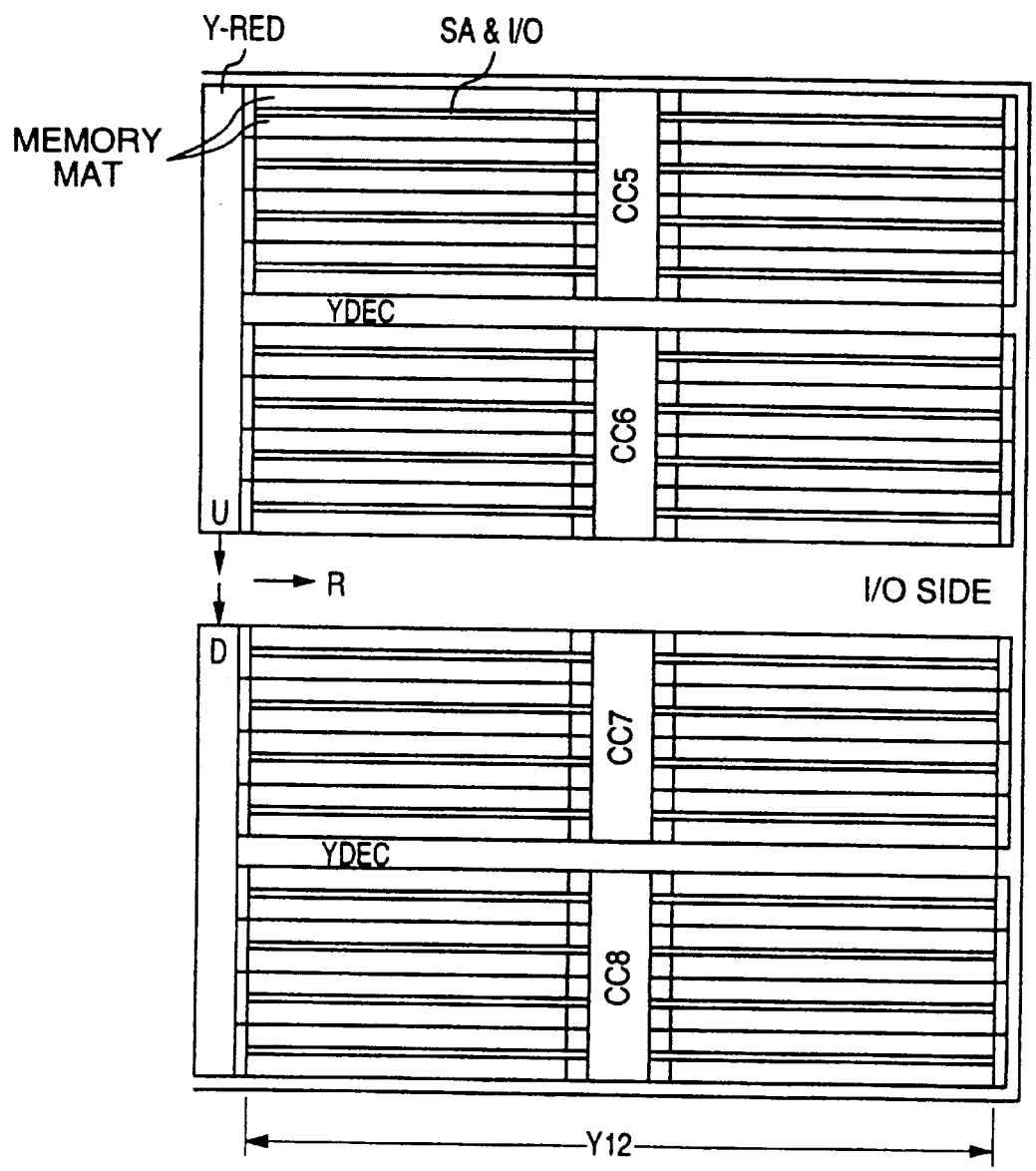
FIG. 6C is a diagram showing a remaining section of the memory array of the dynamic RAM according to the present invention.

FIG. 6A shows a relative positional relationship between FIGS. 6B and 6C, which illustrate memory array layouts of an embodiment of the dynamic RAM according to the present invention.. The RAM of this embodiment has, although the invention is not particularly limited thereto, a storage capacity of about 64 megabits. For easy understanding, FIG. 6A specifically shows the relationship between FIGS. 6B and 6C. FIGS. 6B and 6C shows layouts of the left (L) and right (R) portions of the rectangular semiconductor chip. To clearly show the inter-relationship between FIGS. 6B and 6C, a Y relief circuit provided in a central portion of the rectangular chip is duplicatedly shown in both diagrams.

The dynamic RAM can be configured in various structures on a semiconductor chip in addition to the arrangements described with reference to FIGS. 1 and 4A to 4C.

A memory array having a relatively large storage capacity of about 64 megabits includes a plurality of memory mats. Disposed for each memory mat are an X decoder and a Y decoder. The X decoder includes an X selector circuit to select, in cooperation with the word driver, a word line in the memory mat according to an X address signal. The X decoder can be more widely regarded as an array control circuit RAC on a faraway end including a word line reset circuit to reset the word line selection signal. The Y decoder includes a Y selection circuit to select complementary bit lines of the memory mat in response to an Y address signal.

To guarantee the normal memory operation even at occurrence of failures in a small number of memory cells, there is provided a Y relief circuit Y-RED.

The RAM further includes various circuits such as a control circuit which will be more clearly described later with reference to FIGS. 9 and 10.

In FIGS. 6B and 6C, the voltage generator circuit described in conjunction with FIGS. 1 and 4A to 4C is not explicitly shown due to limitation of the drawings. An appropriate example including the voltage generator will be described later with reference to FIGS. 7B and 7C.

In the dynamic RAM shown in the diagrams, there are disposed two memory mats MAT1A and MAT1B and a plurality of memory units including a sense amplifier (SA) and input/output lines. The memory units are classified into a plurality of memory groups according to the address allocation thereof. The address allocation is conducted, for example, to allocate the most significant bit of the X address (/X12 and X12) to the respective memory arrays on an upper (U) side and a lower (D) side. The configuration is subdivided into two groups each including eight memory mats centered on the Y decoder YDEC. Assigned to each group are address signals /X11 and X11. In FIGS. 6B and 6C, to facilitate understanding of the address allocation, the address range is indicated by an arrow. However, to avoid complexity of the diagrams, the lower-half portion specified by the address signal X11 is omitted. The 8-mat group is subdivided into two subgroups each including four memory mats to which addresses /X10 and X10 are respectively allocated. However, in the address range related to addresses X10 and /X10, there is representatively designated the address X10 allocated to four memory mats on the lower side D in these diagrams. Although not shown in FIGS. 6B and 6C, addresses /X9 and X9 are allocated respectively to the two-mat groups centered on the sense amplifier, whereas addresses /X8 and X8 are allocated respectively to the memory mats centered on the sense amplifier. In this explanation, it is to be understood that a slash or slant (/) corresponds to an over bar as a logical symbol indicating that the pertinent signal is active at a low level.

Along the longitudinal (vertical) direction of the chip, there are arranged a row decoder XDEC, an array control circuit RYCTRL, and an external I/O line. In FIGS. 6B and 6C, the row decoder XDEC, array control circuit RYCTRL, and external I/O line are represented as a unit, i.e., a control circuit CC1. Control circuits CC2 to CC4 of FIG. 6B and control circuits CC5 to CC8 of FIG. 6C have a configuration similar to the structure of the control circuit CC1. Provided in a central portion along the longitudinal direction of the chip are an input/output interface circuit including input and output buffers between the addressing and input/output sides.

In the memory mats shown in FIG. 6B, the arrows denote an update direction in the address refresh process. Namely, the address refreshing is carried out downwards in this diagram. However, in a memory having a large capacity of 64 megabits, when the memory is refreshed simply in a sequential manner, the number of refresh cycles takes a large value of, for example, 8192, which restricts the ordinary memory access for the read and write operations. To overcome this difficulty there is employed a process in which the memory mats specified, for example, by addresses X12, X11, and X10 are simultaneously selected to resultantly refresh eight memory mats at the same time, thereby refreshing all memory mats in 1024 cycles.

In the address allocation along the column direction, the left and right sides centered on the Y relief circuit are respectively assigned with the most-significant bit of the Y address (/Y12 and Y12). Allocated to the left and right memory mats centered on the X decoder XDEC are Y address signals /Y11 and Y11, respectively. Moreover, /X10 and X10 are allocated in one memory mat. In the memory mat, four pairs of bit lines are to be simultaneously selected. To finally select one of the four pairs of bit lines, there are utilized Y9 and Y8 or the two least-significant bits Y0 and Y1. With the provision indicated above, an address allocation is achieved for about 8 K (thousand) positions in the Y direction in association with the X direction.

Figure 7B:
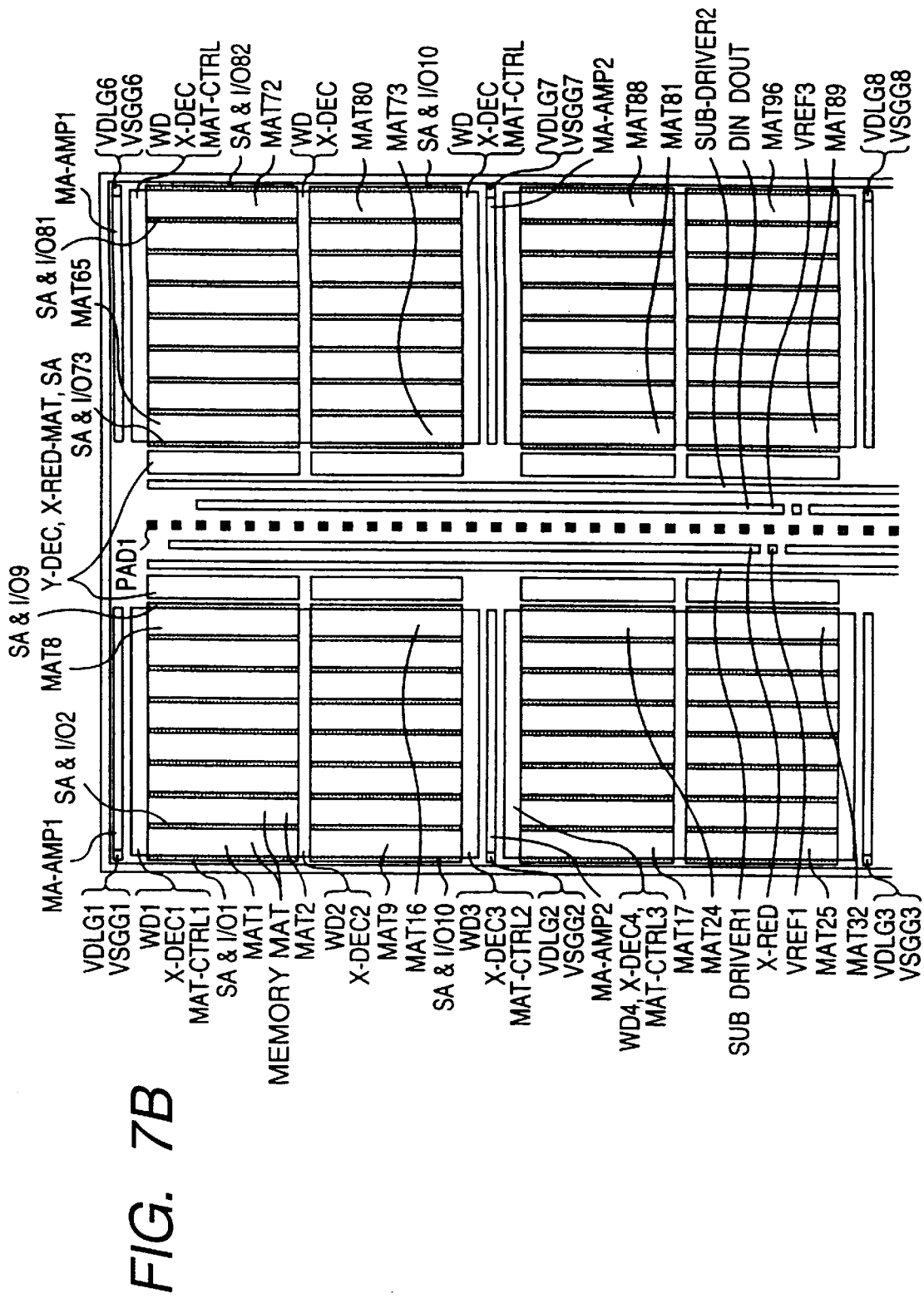
FIGS. 7B and 7C are layout diagrams showing in detail the arrangement of constituent components of FIG. 7A.
Figure 7C:
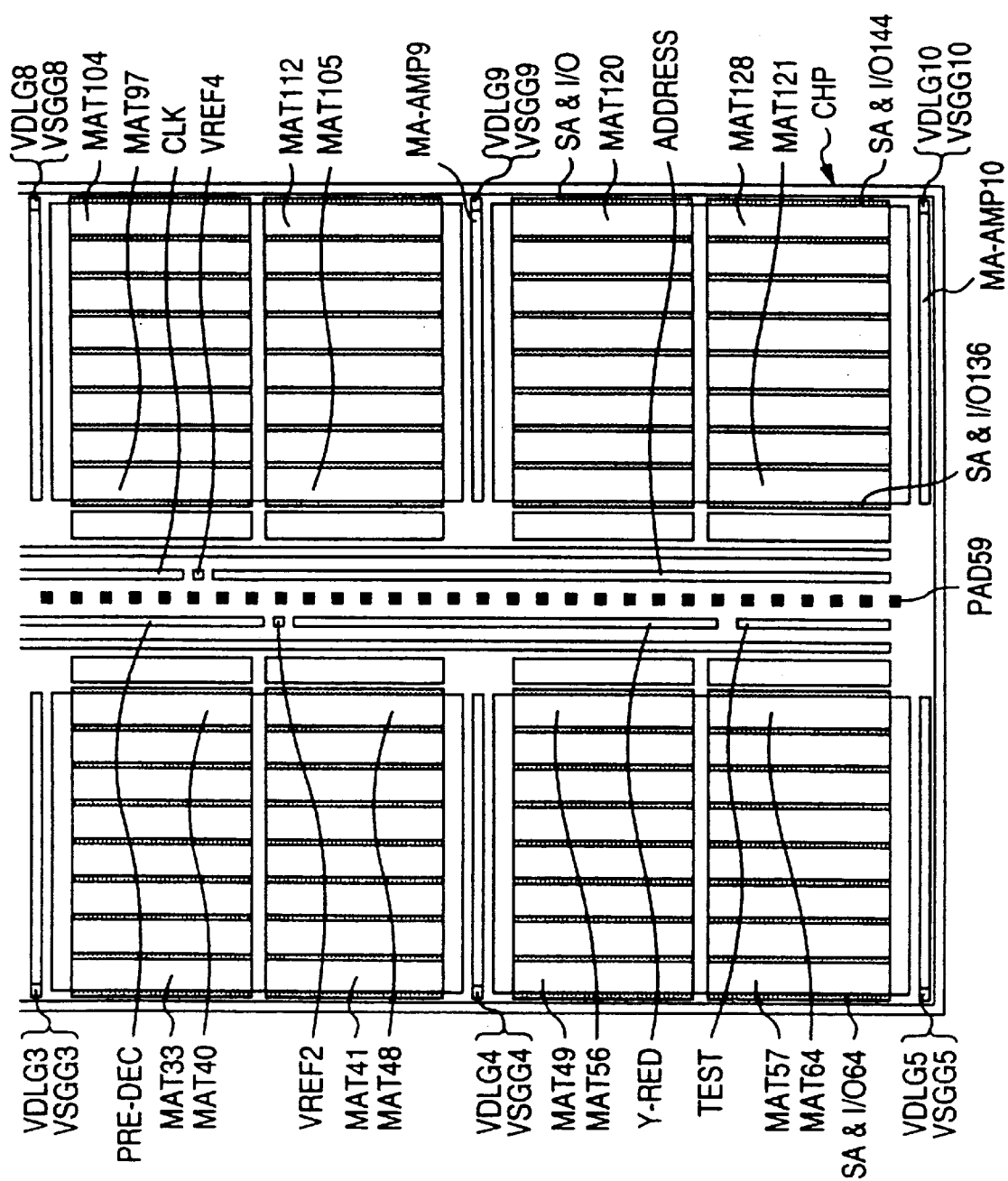

FIG. 7A shows a relative positional relationship between FIGS. 7B and 7C.

FIGS. 7B and 7C show a semiconductor chip layout of the constituent component circuits disposed in another embodiment of the dynamic RAM according to the present invention. This embodiment includes a plurality of VSG generator circuits VSGGs for producing an internal voltage (third voltage) and a plurality of VDL generator circuits VDLs for producing an internal voltage (fourth voltage), the generators VSGGs and VDLs being distributively arranged on the semiconductor chip.

Figure 7D:
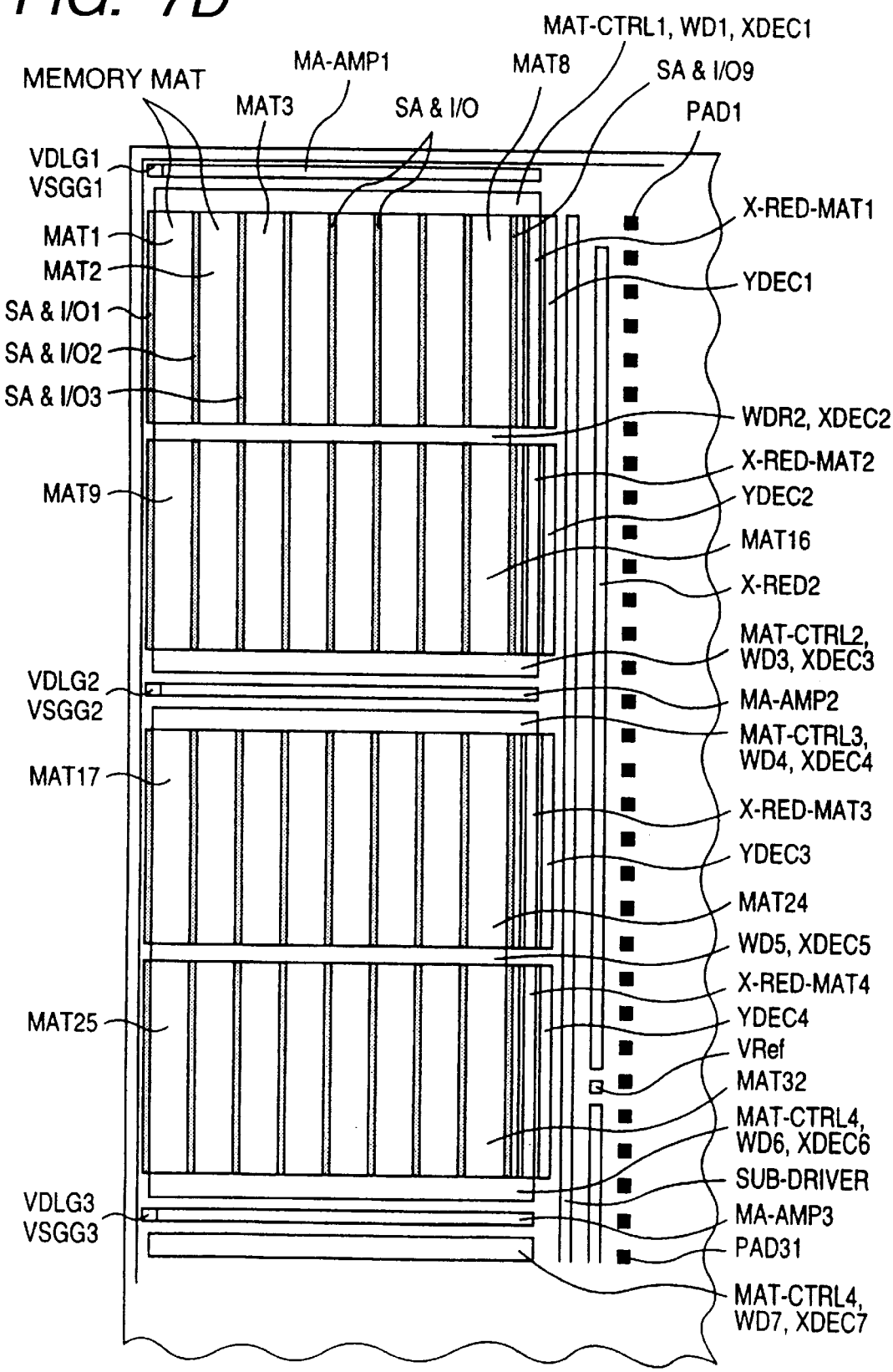
FIG. 7D is a layout diagram showing in detail the arrangement of constituent components of FIG. 7C.

Description will now be further given of the dynamic RAM by referring to FIGS. 7B and 7C as well as FIG. 7D showing a portion of FIGS. 7B and 7C more in detail.

The dynamic RAM of the embodiment has, although the invention is not particularly limited thereto, a storage capacity of 64 megabits and is capable of achieving read and write operations in the unit of a plurality of bits, e.g., 16 bits.

The semiconductor chip CHP of the RAM is configured the shape of a rectangular, in planar contour, and has a relatively large chip size for the 64-megabit storage capacity. Although the invention is not particularly limited thereto, to facilitate the packaging thereof, for example, according to a resin molding method of a so-called lead on chip (LOC) type, the chip CHP includes bonding pads PAD1 to PAD59 as external connection terminals in the central portion along the longitudinal direction thereof.

Each bonding pad has, although the invention is not particularly limited thereto, the following functions. In this connection, though PAD 2 to PAD 58 are not assigned with reference numerals in FIGS. 7B and 7C, it is to be appreciated that PAD 1 to PAD 59 are consecutively arranged in the central portion along the longitudinal direction of the semiconductor chip. Furthermore, it is to be understood that a large number of pads, such as bonding pads for power source terminals and ground potential terminals, are commonly and electrically connected, when necessary, respectively to an inner lead regarded as a power source bus bar and an inner lead serving as a ground potential bus bar, the bars being extended on the semiconductor chip confine in the package of the chip. Utilization of the inner leads regarded respectively as the power source and ground potential bus bars is superior to the usage of wirings formed on a surface of the semiconductor chip by metal film evaporation and selective etching technologies in that the power supply impedance and the ground potential system impedance are reduced in conjunction with the respective circuits of the semiconductor chip. Additionally, the address signal bonding pads are selectively used when necessary. In the description below, signals preceded by a slant or slash (/) like /WE and /RAS have levels to be considered according to negative logic; namely, a level which is significant at a low level.

PAD1, PAD2, PAD5, PAD6, PAD9, PAD10, PAD13 TO PAD16, PAD19, PAD20, PAD23, PAD24, PAD27, PAD28: Data input output.

PAD3, PAD8, PAD1, PAD17, PAD21, PAD25, PAD29, PAD37, PAD39, PAD50, PAD52, PAD58: Power supply VCC.

PAD4, PAD7, PAD12, PAD18, PAD22, PAD26, PAD30, PAD38, PAD40, PAD51, PAD53, PAD59: Ground potential VSS.

PAD32: Lower column address strobe (/LCAS).

PAD33: Upper column address strobe (/UCAS).

PAD35: Low adderess strobe (/RAS).

PAD36: Output enable (/OE).

PAD41 to PAD49, PAD54 to PAD57: Address.

On the semiconductor chip, there are fabricated a plurality of memory mats MAT1 to MAT128, a plurality of sense amplifier and input/output circuits SA&I/O1 to SA&I/O144, and a plurality of peripheral circuits associated therewith.

Each of the memory mats MAT1 to MAT128 has a storage capacity of, for example, 512 kilobits and the total storage capacity is 128×512 kilobits=64 megabits.

The memory mats are related, although the invention is not limited thereto, to the sense amplifier and input/output circuits as follows.

Namely, for example, the memory mats MAT1 to MAT8 constitutes a first memory mat group. The sense amplifier and I/O circuits SA&I/O1 to SA&I/O9 and these memory mats are alternately arranged as shown in FIG. 7D to form a first sense amplifier and I/O circuit group.

On the upper side of the first memory mat group in the drawing, there is disposed a first X selection circuit block including a word driver WD1 and a mat control circuit MAT-CTRL1. Arranged further on the upper side is a main amplifier MA-AMP1 for the first memory mat group.

On the lower side of the first memory mat group in the drawing, there are arranged a second X selection circuit block including an X decoder X-DEC2 and a word driver WD2.

For the first memory mat group, an X redundant memory mat X-RED-MAT1 (FIG. 7D) and a first Y decoder YDEC1 (FIG. 7D) are provided in a place near the central portion of the chip.

Each of the memory mat of the first memory mat group is configured, although not shown in detail, in the two cross-point structure as shown in FIG. 1 including a plurality of complementary bit lines extending in the horizontal direction of the drawing, and a plurality of word lines extending in the vertical direction thereof, and a plurality of dynamic memory cells arranged at crosspoints between the complementary bit lines and the word lines.

The sense amplifier and I/O circuit SA&I/O1 on the left side of the first memory mat MAT1 includes a plurality of sense amplifiers and input/output circuits fabricated for every second complementary bit line. The input/output circuit of SA&I/O1 includes a first pair of complementary input/output lines extending in the longitudinal direction to reach the first main amplifier MA-AMP1 in the drawing, a plurality of column switching MOSFETs disposed respectively between the first input/output lines and every second complementary lines, and a gate circuit for generating a signal to control the switching operation of the column switching MOSFET according to a mat control signal supplied from the first mat control circuit MAT-CTRL1 and Y decode signal or column selection signal from the Y decoder YDEC1. The sense amplifier and I/O circuit SA&I/O2 on the right side of the first memory mat MAT1 includes a plurality of sense amplifiers arranged for every second remaining complementary bit lines a plurality of column switching MOSFETs disposed respectively between every second remaining complementary line and the second input/output lines, and a gate circuit for controlling the column switching MOSFET.

The sense amplifier and I/O circuit SA&I/O2 includes a plurality of sense amplifiers arranged respectively for every second complementary bit line of the second memory mat MAT2 on the right-hand side of SA&I/O2, a plurality of column switching MOSFETs disposed respectively between the second input/output lines and every second complementary bit line of the second memory mat MAT2, and a gate circuit.

Similarly, the sense amplifier and I/O circuit SA&I/O3 includes a plurality of sense amplifiers arranged respectively for every second remaining complementary bit line of the second memory mat MAT2, a plurality of column switching MOSFETs disposed respectively between the third input/output lines and every second remaining complementary bit line of the second memory mat MAT2, a plurality of sense amplifiers for every second complementary bit line of the third memory mat MAT3, a plurality of column switching MOSFETs, and a gate circuit.

In a similar fashion, the sense amplifier and I/O circuits SA&I/O4 to SA&I/O9 respectively include the sense amplifiers, I/O lines, column switching MOSFETs, and gate circuits.

To control the operation of the column switching MOSFETs of the sense amplifier and I/O circuits SA&I/O1 to SA&I/O9, a plurality of Y selection lines or column selection lines, not shown, of the first Y decoder YDEC1 are manufactured to be extended on the first memory mat group.

The first and second X selection circuit blocks, distributively arranged respectively in the upper and lower sides of the first memory mat group MAT1, set at the word line selection timing one of the plural word lines of the memory mats MAT1 to MAT8 in response to indication of the X address signal being at the selection level.

The first mat control circuit MAT-CTRL1 includes a power switching MOSFET to control operation of the sense amplifier in the first sense amplifier and I/O circuit group and a control circuit to appropriately control the gate circuit. Namely, when the X address signal indicates a word line belonging to the first memory mat MAT1, the first mat control circuit MAT-CTRL1 operates ,according to the X address signal at the sense amplifier activation timing, to set the sense amplifier power switching MOSFETs, corresponding to a plurality of sense amplifiers of the sense amplifier and I/O circuits SA&I/O1 and SA&I/O2 for the first memory mat MAT1,to the on state. Furthermore, when the X address signal denotes a word line belonging to the first memory mat MAT1, the first mat control circuit MAT-CTRL1 outputs a gate control timing signal for the column switching MOSFETs corresponding to the first memory mat MAT1. As a result, among the plural column switching MOSFETs corresponding to the first memory mat MAT1 of the sense amplifiers of the sense amplifier and I/O circuits SA&I/O1 and SA&I/O2, a pair of MOSFETs designated by the output from the first Y decoder YDEC1 are turned on.

Resultantly, the memory cells of the first memory mat MAT1 are selected to be coupled with the main amplifier MA-AMP1.

As can be understood from the foregoing description, the first memory mat group, first sense and I/O circuit group, first and second X selection circuits, Y decoder, and first main amplifier are regarded to constitute a memory of the first column column decoder structure.

The memory mats MAT9 to MAT16 arranged next to the second X selection circuit (X-DEC2 and WD2) form a second memory mat group, the mats and the first memory group enclosing the second X selection circuit. Disposed for the second memory mat group are a second sense amplifier and I/O circuit group (SA&I/O10 etc.), a third X selection circuit including an X decoder X-DEC3, a word driver WD3, and a second mat control circuit MAT-CTRL2, a second Y decoder, and a second main amplifier MA-AMP2.

The second memory mat group is selected, like the first memory mat group, by the second sense amplifier and I/O circuit group, second and third X selection circuits, and second Y decoder to be linked with the second main amplifier MA-AMP.

Also disposed for a third memory mat group including the memory mats MAT17 to MAT24 are similar circuits. In this regard, the second main amplifier MA-AMP2 is also adopted for operation of the third memory mat group.

This also applies to the subsequent memory mat groups up to the 16-th memory mat groups (MAT121 to MAT128).

In this embodiment, along the central longitudinal direction of the semiconductor chip, there are fabricated, in addition to the bonding pads PAD1 to PAD59, such peripheral circuits as a data input/output circuit DINDOUT arranged between the main amplifiers MA-AMP1 to MA-AMP10 and the data input/output bonding pad, an address circuit ADDRESS mainly including an address buffer to receive X and Y address signals according to the address multiplexing method from the address bonding pad, a pre-decoder PRE-DEC to receive an address signal including a plurality of bits from the address circuit ADDRESS to pre-decode the signal, sub-drive circuits SUBDRIVER1 and SUBDRIVER2 to deliver the output from the pre-decoder PRE-DEC to the X and Y decoders, an X redundant circuit X-RED to determine an X address to be relieved, to nullify operation of the circuits related to the ordinary memory mat system, and to affirm operation of the circuits of the redundant memory mat system, a Y redundant circuit Y-RED for the Y redundant system, and a test control circuit TEST to detect a state in which the LCAS and UCAS signals are set to a significant level and the WE signal is set to a write indication level before the RAS signal is set to a significant level and accordingly set the dynamic RAM to a so-called contraction test state.

In this embodiment, although the invention is not particularly limited thereto, the voltage generator circuit for the VCC/2 voltage generator HVCG of FIG. 4B is not configured as a single unit on the semiconductor chip to be shared among the memory mat groups. Namely, a plurality of voltage generator circuits VREF1 to VREF4 are distributively arranged at a plurality of positions along the central longitudinal direction of the semiconductor chip CHP as shown in FIG. 7A. The output wirings of the distributively arranged VCC/2 voltage generators VREF1 to VREF4 may be electrically independent of each other. However, it is desirable that these circuits are interconnected to each other via a wiring such as an aluminum wiring on the chip. That is, thanks to such a connection, the respective outputs from the voltage generators VREF1 to VRFF4 compensate for each other to resultantly develop a reference voltage with a relatively large driving capability. Regardless of the slight fluctuation in the output voltages from the voltage generators VREF1 to VREF4, a reference voltage having a uniform level is advantageously supplied to the constituent components of the semiconductor chip.

The shift voltage generator circuits such as the power supply voltage generators VD and VS of FIG. 4A are configured not in a structure including one unit of VD and one unit of VS to be shared among the memory mat groups, but in a construction in which a plurality of these units VDLG1 to VDLG10 and VSGG1 to VSGG10 are distributively provided at respective positions on the semiconductor chip.

Specifically, the shift voltage generator includes as a set the power supply voltage generator VDLG and ground potential generator VSGG, which are arranged in the vicinity of the main amplifier. The shift voltage generator including VDLG1 and VSGG1 arranged in the proximity of the first main amplifier MA-AMP1 is used as a shift voltage generator circuit for the first sense amplifier and I/O circuit group SA&I/O1 to SA&I/O9 disposed in relation to the first memory mat group.

The shift voltage generator including VDLG2 and VSGG2 arranged in the proximity of the second main amplifier MA-AMP2 is adopted as a common shift voltage generator circuit for the second sense amplifier and I/O circuit group disposed in association with the second memory mat group MAT9 to MAT16 and third sense amplifier and I/O circuit group disposed for the third memory mat group MAT17 to MAT24.

A memory like the dynamic RAM includes a memory mat having generally a square pattern on its semiconductor chip including a plurality of memory cells, a plurality of word lines, and a plurality of bit lines arranged in a matrix. A selection circuit including an X decoder and a Y decoder to select a memory cell and a sense amplifier are disposed in the neighborhood of the memory mat, such that the overall system is constructed in the form of a flat pattern. In the dynamic RAM, the circuit units, each in the contour of a square, flat pattern including the selection circuit and sense amplifier, are arranged on the semiconductor chip to almost completely cover the surface of the square, flat chip as can be seen from FIGS. 7B and 7C. Thanks to this configuration, the semiconductor chip of the dynamic RAM requires only a relatively small flat pattern size. Each of the reference voltage generators VREF1 to VREF4 and shift voltage generators including VDLG1 and VSSG1, . . . , and VDLG10 and VSSG10 desirably has a large driving capability. For this purpose, each of the devices, such as MOSFETs constituting the circuits indicated above require a relatively large area. However, in the circuit as described in conjunction with the embodiment, these circuits are arranged in gaps between the peripheral circuits of the dynamic RAM and hence the increase in the semiconductor chip area can be advantageously minimized.

Figure 8B:
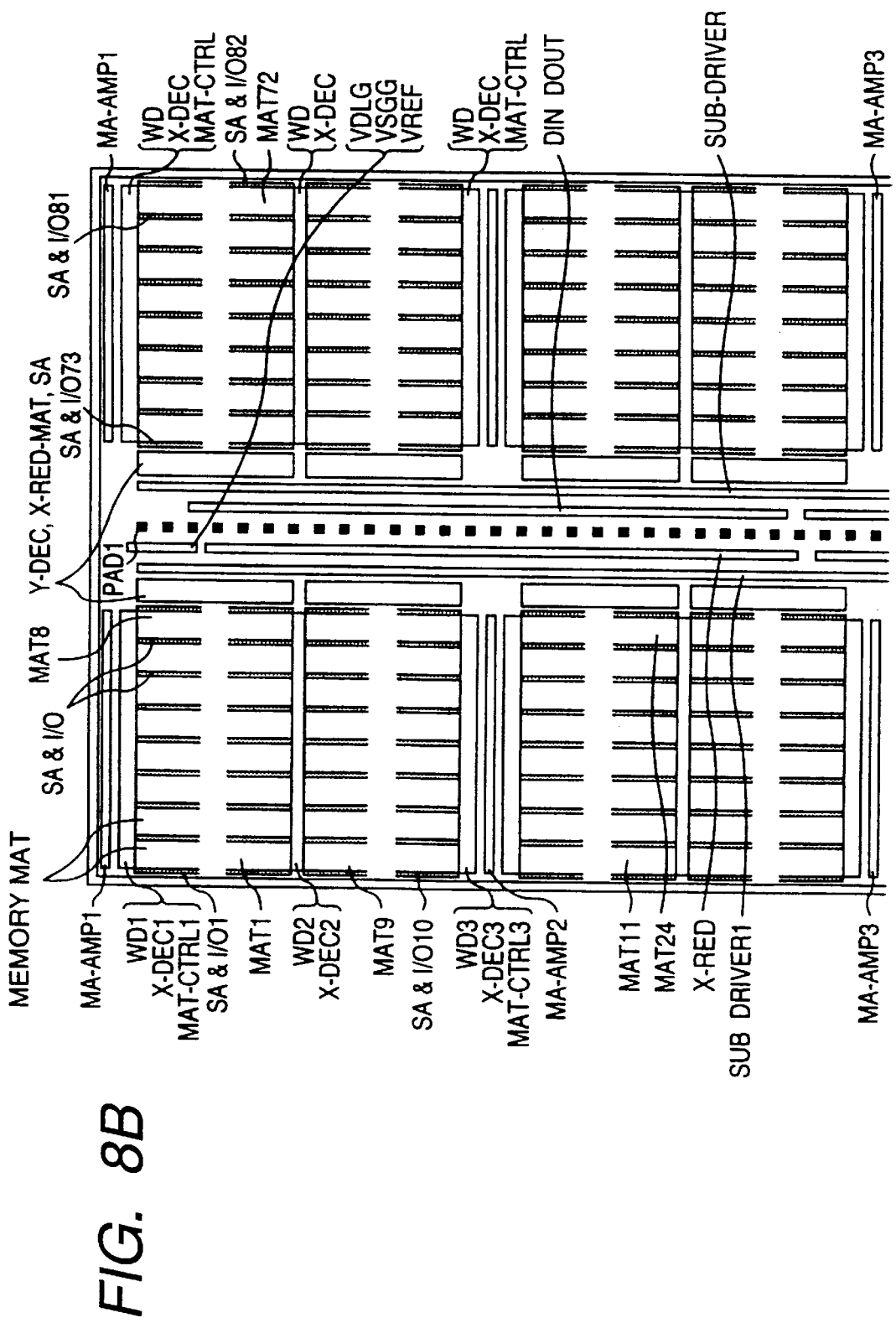
FIGS. 8B and 8C are layout diagrams showing in detail the arrangement of constituent elements of FIG. 8A.
Figure 8C:
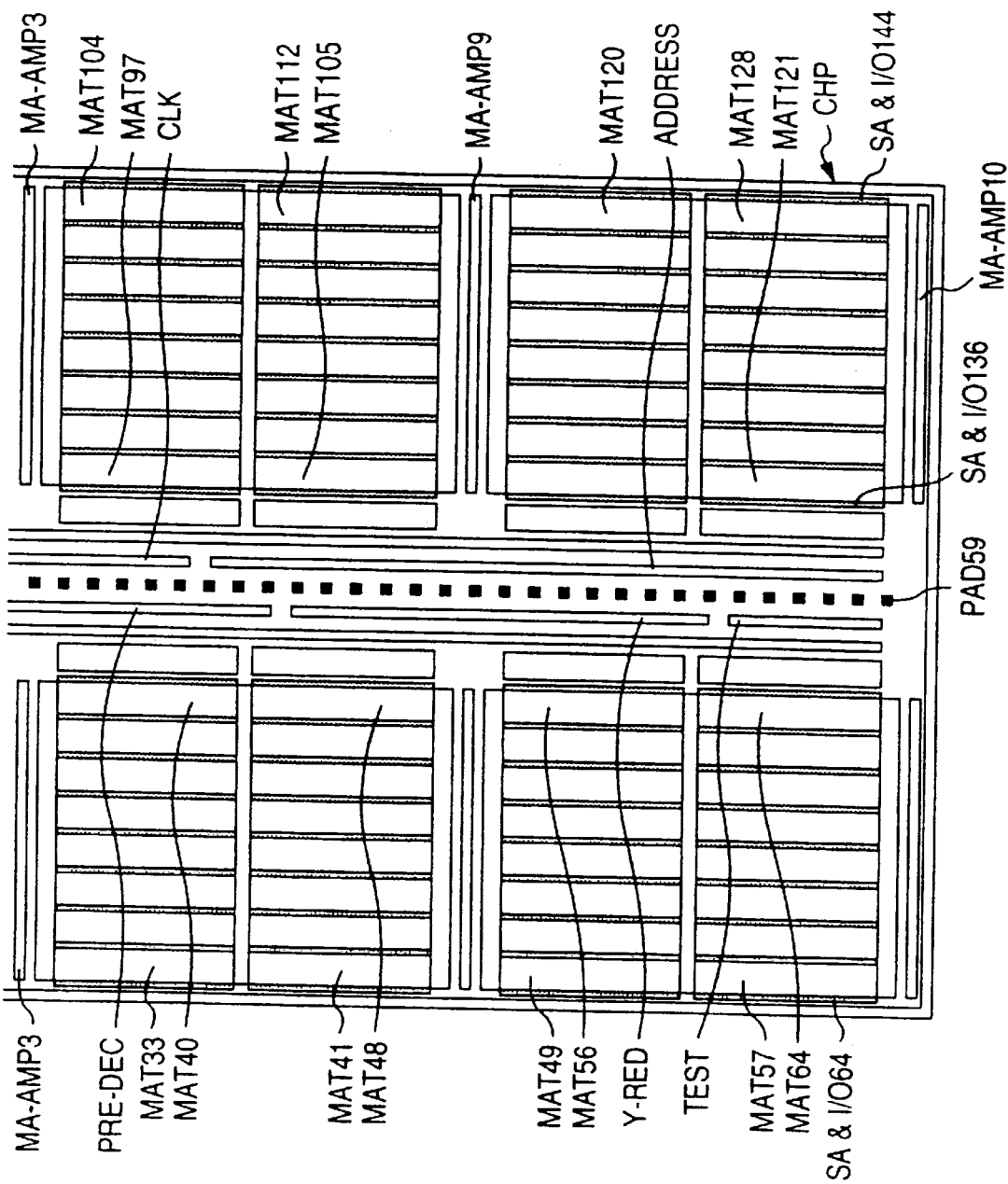

FIG. 8A shows a positional relationship between FIGS. 8B and 8C.

FIGS. 8B and 8C show a semiconductor chip layout representing another embodiment of the dynamic RAM according to the present invention. In this embodiment, a VSG generator VSGG to generate an internal voltage (third voltage) and a VD1 generator VDLG to produce an internal voltage (fourth voltage) are arranged on a semiconductor chip in a centralized manner.

Figure 8D:
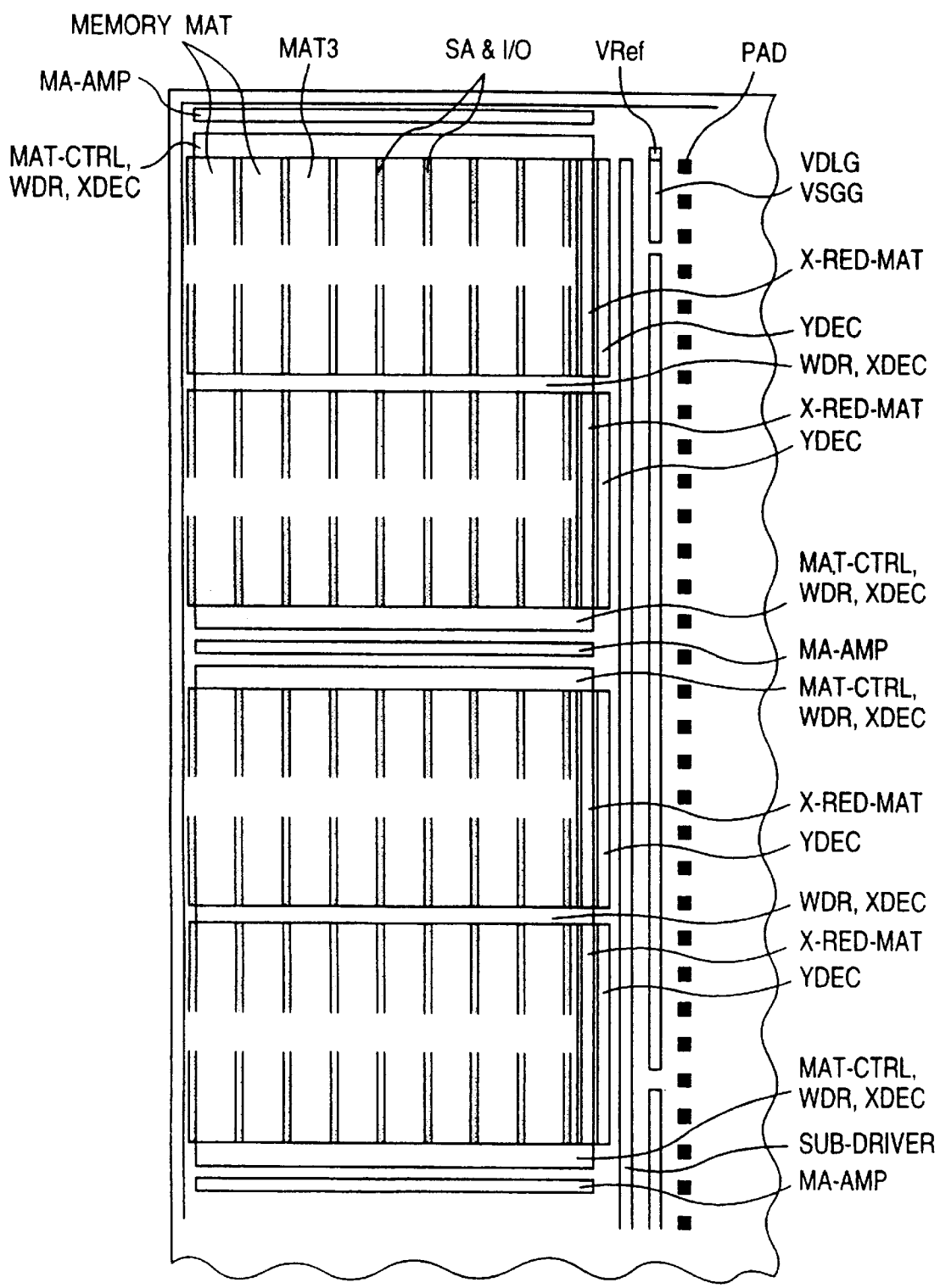
FIG. 8D is a layout diagram showing in detail the arrangement of constituent elements of FIG. 8B.

FIG. 8D shows in detail the configuration of FIG. 8B. For a plurality of memory mats, the VSG generators VSGGs and VDL generators VDLGs are disposed in a central portion along the longitudinal direction of the chip in a concentrated manner. This leads to reduction in the layout area of the VSG generators VSGGs and VDL generators VDLGs.

Figure 9:
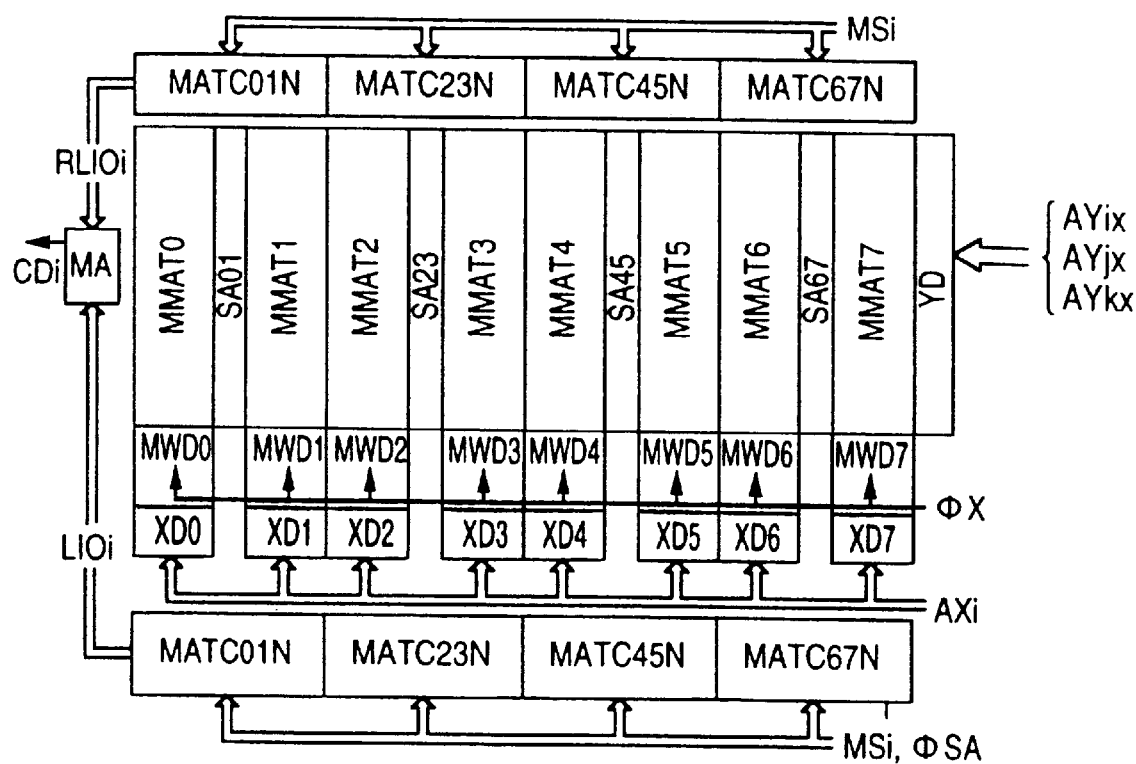
FIG. 9 is a block diagram showing a memory array and its peripheral selection circuit for the embodiment of the dynamic RAM according to the present invention.
Figure 10:
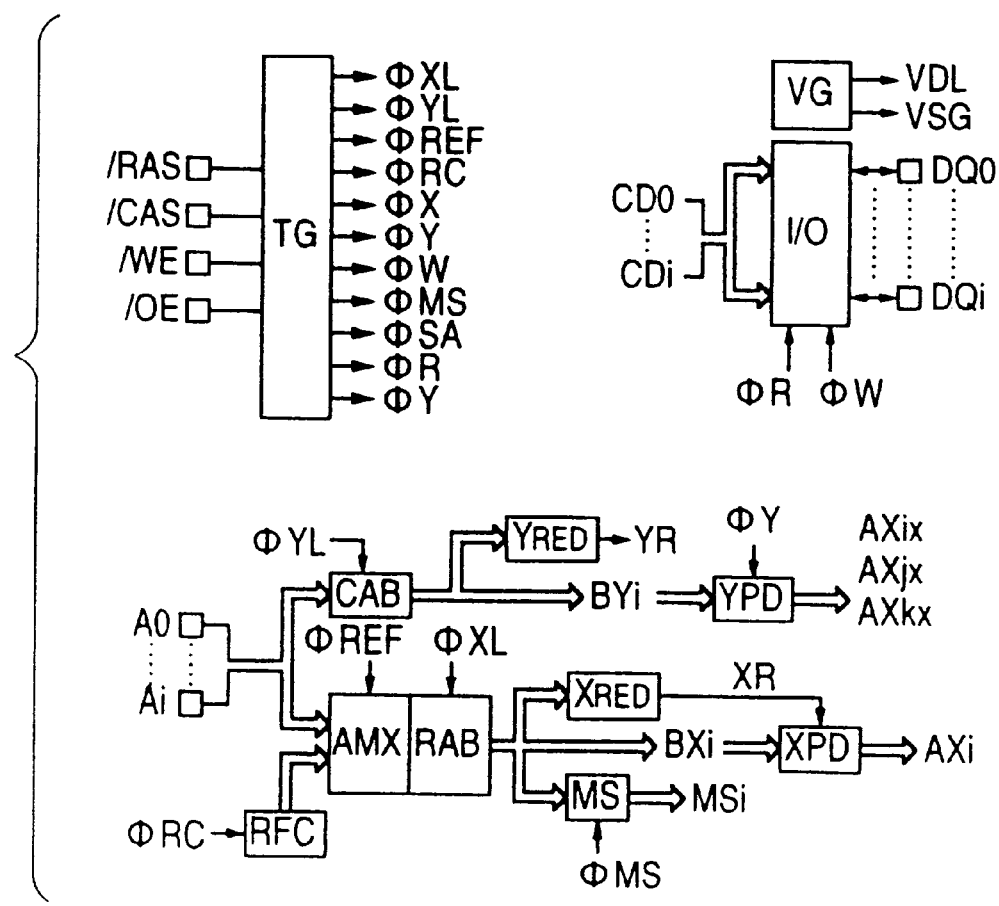
FIG. 10 is a block diagram showing an input/output interface section and a timing control circuit of the dynamic RAM to be fabricated in one chip together with the block of FIG. 9.

FIGS. 9 and 10 show the overall configuration of an embodiment of the dynamic RAM according to the present invention. FIG. 9 shows a memory array and its peripheral selection circuit in the entire block of the dynamic RAM. FIG. 10 shows the remaining constituent components, such as a timing control circuit, an input/output interface section, including an address buffer, and an input/output buffer.

FIG. 9 includes a sense amplifier SA01 disposed between memory mats MMAT0 and MMAT1. Namely, the sense amplifier SA01 is used, although the invention is not particularly limited thereto, as a shared sense amplifier selectively employed by two memory mats MMAT0 and MMAT1. Arranged in the input/output section of the sense amplifier SA01 is a selection switch for a shared sense operation to be connected to the complementary bit lines (also referred to as complementary data lines or complementary digit lines depending on cases).

For other pairs of memory mats MMAT2 and MMAT3, MMAT4 and MMAT5, and MMAT6 and MMAT7, there are also disposed sense amplifiers SA23, SA45, and SA67, respectively. A total of eight memory mats MMAT0 to MMAT7 and four sense amplifiers SA01 to SA67 constitute one memory array. A Y decoder YD is disposed for the memory arrays. A memory array, not shown, is arranged at a position of symmetry with respect to the Y decoder YD. The memory array, not shown, is constructed in a structure similar to that of the other memory array.

The memory mats MMAT0 to MMAT7 include X decoders XD0 to XD7, respectively. The decoders XD0 to XD7 decode an output signal AXi from the pre-decoder circuit SPD shown in FIG. 10 to produce word selection signals related to four lines. The configuration further includes word drivers MWD0 to MWD7 which receive the respective selection signals from the decoders XD0 to XD7 and signals from mat control circuits MATC01N to MATC67N, which will be described later, to thereby generate word line selection signals. The word drivers MWD0 to MWD7 include a word driver corresponding to a standby word line to recover a failure in the word lines.

For the pair of memory mats MMAT0 and MMAT1, there is provided a mat control circuit MATC01N. Similarly, mat control circuits MATC23N, MATC45N, and MATC67N are disposed for the other pairs of memory mats, MMAT2 and MMAT3, MMAT4 and MMAT5, and MMAT6 and MMAT7. The mat control circuits MATC01N to MATC67N receive a mat selection signal, a sense operation timing signal $\phi$SA, and a decode signal $\phi$X of an address signal, including two lower-most bits, which are not shown. In one of the mat control circuits corresponding to a selected mat, there is produced a selection signal to select one of the four word lines.

Furthermore, each of the mat control circuits MATC01N to MATC67N generates a selection signal which maintains a bit line selection switch corresponding to either one of the left and right memory mats, i.e., the selected mat in the on state, and sets the bit line selection switches corresponding to the memory mats not selected to the off state and a timing signal to start the amplifying operation of the pertinent sense amplifier. On the faraway side of the word lines with respect to the word drivers MWD0 to MWD7, there are disposed mat control circuits MATC01N to MATC67N. These circuits are provided with, although the invention is not particularly limited thereto, a function increase the falling speed by a reset circuit of the word lines and a function to sense a condition that the word line is at a predetermined level so as to drive the pertinent word line from the faraway side and to increase the falling and/or rising speed.

In FIG. 10, the timing control circuit TG receives external signals, such as a low address strobe signal /RAS, a column address strobe signal /CAS, a write enable signal /WE, and an output enable signal /OE,to determine an operation mode, and then creates various timing signals necessary for internal circuits in the operation mode and the internal voltages VDL and VSG. The voltages VDL and VSG are produced from the voltage generator VG, which includes the circuits VDLG and VSGG. This diagram only representatively shows the circuits described above.

The timing signal $\phi$XL is a signal to control the address buffer operation. To receive the low addresses supplied in a time series fashion from the external address terminals A0 to Ai to keep the signals in the low address buffer RAB, the signal $\phi$XL is supplied to the buffer RAB. That is, the buffer RAB acquires an address inputted via the address terminals A0 to Ai in response to the timing signal $\phi$XL to keep the address in a latch circuit, not shown, disposed in the buffer RAB. The timing signal $\phi$YL is a signal to control the address buffer operation of the column address buffer CAB. To receive a column low address inputted in a time series to maintain the address in the buffer CAB, the signal $\phi$YL is delivered to the buffer CAB. Namely, the buffer CAB receives an address inputted via the address terminals A0 to Ai in response to the timing signal $\phi$YL to keep the address in a latch circuit, not shown, disposed in the buffer RAB.

The signal $\phi$REF is generated in a refresh mode and is supplied to a multiplexer AMX provided in an input section of the low address buffer RAB such that the multiplexer AMX selects a refreshing address signal generated from a refresh address counter circuit RFC in the refresh mode. The counter RFC performs a counting operation to obtain the number of pulses generated from the timing control circuit TG and thereby produces a refresh address signal. In this embodiment, there are provided an automatic refresh mode and a self-refresh mode.

The timing signal $\phi$X is a word line selection timing signal which is fed to the X decoder of FIG. 9. The signal $\phi$X substantially includes four types of word line selection timing signals created according to a signal attained by decoding the X address signal including two lower-most bits. The timing signal $\phi$Y is a column selection timing signal which is supplied to a column pre-decoder YPD to resultantly output column selection signals AYix, AYjx, and AYkx.

The timing signal $\phi$W is a control signal to indicate a write operation, whereas the timing signal $\phi$R is a control signal for a read operation. These signals $\phi$w and $\phi$R are supplied to the input/output circuit I/O. In a write operation, an input buffer of the circuit I/O is activated and an output buffer thereof is set to an output high impedance state. In contrast therewith, in a read operation, the output buffer is activated and the input buffer is set to an output high impedance state.

The timing signal $\phi$MS is a signal to indicate a mat selecting operation and is supplied to a mat selector circuit MS to create a mat selection signal MSi at a timing synchronized with the supply of the signal $\phi$MS. In response to the timing signal $\phi$SA, there are produced a sense amplifier activating pulse as well as a signal to terminate the precharge of the associated complementary bit lines and a signal to control the bit lines related to the memory mats not selected.

In this embodiment, the low-address redundant circuit XRED includes a storage circuit to store a failed address and an address comparing circuit. The failed address stored therein is compared with an internal address signal BXi outputted from the low-address buffer RAB. If mismatching results, the circuit XRED sets the redundant relief indication signal XR to a non-relief level, for example a high level to enable operation of the pre-decoder XPD of the ordinary circuit. When the comparison results in a matching state, the circuit XRED inhibits the ordinary circuit from selecting the failed word line and outputs a selection signal to chose one of the standby word lines.

A circuit YRED similar to the circuit XRED is provided in the low-address system. The circuit YRED also includes a storage to store a failed address and an address comparing circuit so as to compare the failed address in the storage with an internal address signal BYi delivered from the column address buffer CAB. When this results in mismatching, the circuit YRED sets the signal YR to a non-relief level, for example, a high level and will enable operation of the ordinary circuit. When matching takes place, the circuit YRED prevents the ordinary circuit from selecting the failed bit lines and produces a selection signal to select standby bit lines.

Figure 11:
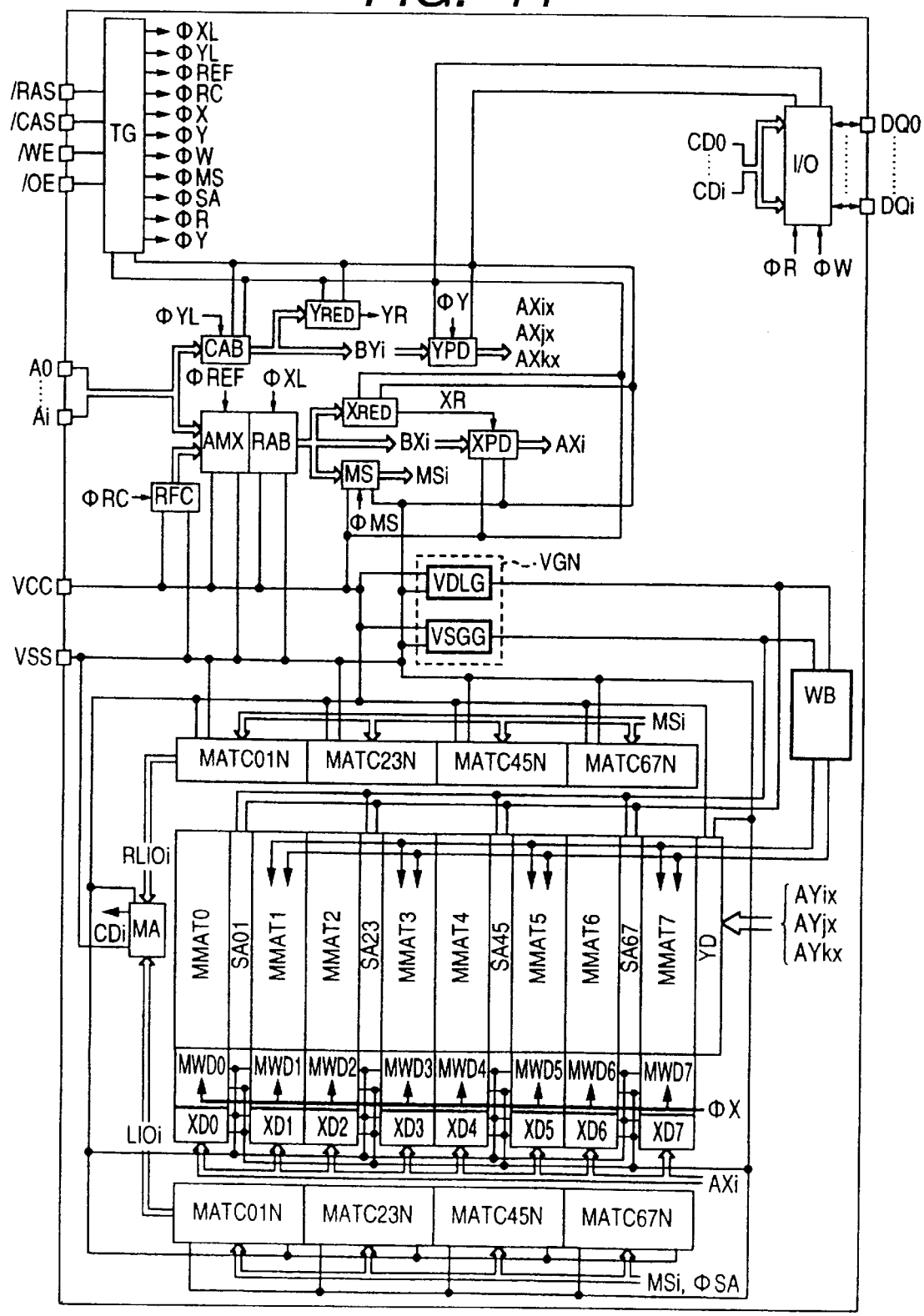
FIG. 11 is a diagram showing a power supply system for the memory array and its peripheral selection circuit, input/output interface section, and timing control circuit in the embodiment the dynamic RAM according to the present invention.

FIG. 11 shows in detail a relationship between the respective circuit blocks of FIGS. 9 and 10 and the ground potential (first voltage) VSS, the power supply voltage (second voltage) VCC, and the internal voltage generator VGN.

The ground potential (first voltage) VSS and power supply voltage (second voltage) VCC are supplied via a first external terminal VSS and a second external terminal VCC to the timing control circuit TG, column address buffer CAB, multiplexer AMX, refresh address counter RFC, row address buffer RAB, column redundant circuit YRED, column pre-decoder YPD, row redundant circuit XRED, mat selector MS, row pre-decoder XPD, voltage generator VGN, input/output circuit I/O, mat control circuits MATC01N to MATC67N, main amplifier MA, word drivers MWD0 to MWD7, and decoders XD0 to XD7. In these circuits, the voltage developed across the first and second terminals is adopted as the power supply voltage.

The first voltage generator VSGG is coupled with the first and second external terminals VSS and VCC to receive the ground potential VSS and the power supply voltage VCC to generate a third voltage VSG. Additionally, the second voltage generator VDLG is linked with the terminals VSS and VCC to receive the ground potential VSS and the power source voltage VCC to produce a fourth voltage VDL.

The sense amplifiers SA01 to SA67 and the write buffer circuit WB receives for its operation the internal voltage VSG and an internal voltage created by a voltage generator VGN including the VSG generator VSGG and the VDL generator VDLG. The write buffer WB is a circuit to write high-level and/or low-level information in the memory cells of the memory mats MMAT0 to MMAT7.

The row address strobe signal terminal /RS, column address strobe signal terminal /CAS, write enable signal terminal /WE, output enable signal terminal /OE, address terminals A0 to Ai, and data input/output terminals /DQ0 to DQi are supplied with signals created, for example, by a microcomputer, not shown. However, this does not restrict the present invention.

Figure 12:
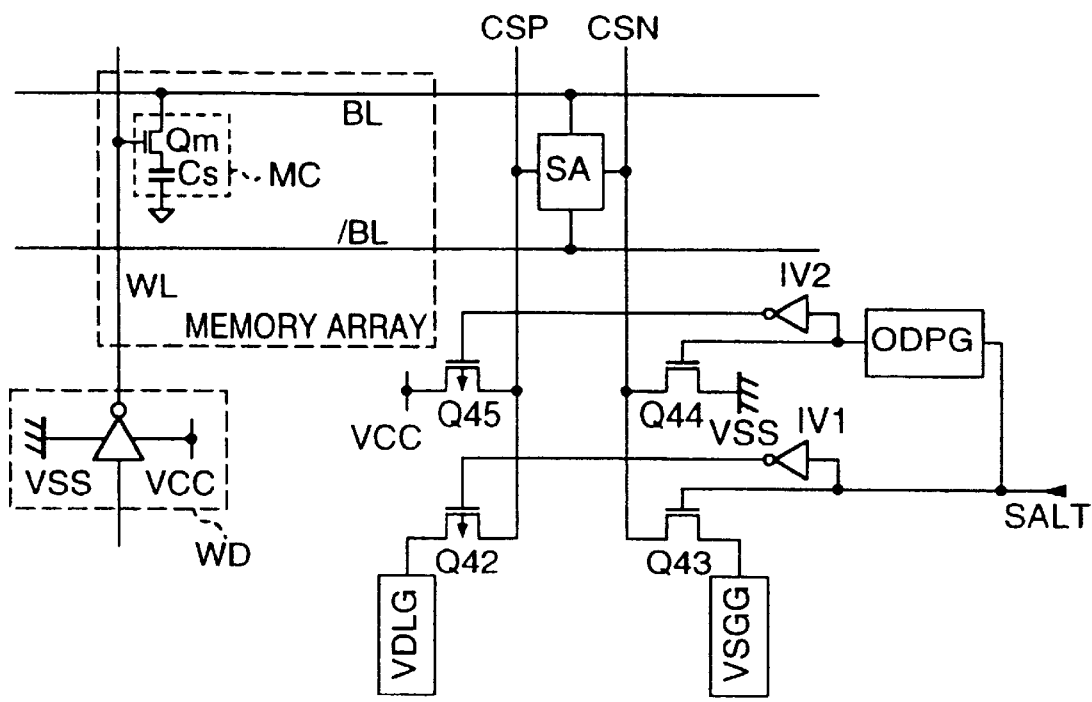
FIG. 12 is a circuit diagram showing the primary section of another embodiment of the dynamic RAM according to the present invention.

FIG. 12 is a schematic circuit diagram of the primary section of another embodiment of the dynamic RAM according to the present invention.

FIG. 12 includes a pair of complementary bit lines BL and /BL, a word line WL, a word driver WD for generating a selection signal of the word line WL, a dynamic memory cell MC disposed at a crosspoint between one of the complementary bit lines BL and the word line WL, a sense amplifier SA arranged for the bit lines BL and /BL, and voltage generators DLG and VSGG for generating an operating voltage of the sense amplifier SA.

In this embodiment, when the operating voltage of the sense amplifier SA is generated only by the first and second voltage generators VSGG and VDLG fabricated in a semiconductor integrated circuit, the circuit of the embodiment is configured to solve a new problem of low amplification of the sense amplifier, when compared with the configuration in which the sense amplifier SA is operated by the externally supplied power supply voltage VCC and ground potential VSS, due to restriction of the current supply capability of the voltage generators VSGG and VDLG. In short, to attain the amplification speed of the sense amplifier SA equivalent to that of the conventional system using the current supply from the external power source, it is required to increase the size of the MOSFETs constituting the voltage generators VDLG and VSGG, leading to a substantial increase in the overall circuit size. Consequently, the obtained circuit is not suitable in actual practice.

Figure 13:
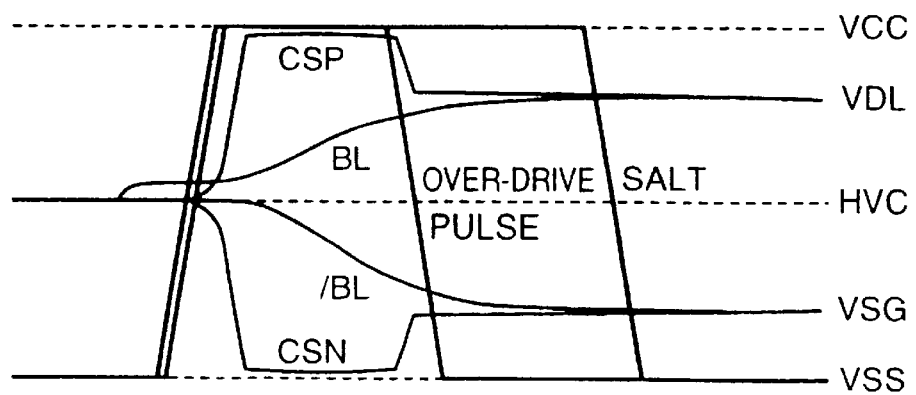
FIG. 13 is a diagram showing signal waveforms for explaining the circuit operation of FIG. 12.

In the embodiment, during a period of time from when the sense amplifier SA starts amplification to when the amplification level of the sense amplifier SA reaches the third voltage VSG or the fourth voltage VDL, the circuits operate in the same way as a conventional sense amplifier such that the power supply voltage (second voltage) VCC is supplied via a p-channel MOSFET Q45 to a second common source line CSP of the sense amplifier SA and the circuit ground potential (first potential) VSS is delivered via an n-channel MOSFET Q44 to a first common source line CSN of the sense amplifier SA. In other words, as can be seen from the operation waveforms shown in FIGS. 13 and 14, the operating voltage of the sense amplifier SA is set to such an overdrive voltage with respect to the amplified output voltage as the power supply voltage VCC or ground potential VSS. Thanks to the overdrive voltage, it is possible to increase the rising speed of the amplified signal in an operation in which quite a small read voltage generated due to charge dispersion associated with the charge accumulated in the capacitor Cs of the memory cell and the charge precharged in the bit line BL is sensed using the precharge voltage of the remaining bit line /BL as a reference voltage.

The timing signals supplied to the gates of MOSFETs Q45 and Q44 are created by the overdrive pulse generator ODPG. The circuit ODPG receives an operation timing signal SALT of the sense amplifier SA to initiate its operation at a timing synchronized with the rising edge thereof and creates a delay signal by delaying the signal. The circuit ODPG then generates a pulse through a logical operation with the signal, the pulse being kept at a high level for the period of delay. The pulse is directly fed to the gate of the n-channel MOSFET Q44. The pulse is also delivered to an inverter IV2 such that the inverted signal is supplied to the gate of the p-channel MOSFET Q45. The timing signal SALT is fed to the gate of the n-channel MOSFET Q43 such that the internal VSG is resultantly transferred via the MOSFET Q43 to the common source line CSN. The signal SALT is inverted through an inverter circuit IV1 to be supplied to a p-channel MOSFET Q42. Accordingly, the internal VDL is transferred via the MOSFET Q42 to the common source line CPS.

Figure 15:
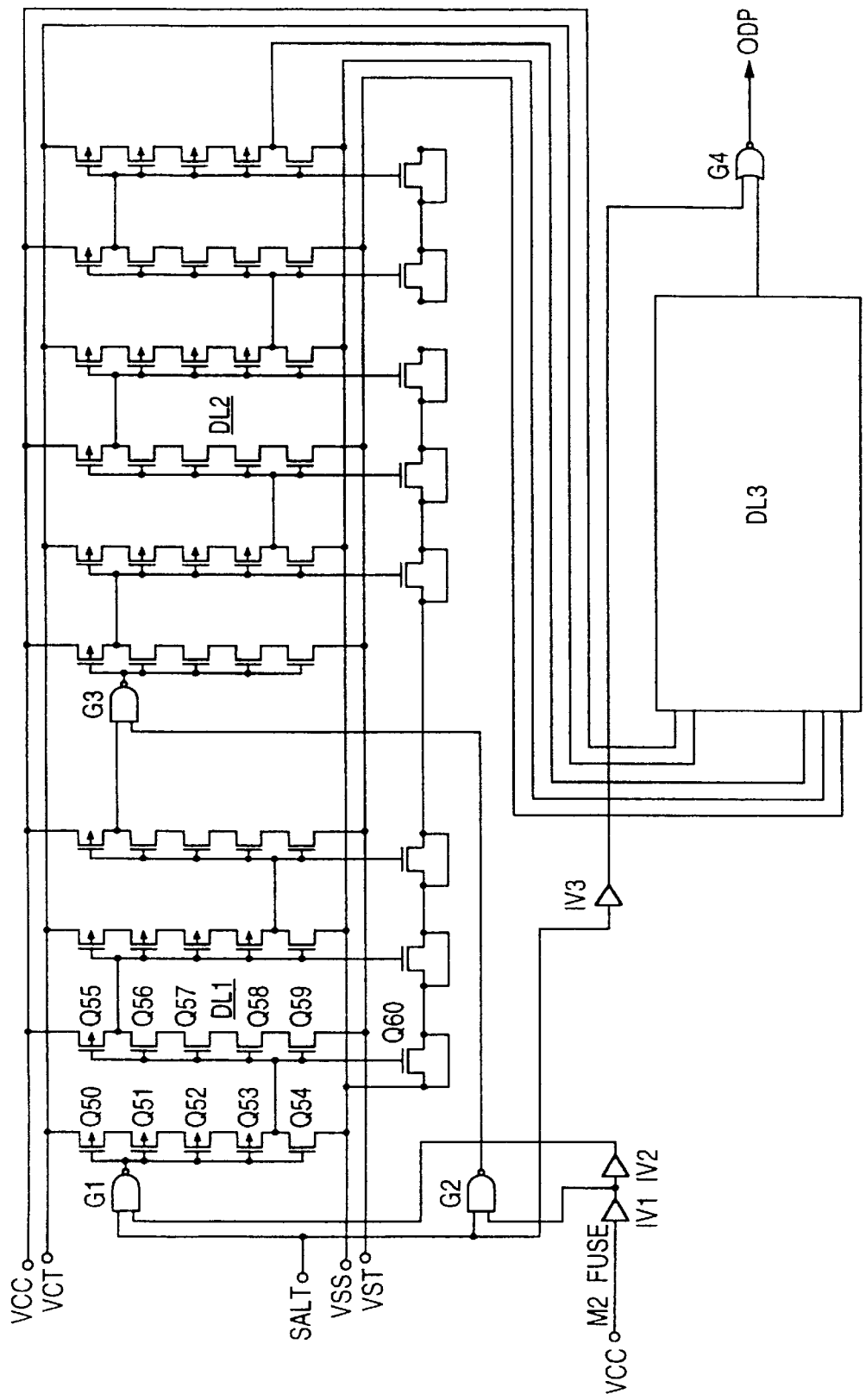
FIG. 15 is a circuit diagram showing in detail an overdrive pulse generator circuit of FIG. 12.

FIG. 15 shows an embodiment of the overdrive pulse generator. In this embodiment, the overdrive pulse ODP is generated such that the signal is controlled to cause the pulse to rise at a timing synchronized with the rising of the timing signal SALT activating the sense amplifier and the pulse falls in response to a signal attained by delaying the signal. For this purpose, there is employed a delay circuit, which is required to generate the delay signal only for the rising edge of the timing signal SALT. Therefore, in a unitary delay circuit supplied with an input signal inverted through a NAND gate G1 of a multi-stage delay circuit, to generate a delay signal for the falling edge from a high level to a low level, there are connected, although the invention is not particularly limited thereto, four p-channel MOSFETs Q50 to Q53 in series to thereby produce a limited current. In contrast thereto, the n-channel MOSFET circuit to generate an output signal at a low level in response to the rising edge from the low level to the high level need not conduct a delay operation, there is need for only one n-channel MOSFET Q54.

As indicated above, in the unitary circuits of the odd-numbered stages including the circuit of the first stage, a plurality of p-channel MOSFETs, for example, Q50 to Q53 are connected to each other in series, whereas a plurality of n-channel MOSFETs, for example, Q56 to Q59 are connected even-numbered stages. Additionally, although the invention is not particularly limited thereto, a MOSFET, for example, Q60 to act as a capacitance element to increase the load capacitance is connected to an input section of the unitary circuit of the subsequent stage. With this, the desired delay signal can be produced by a reduced number of circuit elements. In this embodiment, the unitary circuits are configured in a connection similar to a cascade connection to form first to third delay circuits DL1 to DL3.

The first delay circuit DL1 is adopted to adjust the process fluctuation of the threshold value of MOSFETs and the like in the manufacture of the semiconductor IC devices. To adjust the delay time, there are arranged the inverter circuits IV1 and IV2 and NAND gates G1 and G2, a metal layer M2 as a fuse being fabricated between the input of the inverter IV1 and the power supply terminal VCC. That is, in a state where the fuse configured with the metal layer M2 is present, the high-level control signal is supplied via the inverters IV1 and IV2 to the NAND gate G1. Accordingly, the NAND gate G1 functions as an inverter circuit to invert the timing signal SALT to be fed to the unitary delay circuit. In this situation, due to the low-level output signal from the inverter IV1, the output signal from the NAND gate G2 is set to the high level regardless of the timing signal SALT. Therefore, the timing signal SALT is outputted via the delay circuits DL1, DL2, and DL3.

When the fuse constituted with the metal layer M2 is disconnected, the input level of the inverter IV1 is set to the low level by a high-resistance pull-down resistor or the like, not shown. Consequently, the output signal from the inverter IV1 is set to the high level and hence the NAND gate G2 operates as an inverter circuit. Resultantly, the timing signal SALT is supplied to the second delay circuit DL2 without passing through the first delay circuit DL1. On this occasion, the low-level output signal from the inverter IV2 sets the output signal from the NAND gate G1 to the high level regardless of the timing signal SALT. In consequence, the timing signal SALT is outputted via the delay circuits DL2 and DL3 in this state.

In short, in a case in which the values of potential of bit lines BL and /BL becomes excessive because of too large values of delay time produced by the delay circuits DL1 to DL3 due to the process fluctuation or deviation in the characteristic thereof even when the output signal from the sense amplifier SA reaches VDL and VSG through the overdrive of the sense amplifier SA as indicated above, the fuse is disconnected and the overdrive pulse is adjusted to a pulse of a short width corresponding to the delay circuits DL2 and DL3, thereby avoiding the drawback described above.

The NOR gate circuit G4 generates an overdrive pulse ODP to rise to a high level in response to the change of the output signal from the inverter IV3 to the low level at a timing synchronized with the rising edge of the timing signal SALT to the high level. When the rising of the signal SALT to the high level is delayed by the delay circuits DL1 and DL2 and the output signal from the delay circuit DL3 is set to the high level, the NOR gate G4 changes the pulse ODP from the high level to the low level. In this way, there is produced the overdrive pulse ODP which is kept at the high level only during the delay time of the delay circuits.

Each of the p-channel MOSFETs Q50 to Q53 and n-channel MOSFET Q54 is fabricated with a minimum channel length of Lg. Connecting these MOSFETs in multiple stages, it is possible to adjust the pulse width of the overdrive pulse ODP in association with the VCC dependence and process dependence of the memory array.

Although the invention is not particularly limited thereto, the unitary circuits in the odd-numbered stages of the delay circuit are connected between a power supply voltage VCT line coupled via a power supply MOSFET, not shown, with the power voltage VCC line and the ground potential VSS line, whereas the unitary circuits in the even-numbered stages are connected between the power supply voltage VCC line and a voltage VST line to which the circuit ground potential VSS is supplied via another MOSFET, not shown. The power voltage VCT and VST lines are set to a floating state after the power source MOSFET supplying the power supply voltage VCC and the ground potential VSS in the standby state of the dynamic RAM is turned off. Thanks to this, the current required for the delay circuits can be minimized. In the standby state, the operation of the overdrive pulse generator is also terminated. That is, although the sense amplifiers are periodically operated for the refresh operation even in the standby stage, it is unnecessary to generate the amplified signal at a high speed which is required, for example, in the read operation. Consequently, the interruption of the operation of the overdrive pulse generator is also effective to reduce the refresh current consumption.

Figure 16:
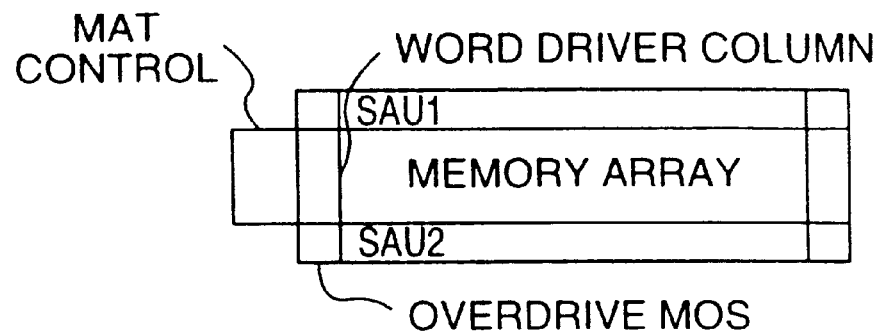
FIG. 16 is a layout diagram showing another embodiment of the memory array and its peripheral circuit of the dynamic RAM to which the present invention is applied.

FIG. 16 is a layout showing a memory array and its peripheral circuit in another embodiment of the dynamic RAM according to the present invention.

In this layout, although the invention is not particularly limited thereto, the system includes a memory array MARY in the central position thereof, a sense amplifier unit SAU1 on the upper side of the memory array MARY, a sense amplifier unit SAU2 on the lower side thereof, and word drivers WD1 and WD2 respectively on the horizontal sides thereof. A mat controller MATC to select the memory array MARY is arranged in the vicinity of one of the word drivers, i.e., WD1 in this case. As can be more clearly seen from FIG. 17, an overdrive MOSFET is fabricated on both ends of each of the sense amplifier units SAU1 and SAU2.

Figure 17:
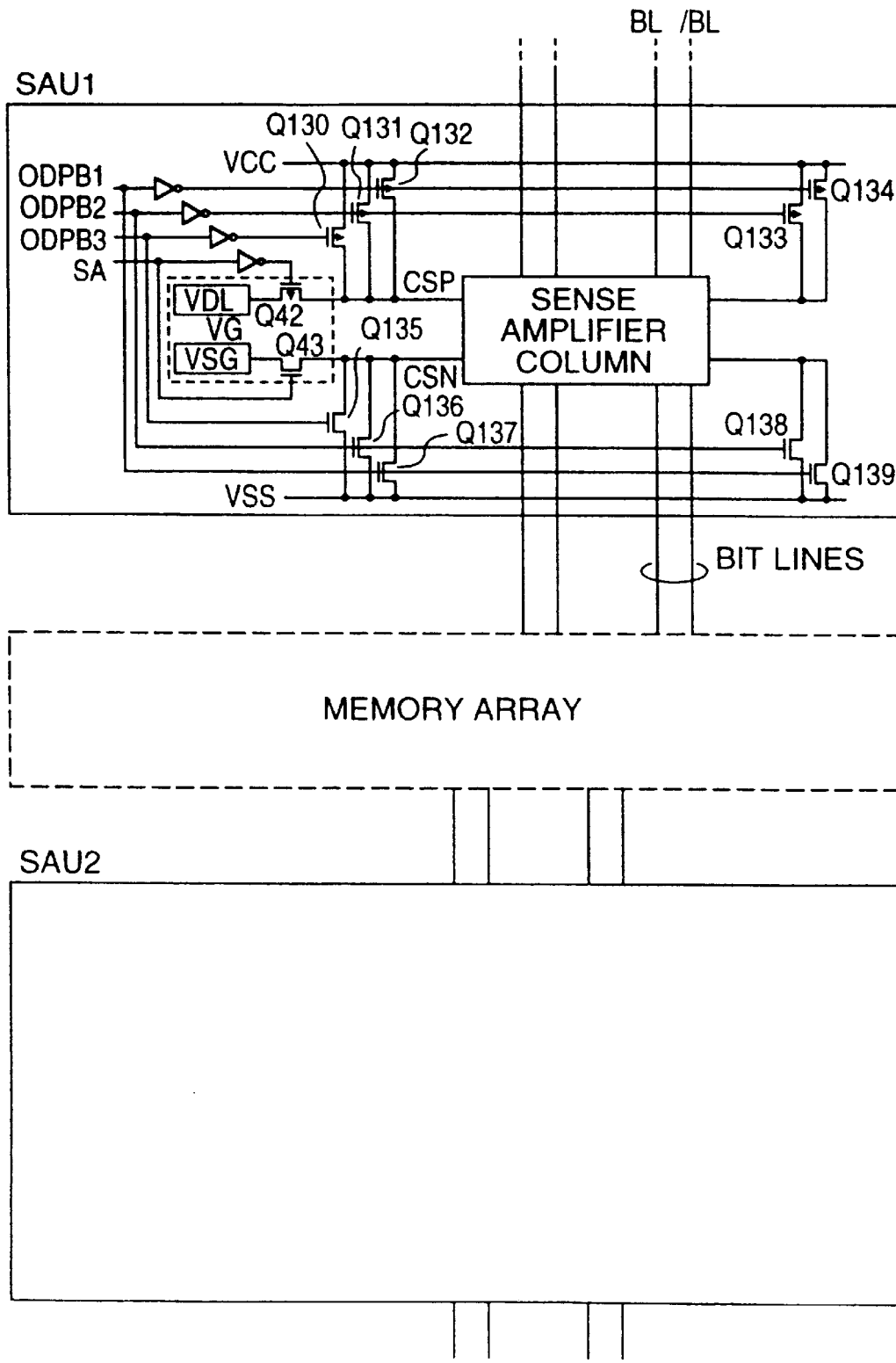
FIG. 17 is a layout diagram showing in detail of the memory array and its peripheral circuit of FIG. 16.

FIG. 17 shows the memory array and the peripheral circuit of FIG. 16 in detail. Although the invention is not particularly limited thereto, the sense amplifier unit SAU1 includes p-channel MOSFETs Q130 to Q134 and n-channel MOSFETS Q135 to Q139 to overdrive sense amplifiers and a sense amplifier column including a plurality of CMOS sense amplifiers, each amplifier having a pair of input and output terminals connected to associated complementary bit lines BL and /BL. In the sense amplifier column SAC, the p-channel MOSFETs of the respective CMOS sense amplifiers have a common source coupled with a common source line CSP and the n-channel MOSFETs thereof have a common source linked with a common source line CSN.

The internal power voltage generator VGN includes a VDL generator, a p-channel MOSFET Q42 to control operation of sense amplifiers, a VSG generator, and an n-channel MOSFET Q43 to control sense amplifier operation. To control switching operations of the p-channel MOSFETs Q130 to Q134 and n-channel MOSFETs Q135 to Q139 for the overdrive operation, overdrive control signals ODPB1 to ODPB3, which will be described later, are supplied to the gates of the MOSFETs according to an associated relationship between the MOSFETs and the control signals ODPB1 to ODPB3.

The internal voltage VDL is coupled via the p-channel MOSFET Q42 with the common source line CSP to supply a predetermined voltage to the source of the p-channel MOSFETs, not shown, of the sense amplifier as described above. The sources of the p-channel MOSFETs Q130 to Q134 are linked with the power supply voltage VCC, whereas the drains thereof are coupled with the common source line CSP.

The internal voltage VSG is linked via the n-channel MOSFET Q43, which controls sense amplifier operation, with the common source line CSN to supply an internal voltage to the sources of n-channel MOSFETs, not shown, of the sense amplifier column. The sources of the overdrive n-channel MOSFETs Q135 to Q139 are linked with the ground potential VSS, whereas the drains thereof are coupled with the common source line CSN.

Although the detailed configuration of the sense amplifier unit SAU2 is not shown, it is to be appreciated that the sense unit amplifier units SAU1 and SAU2 are constructed to have a mutually similar structure.

The paired bit lines or complementary bit lines BL and /BL are fabricated in an alternating fashion (a nest structure) with respect to two sense amplifies SAU1 and SAU2.

In short, of the plural pairs of bit lines which extend in the vertical direction of the memory array MARY in FIG. 17, the odd-numbered bit line pairs BL1 and /BL1 as well as BL3 and /BL3 extend toward the sense amplifier unit SAU1 arranged on one side of the memory array MARY to be connected to the sense amplifier column therein, whereas the even-numbered bit line pairs BL2 and /BL2 as well as BL4 and /BL4 extend toward the sense amplifier unit SAU2 arranged on the other side of the memory array MARY to be connected to the sense amplifier column therein.

Thanks to this constitution, while the pitch of the plural bit line pairs is required to be minimized in the memory array MARY to implement a large storage capacity, the pitch of the plural sense amplifiers can be set to a relatively large value in the sense amplifier column.

In each sense amplifier, due to the relative dimensional deviation or fluctuation between the pair of n-channel MOSFETs constituting the amplifier and/or that between the pair of p-channel MOSFETs of the amplifier, there may possibly appear an offset voltage between a pair of input and output terminals thereof. When the offset voltage of the sense amplifier becomes too large, there occurs a fear that the sense amplifier will amplify, in a wrong potential direction, a read signal at quite a low level supplied from a memory cell to the bit line pair.

To reduce the offset voltage of the sense amplifier, it is efficient to relatively increase the absolute dimension of each of the pairs of n-channel and p-channel MOSFETs of the sense amplifier. Namely, the relative dimensional fluctuation is decreased in the pair of MOSFETs having the large size.

In a case in which two sense amplifier units SAU1 and SAU2 are respectively arranged for the memory array on the sides of one memory array as shown in FIG. 17, the size of MOSFETs of the sense amplifiers can be reduced regardless of the absolute pitch of the plural bit line pairs of the memory array as described above. Resultantly, even when data supplied to the pair of bit lines is at quite a low level, it is possible to satisfactorily amplify the data.

Figure 18:
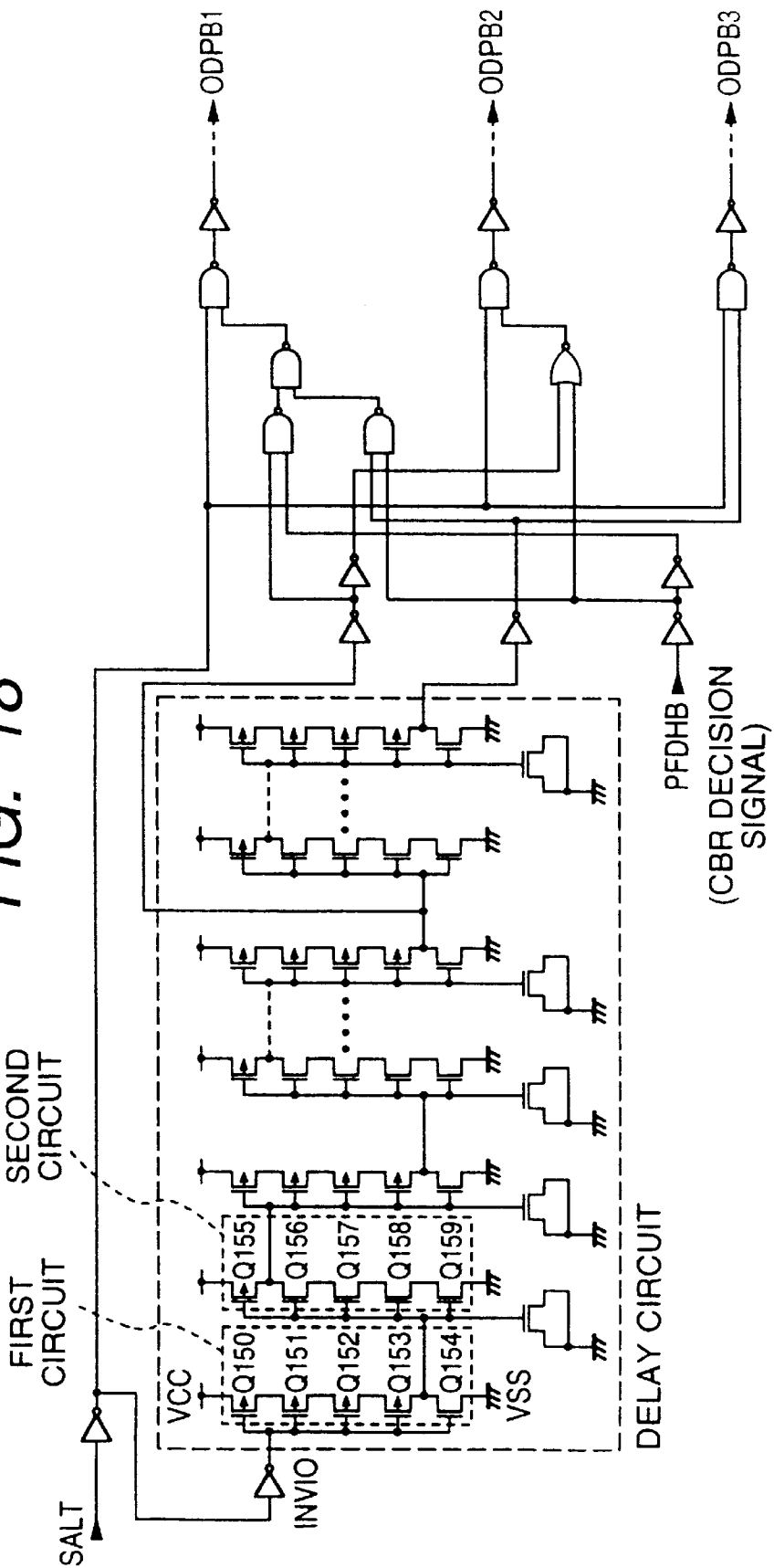
FIG. 18 is a circuit diagram showing further another embodiment of the overdrive pulse generator circuit.

FIG. 18 shows in a circuit diagram another embodiment of the overdrive pulse generator. In operation of the circuit of the embodiment, the overdrive pulses ODPB1 to ODPB3 are generated by controlling the rising edge thereof at a timing synchronized wish the timing signal SALT activating the sense amplifier and the falling edge thereof at the timing of a delay signal of the signal SALT. For this purpose, unitary delay circuits UDLC1 to UDLCn are adopted in a multiple stage. It is only necessary for the delay circuit to produce a delay signal of the timing signal SALT. Therefore, in the unitary circuit UDLC1 of the multi-stage delay circuit section receiving an input signal obtained by passing a signal through an inverter INV10, to generate a delay signal at timing from a high level to a low level of the signal, there are employed, although the invention is not particularly limited thereto, four p-channel MOSFETs Q150 to Q153 in series connection to produce a desired current. In contrast thereto, the n-channel MOSFET section which creates a low-level output signal in response to the rising edge from the low level to the high level, need not achieve the delay operation, and so there is a need for only one n-channel MOSFET Q154.

In this fashion, the unitary circuit (e.g., the first circuit UDLC1) in the odd-numbered stage includes a series connection of a plurality of p-channel MOSFETs such as Q150 to Q153 and the unitary circuit (e.g., the second circuit UDLC2) in the even-numbered stage includes a series connection of a plurality of n-channel MOSFETs such as Q156 to Q159. In addition, to increase the load capacity, although the invention is not particularly limited thereto, a MOSFET, e.g., Q160 is connected as a capacitor element to an input section of the unitary circuit of each subsequent stage. With this provision, a desired delay signal can be produced with a reduced number of circuit elements.

The delay circuit unit is utilized to adjust the deviation in characteristics due to the device manufacturing process. Arranging a plurality of p-channel and n-channel MOSFETs in a plurality of stages, the rising and falling edges of the input signal can be appropriately delayed according to the characteristic of the memory array.

Figure 19:
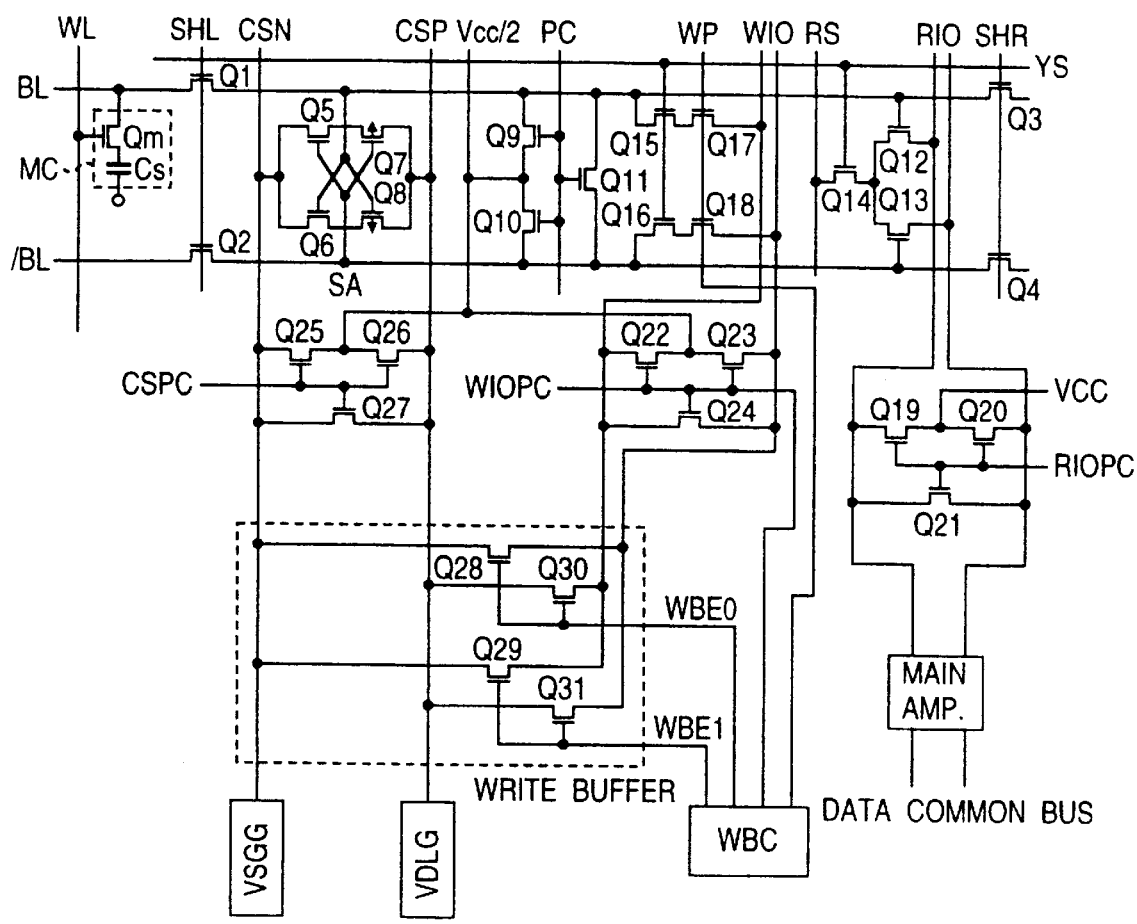
FIG. 19 is a circuit diagram showing the primary section of another embodiment of the memory section of the dynamic RAM according to the present invention.

FIG. 19 shows the primary circuit section of another embodiment of the dynamic RAM according to the present invention. The diagram representatively includes a word line WL, a pair of complementary bit lines BL and /BL, a sense amplifier and precharge circuit related thereto, a write circuit, and a read circuit.

The dynamic memory cell MC includes, like the memory cell described above, an address selection MOSFET Qm and an information storage capacitor Cs. The MOSFET Qm has a gate connected to the word line WL and a source and a drain, either one of which is connected to the bit line BL. The remaining one thereof is connected a storage node of the capacitor Cs. The other electrode of capacitor CS is supplied with a plate voltage VPL for a common use thereof.

The bit lines BL and /BL are disposed in parallel with each other as shown in FIG. 19. For effecting a capacitance balance or the like, the paired bit lines BL and /BL are appropriately configured in an intersected structure, not shown. The bit lines BL and /BL are connected to the input and output nodes of the sense amplifier SA via shared MOSFETs Q1 and Q2, respectively. The sense amplifier SA includes n-channel MOSFETs Q5 and Q6 and p-channel MOSFETs Q7 and Q8 having gates and drains in a cross connection to configure a latch circuit structure. The n-channel MOSFETs Q5 and Q6 have sources connected to the common source line CSN and the p-channel MOSFETs Q7 and Q8 have sources connected to the common source line CSP. For the common source line CSP, there is a power switch MOSFET of the p-channel type, not shown, to receive the internal voltage VDL produced from the voltage generator VDLG. Arranged similarly for the common source line CSN corresponding to the n-channel MOSFETs Q5 and Q6 is an n-channel MOSFET, not shown, to receive the internal voltage VSG supplied from the voltage generator VSGG.

Connected between the input/output nodes of the sense amplifier SA are a precharge circuit PCC1 including a so-called equalizer MOSFET Q11 and precharge switching MOSFETs Q9 and Q10 to develop the half-precharge voltage VCC/2 (fifth voltage) across the complementary bit lines. These MOSFETs Q9 to Q11 have gates to which the precharge signal PC is commonly supplied. Between the common source lines CSP and CSN of the sense amplifier SA, there is also fabricated a MOSFET Q27 to establish a connection between the common source lines CSP and CSN and a precharge circuit PCC2 including switching MOSFETs Q25 and Q26 to develop the half-precharge voltage HVC (VCC/2) between the lines CSP and CSN. These MOSFETs Q25 to Q27 have gates to which the precharge signal CSPC is commonly delivered.

In the embodiment, an amplifier RAMP is provided to increase the read speed. The amplifier circuit RAMP includes differential amplifier MOSFETs Q12 and Q13 to receive the potential between the input/output nodes of the sense amplifier and a MOSFET Q14 connected to the common source thereof to generate an operating current. Receiving the timing signal RS and the column selection signal YS respectively via the source and gate, the MOSFET Q14 validates or affirms operation of the differential amplifier MOSFETs Q12 and Q13. These amplifier MOSFETs Q12 and Q13 have drains connected to read input/output line RIOs. Between the lines RIO, there is arranged a precharge circuit PCC3 including MOSFETs Q19 to Q21 to develop a precharge voltage of power supply voltage VCC between the input/output lines RIO. Through an amplifying operation of the differential amplifier MOSFETs, one of the input/output lines RIO is set to a low level so that a resultantly amplified signal is transferred to a main amplifier (Main Amp).

Thanks to the amplifier RAMP, before the amplified signal from the sense amplifier SA reaches the high level (VDL) or low level (VSG), the Y-related selecting operation is achieved to activate the amplifier circuit so as to transfer the read signal to the main amplifier, thereby increasing the read speed.

As indicated above, in correspondence to the provision of the read input/output lines RIO, there are disposed input/output lines WIO for the write operation. To adjust the high and low levels of the write signal received via the input/output lines RIO according to VDL and VSG, there are used, although the invention is not particularly limited thereto, the voltage generators VDLG and VSGG. Namely, a precharge circuit similarly including MOSFETs Q22 and Q24 is provided also between the write input/output lines WIO. A write signal such as VDL and VSG is transferred thereto via a write buffer WB.

When the write signal WEB0 and WEB1 are respectively at high-and low levels, the MOSFETs Q28 and Q30 turn on to accordingly send the write signal to the input/output line WIO. When the write signal WEB0 and WEB1 are respectively at low and high levels, the MOSFETs Q29 and Q31 turn on to resultantly transfer a write signal, which is obtained by inverting the signal above, to the input/output line WIO. The MOSFETs Q15 and Q16 function as a column selection switch CSW of which the switching operation is accomplished under control of the selection signal YS. The MOSFETs Q17 and Q18 connected respectively to the MOSFETs Q15 and Q16 in series operate the switching operation in response to the write pulse WP. In operation, the write signals such as VDL and VSG fed to the input/output line WIO are passed to the input output node of the sense amplifier SA.

The MOSFETs Q1 and Q2 as well as MOSFETs Q3 and Q4 serve as a shared switching MOSFET unit to select either one of the memory mats fabricated on the right and left sides of the sense amplifier SA and input/output circuit. When the memory mat on the left side is elected, the MOSFETs Q1 and Q2 are kept in the on state by a signal SHL and then a signal SHR is set to a low level to disconnect the bit lines of the memory mat on the right side. When the memory mat on the right side is elected, the MOSFETs Q3 and Q4 are kept in the on state by a signal SHR and then the signal SHL is set to a low level to disconnect the bit lines of the memory mat on the left side. During a precharge period after a memory access, the signals SHL and SHR are set to a high level to precharge both bit lines. The high level of the signals SHL and SHR is not the high level obtained, for example, by the boosting operation in the conventional dynamic RAM. Namely, the high level, such as the level of the power supply voltage adopted for the word line WL, may be used.

The write buffer controller WBC produces a write pulse signal WP, a write input/output precharge signal WIOPC, a write signal WEB0, and a write signal WEB1.

Figure 20:
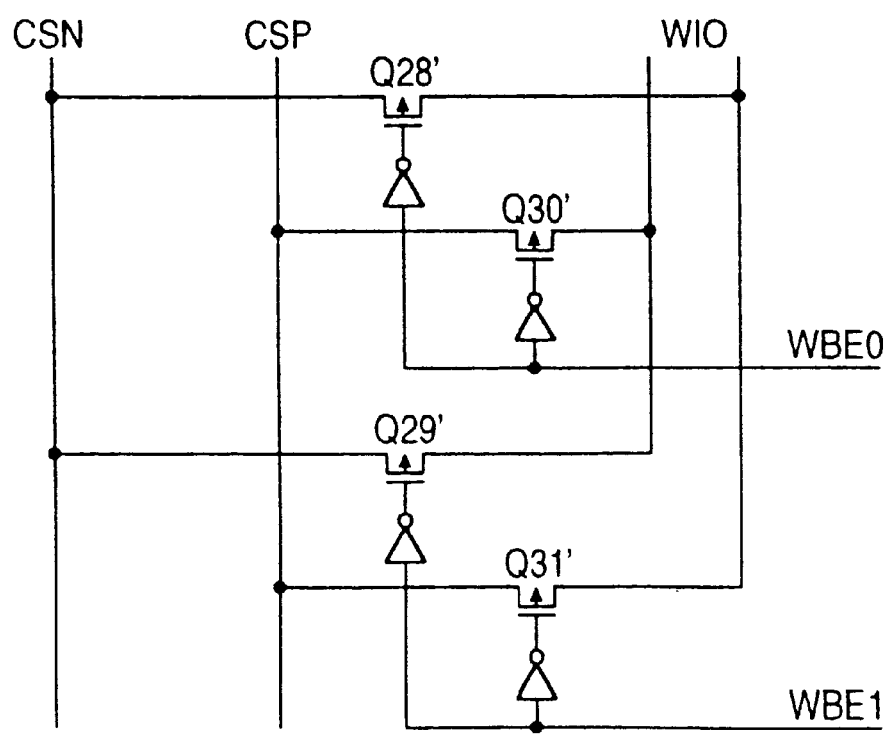
FIG. 20 is a circuit diagram showing another embodiment of a write buffer section of FIG. 19.

FIG. 20 shows the circuit configuration of another embodiment of the circuit to replace the write buffer WB of FIG. 19. When the write signals WEB0 and WEB1 are respectively at the high and low level, MOSFETs Q28' and Q30' turn on to thereby pass the write signal to the input/output line WIO. When the write signals WEB0 and WEB1 are respectively at the low and high level, MOSFETs Q29' and Q31' turn on to accordingly send the write signal, which is obtained by inverting the signal above, to the input/output line WIO.

Figure 21:
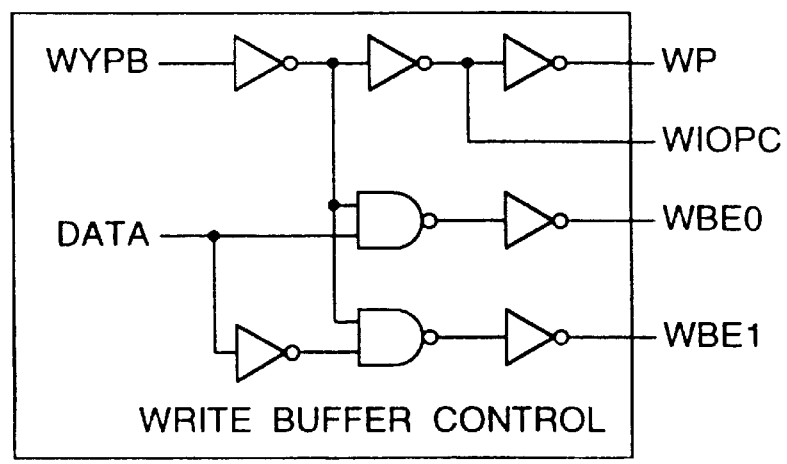
FIG. 21 is a circuit diagram showing a control section for the write buffer of FIG. 19.
Figures 22A, 22B:
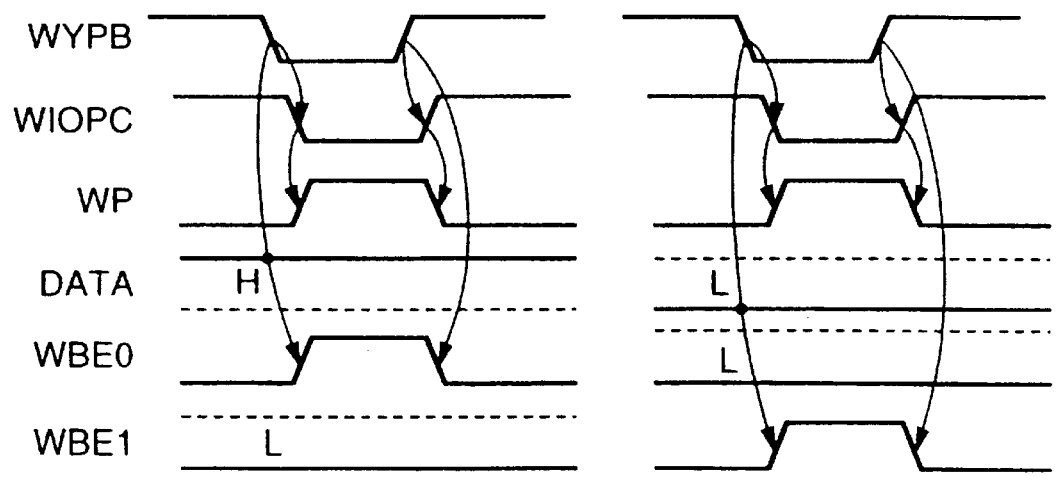
FIGS. 22A and 22B are diagrams of signal waveforms for explaining operation of the circuits of FIGS. 19 and 21.

FIG. 21 shows in a circuit diagram an embodiment of the write buffer controller WBC of FIG. 19. FIGS. 22A and 22B are diagrams of waveforms showing the operation of the circuit WBC of FIG. 21.

FIG. 22A representatively shows an operation to pass high-level information to the bit line BL. When a signal WYPB changes from a high level to a low level, a write input/output precharge signal WIOPC alters from a high level to a low level to set MOSFETs Q22 to Q24 to an off state. The write pulse signal WP is then changed from a low level to a high level to set the MOSFETs Q17 and Q18 to an on state. On receiving a falling edge of signal WYPB, a high level of data, and a low level of an inverted signal thereof, the write signal WEB0 is set to a high level to turn MOSFETs Q28 and Q30 on. The write signal WEB1 keeps the low level, i.e., remains in the off state such that MOSFETs Q29 and Q31 keep the off state. It is to be appreciated that the word line WL, signals SHL and SHR, and column selection signal YS, not shown, are in the write state.

FIG. 22B representatively shows an operation to transfer low-level information to the bit line BL. When a signal WYPB changes from a high level to a low level, the write input/output precharge signal WIOPC alters from a high level to a low level to set MOSFETs Q22 to Q24 to an off state. The write pulse signal WP is then changed from a low level to a high level to set the MOSFETs Q17 and Q18 to an on state. On receiving a falling edge of signal WYPB, a low level of data, and a high level of an inverted signal thereof, the write signal WEB0 keeps the low level, i.e., remains in the off state such that the MOSFETs Q28 and Q30 keep the off state. The write signal WEB1 is set to a high level to set the MOSFETs Q29 and Q31 to the on state. It is to be appreciated that the word line WL, signals SHL and SHR, and column selection signal YS, not shown, are in the write state.

Figure 23:
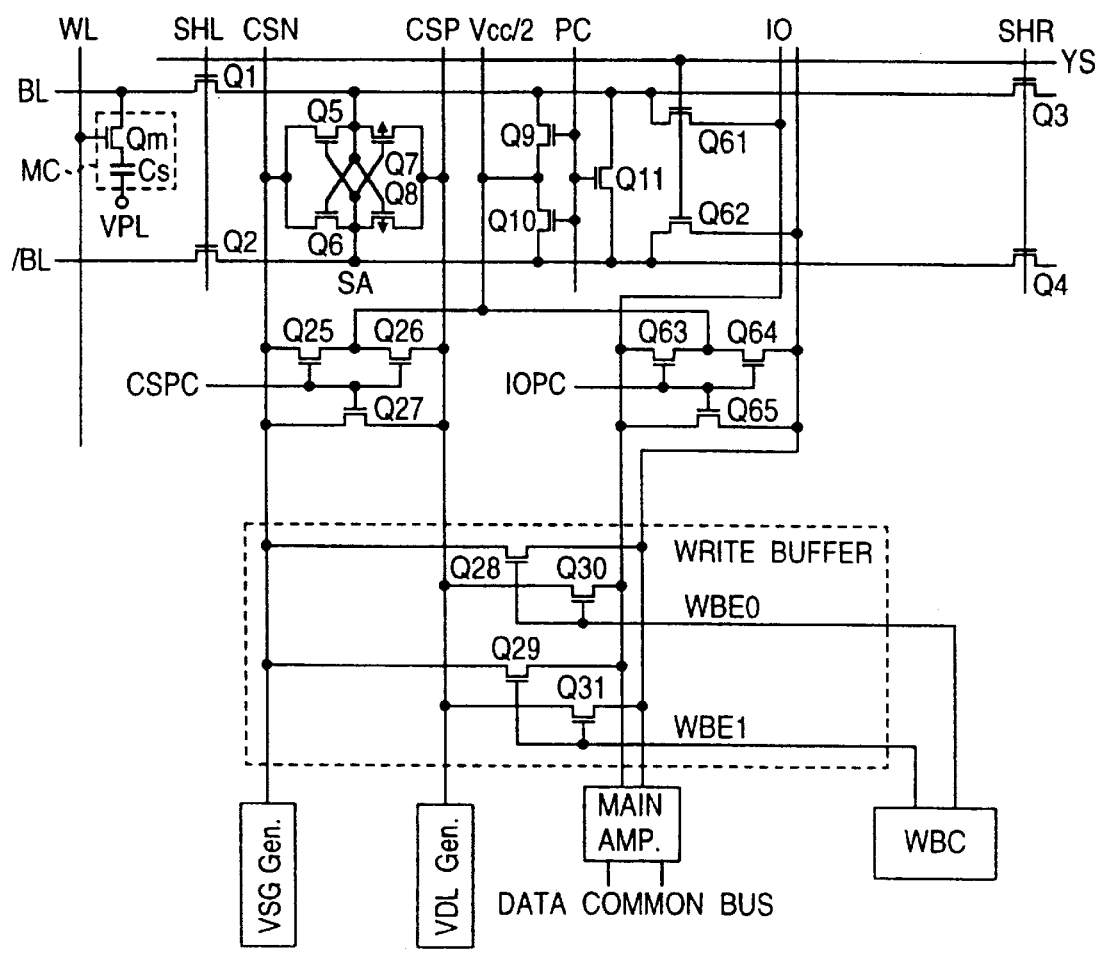
FIG. 23 is a circuit diagram showing the primary section of still another embodiment of the memory section of the dynamic RAM according to the present invention.

FIG. 23 shows another embodiment of the memory array of the dynamic RAM according to the present invention. The configuration of the embodiment representatively includes a word line WL, a pair of complementary bit lines BL and /BL, a sense amplifier SA and a precharge circuit, which are related to the bit lines, a read circuit, and a write circuit.

Like the configuration described above, the dynamic memory cell MC includes an address selection MOSFET Qm and an information storage capacitor Cs. The MOSFET Qm includes a gate connected to the word line WL, a source, and a drain. Either one of the source and drain is linked with the bit line BL and the remaining one of the source and drain is coupled with a storage node of the capacitor Cs. The remaining one of the electrodes of the capacitor Cs is commonly provided to receive a plate voltage VPL.

The paired bit lines BL and /BL are arranged in parallel to each other and are appropriately configured in an intersected structure for capacitance balance thereof when necessary. The complementary bit lines BL and /BL are connected respectively via switching MOSFETs Q1 and Q2 to the input/output nodes. The sense amplifier SA includes n-channel MOSFETs Q5 and Q6 and p-channel MOSFETs Q7 and Q8, the gates and drains of which are cross connected to constitute a latch structure. The n-channel MOSFETs Q5 and Q6 include sources linked with the common source line CSN, whereas the p-channel MOSFETs Q7 and Q8 have sources coupled with the common source line CSP. Disposed for the common source line CSP is a power switching MOSFET of the p-channel type, not shown, to receive the internal voltage VDL generated from the voltage generator VDLG. For the common source line CSN corresponding to the n-channel MOSFETs Q5 and Q6, there is arranged an n-channel MOSFET, not shown, to receive the internal voltage VSG produced from the voltage generator VSGG.

Between the input/output nodes of the sense amplifier SA is connected a precharge circuit including a MOSFET Q11 to establish a connection between the complementary bit lines and switching MOSFETs Q9 and Q10 to supply the half-precharge voltage VCC/2 to the complementary bit lines. The MOSFETs Q9 to Q11 have gates to which a precharge signal is commonly supplied. Disposed also for the common source lines CSP and CSN of the sense amplifier SA is a precharge circuit including a MOSFET Q27 to establish a connection between the common source lines CSP and CSN and switching MOSFETs Q25 and Q26 to supply the half-precharge voltage VCC/2 to the common source lines CSP and CSN. The MOSFETs Q25 to Q27 include gates to which a precharge signal CSPC is commonly supplied. The MOSFETs Q61 and Q62 receive the column selection signal YS via the gates to be thereby connected to the input/output lines IO. Between the input/output lines IO there is connected a precharge circuit including MOSFETs Q63 to Q65 to precharge the input/output lines IO to the half-precharge voltage VCC/2 so as to transfer an amplified signal to an input terminal of the main amplifier. The write buffer controller WBC is connected to the write signals WEB0 and WEB1 to control the write operation.

Figure 24:
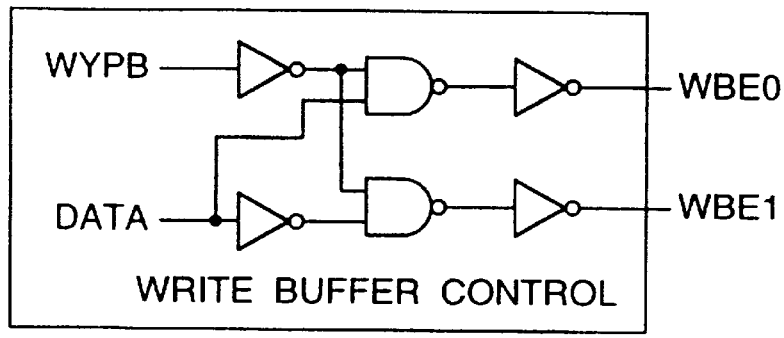
FIG. 24 is a circuit diagram showing a write buffer control section of FIG. 23.
Figure 25A:
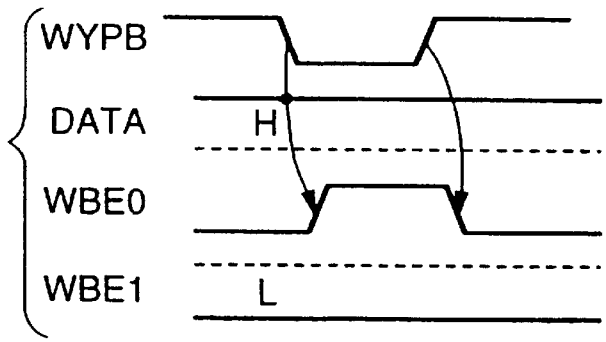
FIGS. 25A and 25B are diagrams of signal waveforms for explaining operation of the circuits of FIGS. 23 and 24.
Figure 25B:
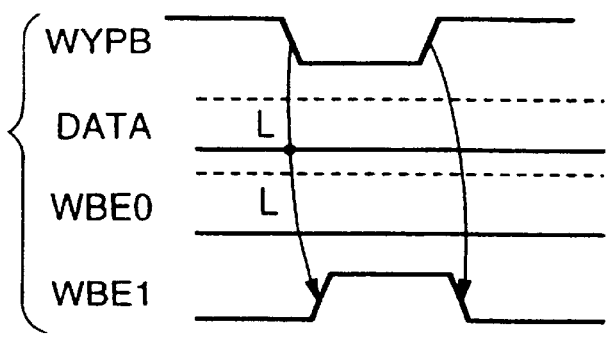

FIG. 24 representatively shows an embodiment of the write buffer controller WBC of FIG. 23. FIGS. 25A and 25B are diagrams showing operation waveforms of the write buffer controller WBC of FIG. 24.

FIG. 25A illustratively shows an operation to transfer high-level information to the bit line BL. When a falling edge of the signal WYPB, the high level of data, and the low level of the inverted signal thereof are received, the write signal WEB0 is set to a high level to turn the MOSFETs Q28 an Q30 on. The write signal WEB1 is kept in the low level to remain in the off state and hence the MOSFETs Q29 and Q31 are kept in the off state. It is to be appreciated, although not shown in the drawing, that the word line WL, signals SHL and SHR, and column selection signal YS are in the write state.

FIG. 25B representatively shows an operation to send low-level information to the bit line BL. When a falling edge of the signal WYPB, the low level of data, and the high level of the inverted signal thereof are received, the write signal WEB0 is kept at the low level to remain in the off state such that the MOSFETs Q28 an Q30 are kept in the off state. The write signal WEB1 is set to the high level to turn the MOSFETs Q29 and Q31 on. It is to be understood, although not shown, that the word line WL, signals SHL and SHR, and column selection signal YS are in the write state.

Figure 26:
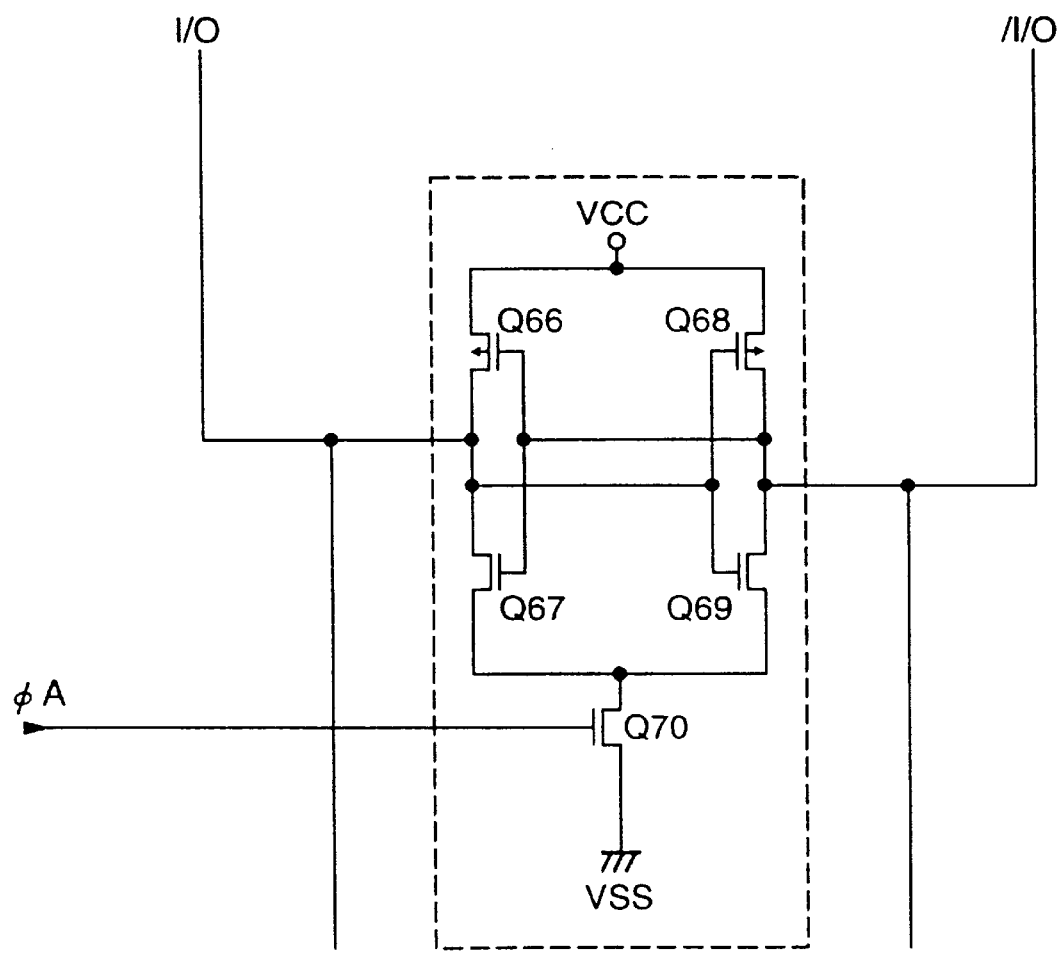
FIG. 26 is a circuit diagram showing a main amplifier section of FIGS. 19 and 23.

FIG. 26 shows the circuit configuration of an embodiment of the main amplifier MA which is represented with only a block in FIGS. 19 and 23. In the configuration of FIG. 26, although the invention is not particularly limited thereto, the drains of a p-channel MOSFET Q66 and an n-channel MOSFET Q67 are commonly connected to each other, the gates of MOSFET Q66 and Q67 are commonly connected to each other, the drains of a p-channel MOSFET Q68 and an n-channel MOSFET Q69 are commonly connected to each other, the gates of MOSFET Q68 and Q69 are commonly connected to each other, and the MOSFETs Q66 and Q67 and MOSFETs Q68 and Q69 are respectively coupled with each other in a latch structure. The sources of p-channel MOSFETs Q66 and Q68 are connected to the power supply voltage VCC and the sources of the n-channel MOSFETs Q67 and Q69 are coupled with the ground potential via an n-channel MOSFET Q70 serving as a main amplifier operation switch.

When the main amplifier activation signal φA is changed from a low level to a high level indicating a significant or activation level, the MOSFET Q70 turns on to enable the main amplifier to perform its amplifying operation. In FIG. 26, to facilitate understanding of the description, the input/output line I/O includes a line I/O for a signal I/O and a line /I/O for an inverted signal /I/O. When a signal at quite a low level is supplied to the input/output signal line I/O and a signal at quite a low level is delivered to the input/output signal line /I/O from the bit lines respectively via column switches, not shown, amplification is carried out such that the MOSFET Q66 turns on, the MOSFET Q67 turns off, the MOSFET Q68 turns off, and the MOSFET Q69 turns on, whereby the power supply voltage is supplied via the MOSFET Q66 to the input/output signal line I/O and the ground potential is fed via the MOSFET Q69 to the input/output signal line /I/O.

Figure 27:
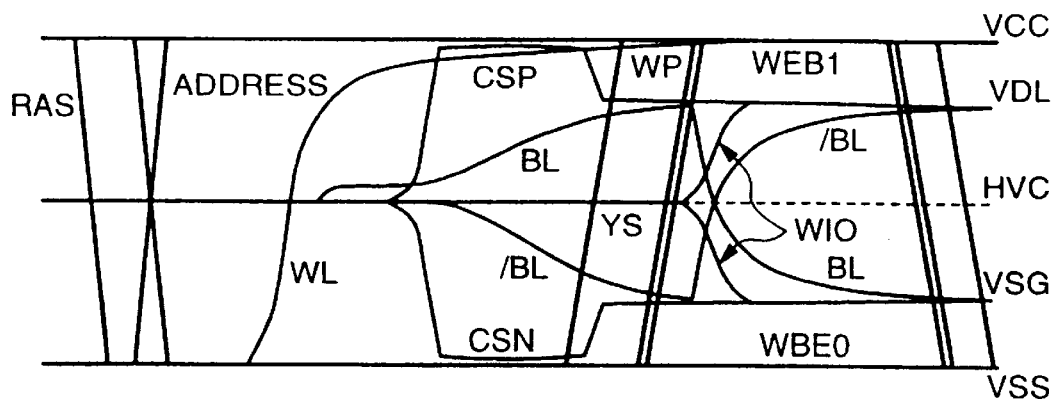
FIG. 27 is a diagram of signal waveforms for explaining a memory write operation of FIG. 19.
Figure 28:
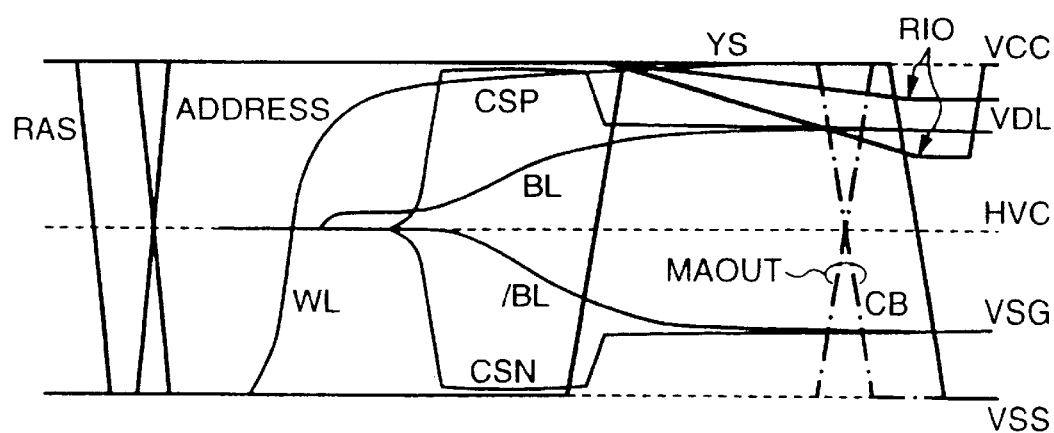
FIG. 28 is a diagram of signal waveforms for explaining a memory read operation of FIG. 19.
Figure 29:
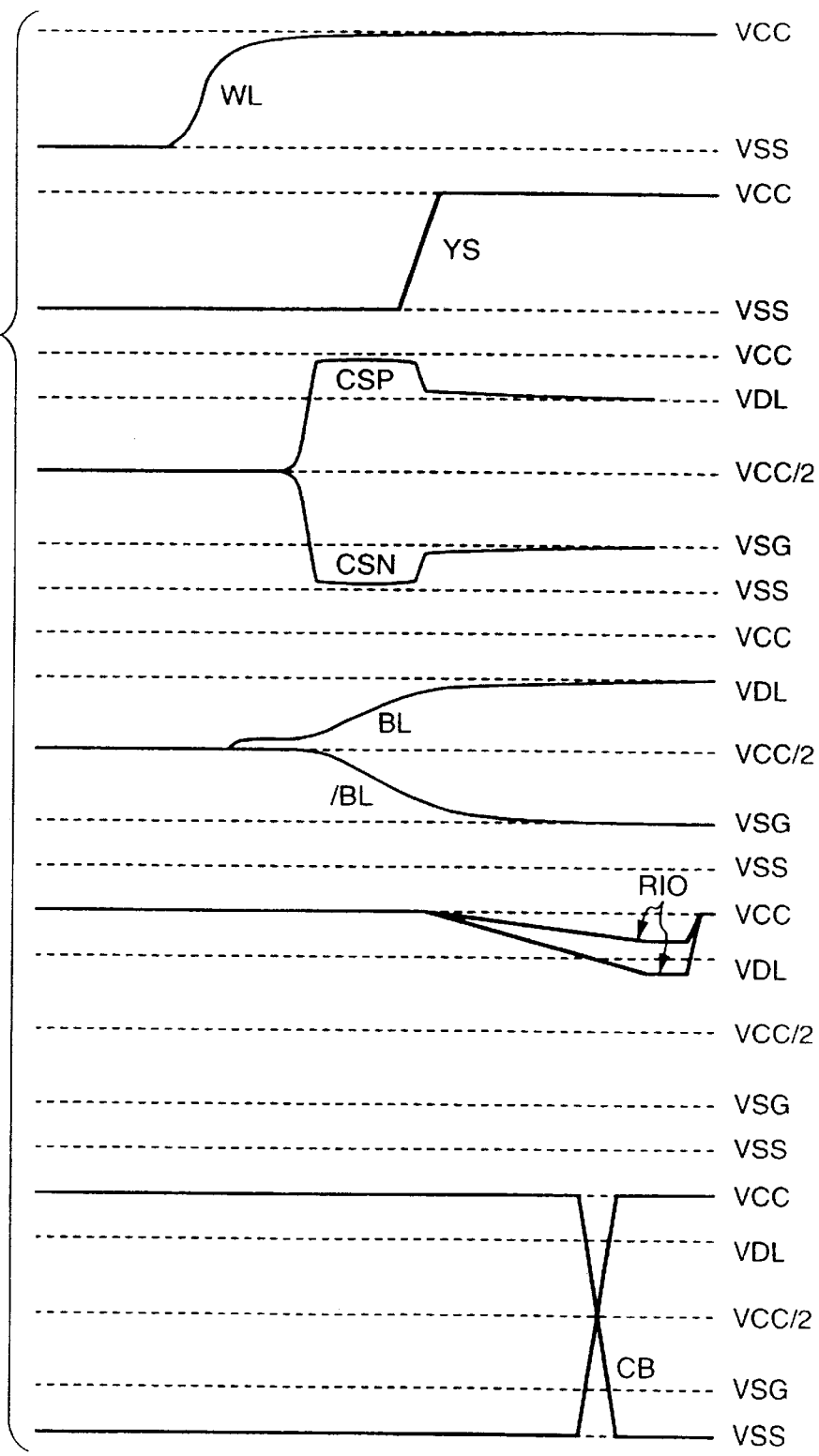
FIG. 29 is a diagram of signal waveforms for explaining in detail the memory write operation related to FIG. 27.

FIGS. 27 and 28 are diagrams of waveforms for explaining the operation of the embodiment of FIG. 19. FIG. 29 is a diagram showing in detail the waveforms of FIG. 27, whereas FIG. 30 shows in detail the diagram of FIG. 28.

Figure 30:
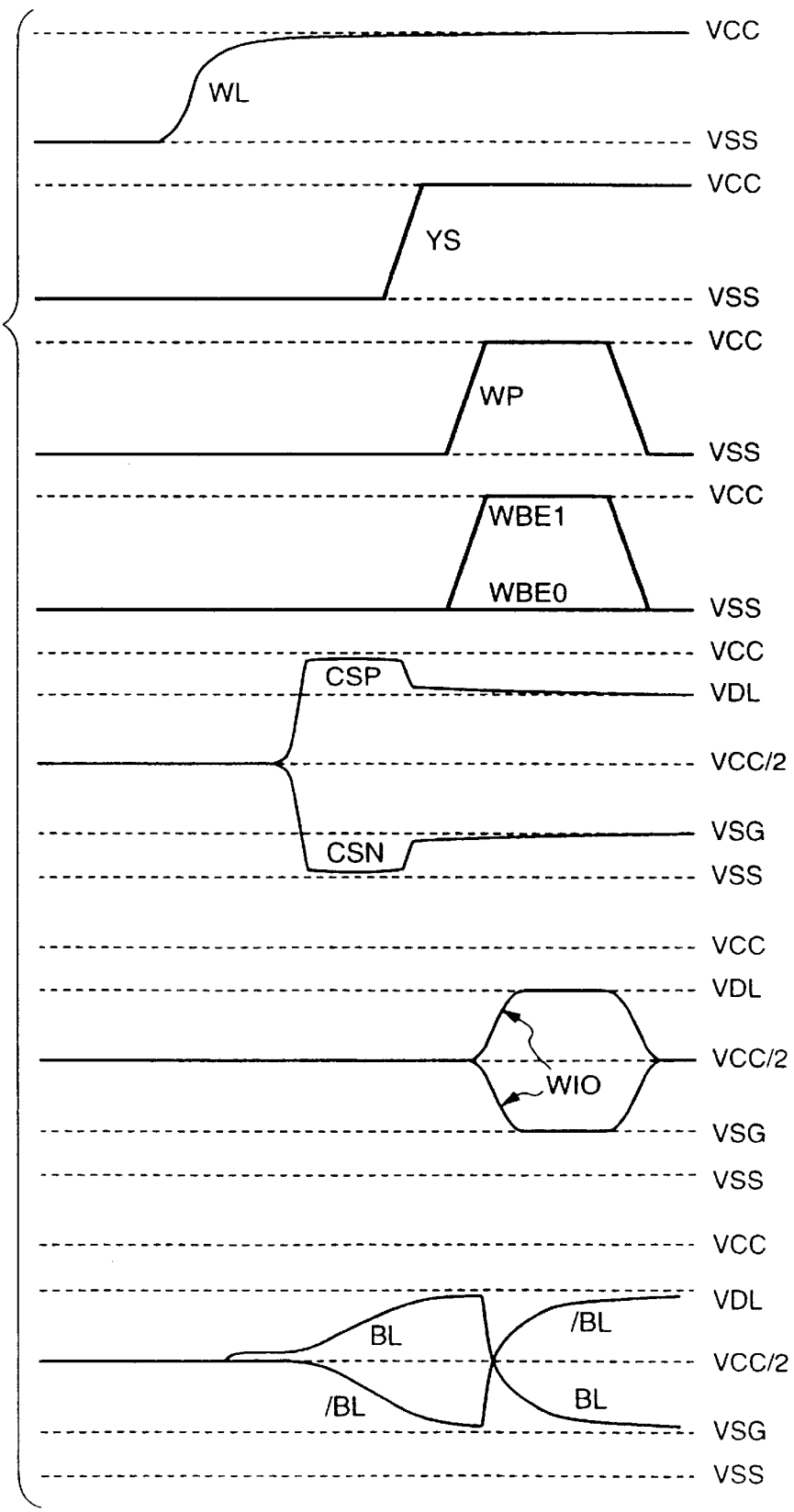
FIG. 30 is a diagram of signal waveforms for explaining in detail the memory read operation related to FIG. 28.

FIGS. 27 and 29 show waveforms to explain a write operation associated with the write I/O line WIO, whereas FIGS. 28 and 30 are diagrams of waveforms to explain a write operation related to a read I/O line RIO.

In FIGS. 27 and 29, an address signal address is obtained at a timing synchronized with the falling edge of the row address strobe signal RAS, not shown in FIG. 29. When the row selection is achieved, the word line WL is changed from a low level such as the level of the circuit ground potential VSS to a high level of, for example, the power supply voltage VCC. Due to the high level of the word line, one of the bit lines BL and /BL (BL in this case) undergoes a change of quite a low voltage corresponding to information charge in the selected memory cell. In response to the overdrive pulse, the sense amplifier conducts its operation to increase the potential discrepancy between the bit lines BL and /BL. Although the invention is not especially limited thereto, the column selection signal YS is set to the selection level at a timing synchronized with the falling edge of the overdrive pulse. A write pulse is then produced such that when the write signal WEB1 is at the high level, the potential states above that of bit lines BL and /BL are inverted.

In FIGS. 28 and 30, the address signal ADDRESS is acquired in synchronism with the falling edge of the row address strobe signal RAS, not shown in FIG. 30. A row selection is accordingly carried out and then the word line WL is changed from a low level, e.g., ground potential VSS to a high level, e.g., power source voltage VCC. Due to the rising of the word line potential, one of the bit lines BL and /BL (BL in FIGS. 28 and 30) is set to quite a small voltage corresponding to information charge of the selected memory cell. In response to the overdrive pulse, the sense amplifier achieves an operation to increase the potential difference between the bit lines BL and /BL. The column selection signal YS is set to the selection level, although the invention is not particularly limited thereto, at a timing substantially synchronized with the falling edge of the overdrive pulse and then a read signal WP is supplied to the input/output line RIO dedicated to the read operation. The signal is then amplified by the main amplifier such that an output signal MAOUT of the main amplifier is determined and is outputted immediately when the bit lines BL and /BL reach respectively VDL and VSG.

Figure 31:
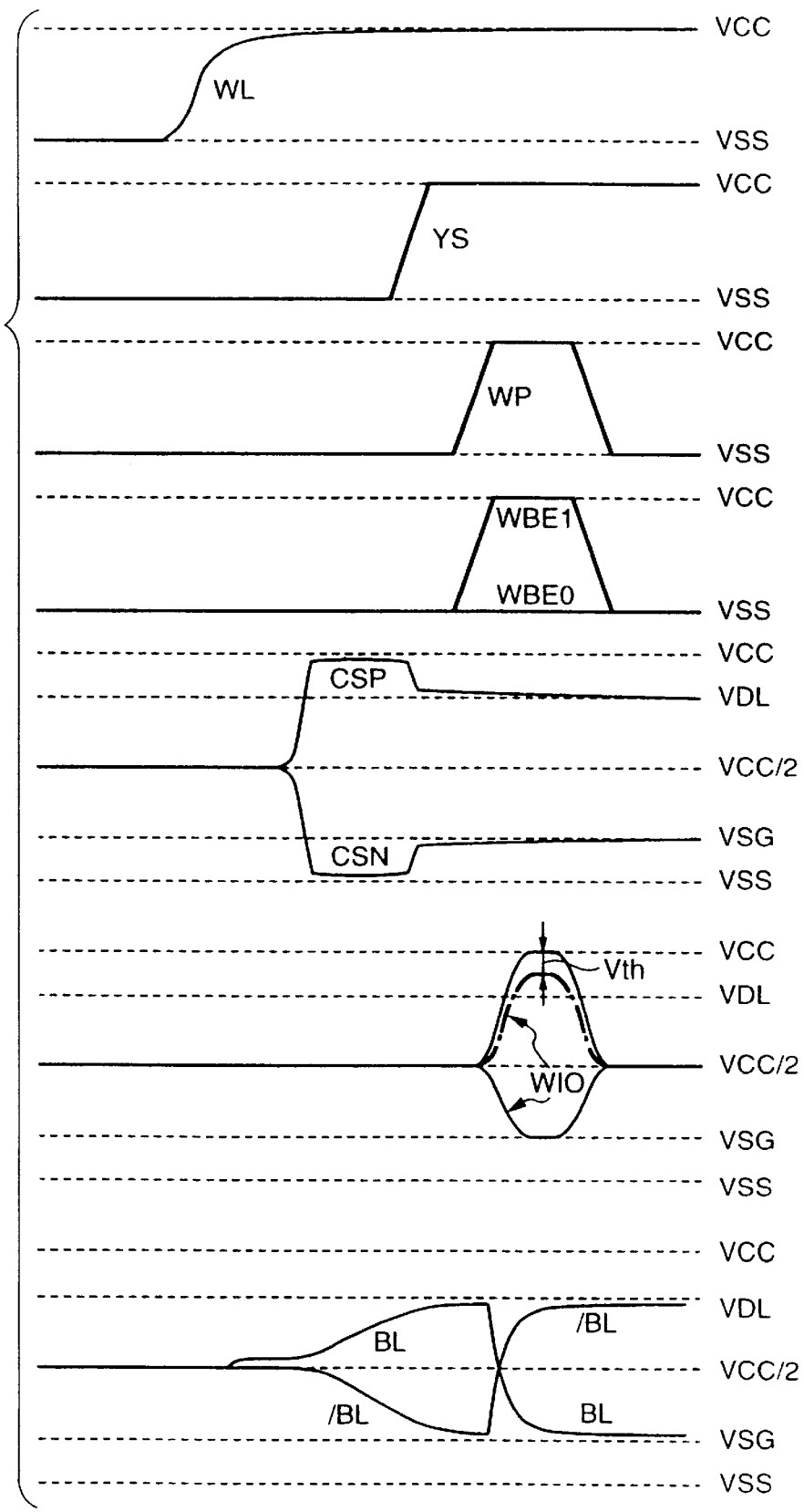
FIG. 31 is a diagram of signal waveforms for explaining an overdrive memory write operation of FIG. 19.

FIG. 31 is a graph of waveforms to explain the overdrive write operation related to the input/output line WIO for the write operation.

In FIG. 31, at the falling edge of the row address strobe signal RAS, the address signal is acquired, not shown. A row selection is accomplished such that the word line WL is changed from a low level, e.g., ground potential VSS to a high level, e.g., power source voltage VCC. Due to the rising of the word line potential, one of the bit lines BL and /BL (BL in FIG. 31) is set to quite a small voltage corresponding to information charge of the selected memory cell. In response to the overdrive pulse, the sense amplifier carries out an operation to increase the potential discrepancy between the bit lines BL and /BL. The column selection signal YS is set to the selection level, although the invention is not particularly limited thereto, at a timing substantially synchronized with the falling edge of the overdrive pulse. Thereafter, a read signal WP is generated and the potential state above that of the bit lines BL and /BL is inverted when the write signal WEB1 is at the high level. Of the write I/O line WIO, the portion indicated by a broken line corresponds to a case in which the write buffer of the circuit diagram shown in FIG. 19 includes n-channel MOSFETs Q28 to Q31. The portion indicated by a solid line is associated with a case in which the write buffer of the circuit diagram shown in FIG. 20 includes p-channel MOSFETs Q28' to Q31'. As can be seen from the drawings, there exists a difference of the threshold voltage (Vth) between the write signals respectively in the cases using the p-channel MOSFETs Q28' to Q31' and the n-channel MOSFETs Q28 to Q31, respectively.

Figure 32A:
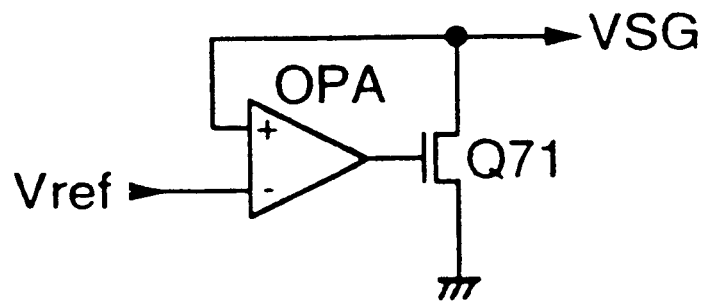
FIGS. 32A and 32B are circuit diagrams showing an embodiment of a voltage generating circuit VSGG according to the present invention.
Figure 32B:
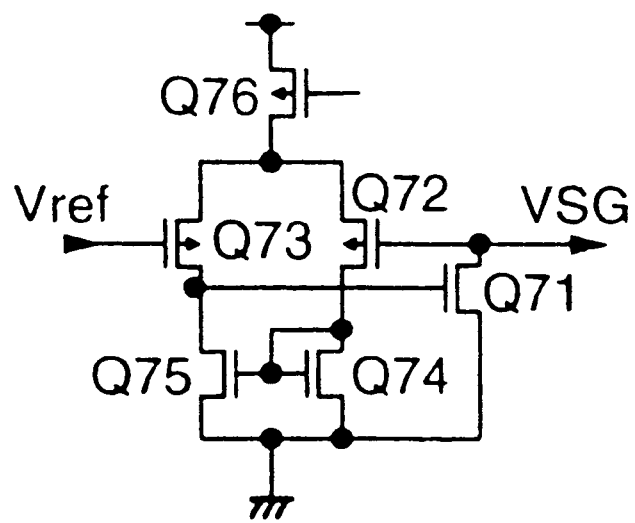

FIGS. 32A and 32B show in circuit diagrams an embodiment of the voltage generator VSGG.

While FIG. 32A is a functional circuit diagram, FIG. 32B specifically shows the circuit configuration. As shown in FIG. 32A, the voltage generator VSG determining the level on the low-level side and hence can be constructed in a simple structure in which an n-channel MOSFET Q71 is supervised by a voltage comparator OPA. In short, the output voltage VSG is compared with the reference voltage Vref by the comparator OPA. For VSG>Vref, the MOSFET Q71 is turned on to cause a current to flow therethrough; whereas, for VSG≦Vref, the MOSFET Q71 is turned off. In the operation of the sense amplifier, the creation of the low level is an operation to discharge the precharge voltage of the bit line to VSG. Consequently, it is only necessary to control the discharge MOSFET as the power supply circuit.

FIG. 32B specifically shows the circuit construction of the voltage comparator OPA. The circuit OPA includes p-channel MOSFETs Q73 and Q72 in a differential structure such that the voltages Vref and VSG are supplied to the gates of Q73 and Q72, respectively. Disposed on the drain side of the differential MOSFETs Q72 and Q73 are n-channel MOSFETs Q74 and Q75 in a current mirror configuration as a load circuit to generate an amplified signal, thereby controlling the MOSFET Q71.

A circuit to produce a voltage VDL in association with the power supply voltage can also be configured in a similar circuit structure. Namely, it is only required to replace the n-channel MOSFETs with the p-channel MOSFETs to supply the reference voltage Vref thereto. It is accordingly only required that the reference voltage Vref of the internal voltage generator VSGG on the low-level side is set to 0.65 V and the reference voltage Vref of the internal voltage generator VDL on the high-level side is set to 2.65 V. The voltage 2.65 V of this case is not created on the basis of VSS. Namely, since the level of the power supply voltage VCC is shifted 0.65 V to obtain the voltage 2.65 V, the voltage change takes place according to the change in the power supply voltage VCC, which advantageously leads to an increased operational margin.

Figures 33A, 33B:
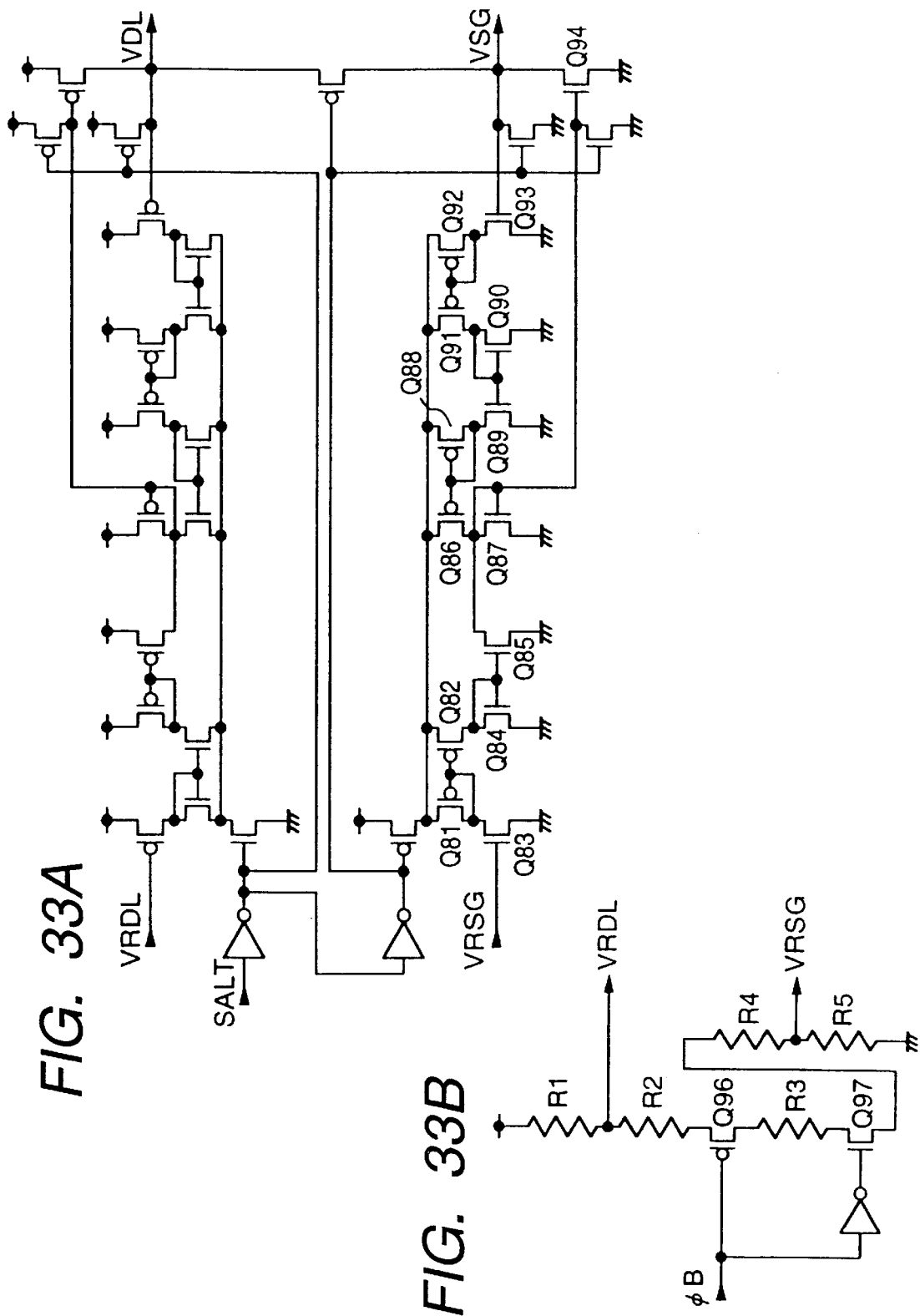
FIGS. 33A and 33B are circuit diagrams showing another embodiment of a voltage generating circuit VSGG according to the present invention.

FIGS. 33A and 33B shows circuit diagrams of another embodiment of the voltage generator discussed above. FIG. 33B shows a voltage generating circuit for the reference voltage generator of FIG. 33A. FIG. 33A specifically shows in a circuit diagram the VDL generator VDLG and VSG generator VSSG. The VSG generator VSGG includes a current converter circuit including MOSFETs Q90 to Q93 for changing the level of the VSG as an output therefrom through a current conversion and supplying a current according to the VSG level, a current converter including MOSFETs Q81 to Q84 for accomplishing a current conversion for the reference voltage VRSG from the circuit of FIG. 33B and for supplying a current according to the level of reference voltage VRSG, a subtracter circuit including MOSFETs Q85 to Q89 to detect any current discrepancy between the circuits indicated above, and a MOSFET Q94 for supplying a current according to the difference outputted from the subtracter circuit.

In the current converter circuit including MOSFETs Q90 to Q93, the p-channel MOSFET Q91 is connected in series to the n-channel MOSFET Q90 and the p-channel MOSFET Q92 is connected in series to the n-channel MOSFET Q93. The p-channel MOSFETs Q91 and 92 are coupled via the p-channel MOSFET Q95 with the power supply voltage. The p-channel MOSFETs Q91 and 92 have gate electrodes commonly connected to respective drain electrodes of p-channel MOSFET Q92 and n-channel MOSFET Q93. The n-channel MOSFETs Q90 to Q93 possess source electrodes linked with the ground potential VSS. According to the level of voltage VSG, a current flows through the n-channel MOSFET Q93. Thanks to the current mirror operation, a current identical to the current above also flows through the MOSFETs Q90 and Q91.

In the current converter including MOSFETs Q81 to Q84, the p-channel MOSFET Q81 is connected in series to the n-channel MOSFET Q83 and the p-channel MOSFET Q82 is connected in series to the n-channel MOSFET Q84. The p-channel MOSFETs Q81 and Q82 are coupled via the p-channel MOSFET Q95 with the power supply voltage. The p-channel MOSFETs Q81 and Q82 include gate electrodes commonly connected to respective drain electrodes of p-channel MOSFET Q81 and n-channel MOSFET Q83. The n-channel MOSFETs Q83 to Q84 possess source electrodes linked with the ground potential VSS. According to the level of the reference voltage VRSG, a current flows through the n-channel MOSFET Q83. Due to the current mirror operation, a current identical to the current above also flows through the MOSFETs Q82 and Q84.

In the subtracter including the MOSFETs Q85 to Q89, the n-channel MOSFETs Q85 and Q87 are connected to each other in a parallel fashion and the n-channel MOSFET Q86 is connected in series thereto. The n-channel MOSFETs Q85 and Q87 include source electrodes coupled with the ground potential, whereas the n-channel MOSFET Q86 has a source electrode linked via the p-channel MOSFET Q95 to the power source voltage. The n-channel MOSFET Q85 includes a gate electrode coupled with the drain and gate electrode of the n-channel MOSFET Q84 such that the drain current of MOSFET Q85 is equal to that of the MOSFET Q84 as a result of the current mirror operation.

Additionally, the p-channel MOSFET Q88 is connected to the n-channel MOSFET Q89 in a series manner. The p-channel MOSFET Q88 includes a source electrode linked via the n-channel MOSFET Q95 to the power supply voltage, whereas the p-channel MOSFET Q89 has a source electrode connected to the ground potential VSS. The p-channel MOSFETs Q86 and Q88 include gate electrodes commonly connected to the drain electrodes respectively of the p-channel MOSFET Q88 and the n-channel MOSFET Q89. The drain current of MOSFET Q89 is equal to that of the n-channel MOSFET Q90. Furthermore, a current flows through the p-channel MOSFET Q86 thanks to the current mirror operation. Resultantly, through the n-channel MOSFET 87, there flows a current equal to the difference between the currents respectively passing through the p-channel MOSFET Q86 and n-channel MOSFET Q85.

The MOSFET Q94 to supply the current according to the differential output from the subtracter has a source electrode coupled with the ground potential VSS. The gate of the n-channel MOSFET Q93 is connected to the drain of the MOSFET Q94. The gate of the MOSFET Q94 is connected to the gate and drain of the n-channel MOSFET Q87.

The p-channel MOSFET Q95 receives the timing signal SALT to control the voltage generator described above. As can be understood from the drawings, the VDL generator is, although not specifically described, a circuit whose operation is substantially opposite to that of the VSG generator.

FIG. 33B shows the reference voltage generator. In this configuration, resistors R1 and R2 as well as R3 an R4 are respectively connected in series to each other and a MOSFET Q96 has a source or drain connected in series to a resistor R3, which is connected in series to a MOSFET Q97. Moreover, the resistor R2 is linked in series with the source or drain of the MOSFET Q96 and the MOSFET Q97 is connected in series to the resistor R4. The VDL voltage reference signal VRDL is supplied through a connection point between the resistors R1 and R2. A connection point between the resistors R4 and R5 is coupled with the gate of the n-channel MOSFET Q83 to deliver the VSG voltage reference signal VRSG therefrom. One of the MOSFETs Q96 and Q97 receives a control signal φB via the gate thereof such that the MOSFETs Q96 and Q97 are simultaneously turned on or off. The other one thereof receives a control signal φB through an inverter circuit. Thanks to this, when the MOSFETs Q96 and Q97 are simultaneously turned on, there are created reference voltages VRDL and VRSG determined according to the resistors R1 to R5.

Figure 34:
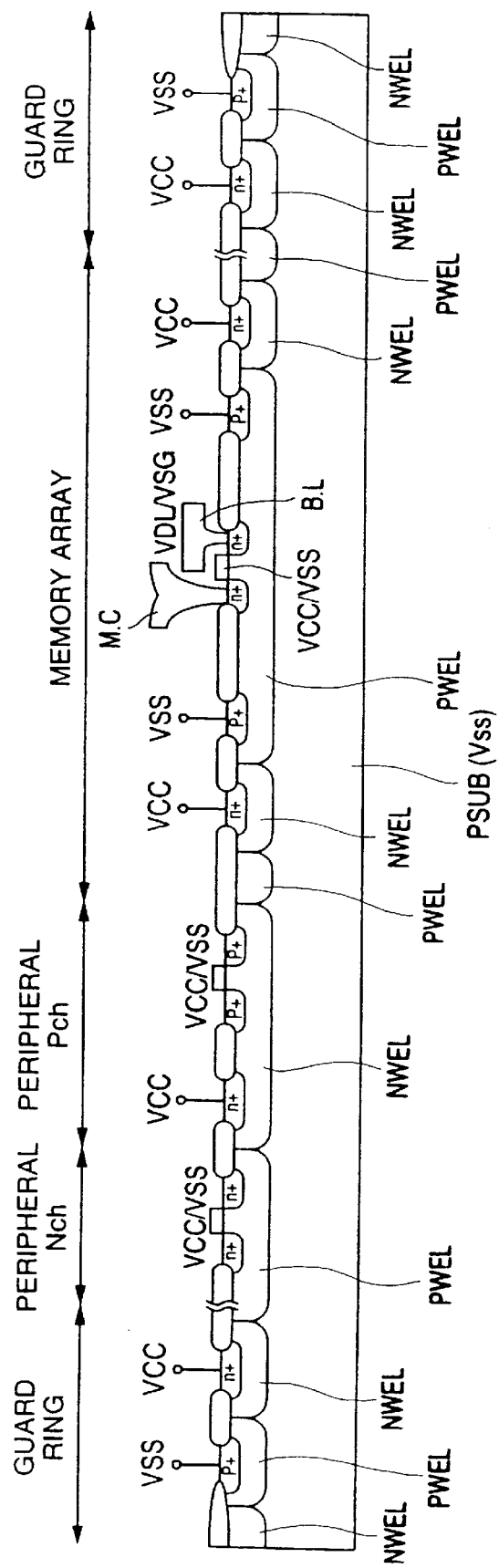
FIG. 34 is a cross-sectional view showing constituent elements of an embodiment of the semiconductor IC device according to the present invention.

FIG. 34 is a cross-sectional view of an embodiment of the semiconductor IC device according to the present invention. In the embodiment, a p-type substrate PSUB is adopted as the semiconductor substrate, and n-channel MOSFETs constituting the memory array and its peripheral circuit are not directly fabricated on the p-type substrate, but are manufactured on a p-type well region PWELL formed on the p-type substrate. Moreover, p-channel MOSFETs are fabricated on an n-type well region NWELL formed on the p-type substrate. There may occur a disadvantageous event in which minority carriers generated in the peripheral circuit reach the semiconductor region for the memory array and then enter the storage node of a memory cell to resultantly clear the information charge therein. To prevent this from occurring, there is provided a guard ring to absorb the minority carriers.

The ground potential VSS is applied to a first P well region PWELL in which n-channel MOSFETs of the memory array are fabricated. Although the invention is not particularly limited thereto, for example, the ground potential VSS is applied to a second P well region PWELL in which n-channel MOSFETs of the memory array are manufactured.

In this way, like the semiconductor IC including a static RAM, read-only memory (ROM), or a logical circuit, the substrate PSUB is supplied with circuit ground potential VSS. This resultantly improves the matching between the dynamic RAM according to the present invention and the memory control circuit, such as a microprocessor.

Figure 35A:
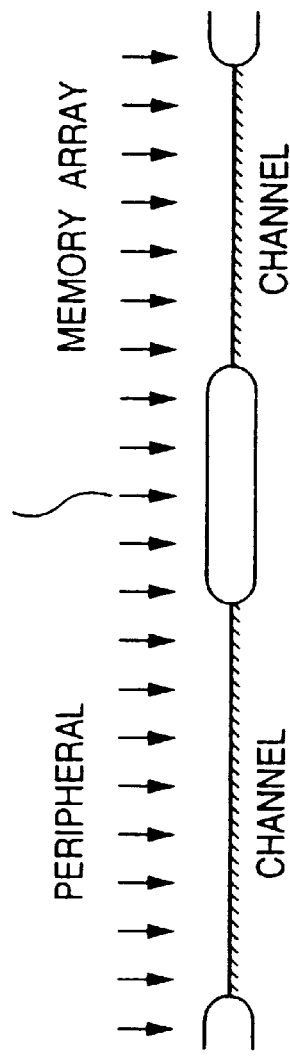
FIGS. 35A to 35C are cross-sectional diagrams of the primary section of the semiconductor IC device according to the present invention for explaining an embodiment of the production process thereof.
Figure 35B:
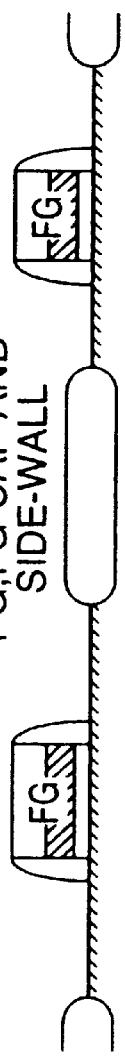
Figure 35C:
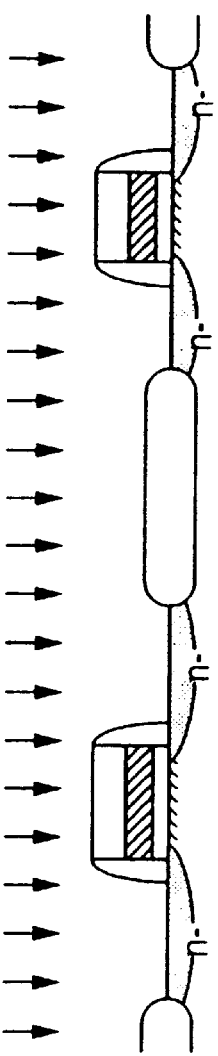

FIGS. 35A to 35C are cross-sectional views to explain the production process of an embodiment of the semiconductor integrated circuit according to the present invention. In these drawings, p-channel regions are not shown. The configuration of FIGS. 35A to 35C representatively includes n-channel MOSFETs of the memory array section and n-channel MOSFETs of the peripheral circuit section. In FIG. 35A, a field insulator layer is fabricated on a surface of the substrate except for the device regions. Using the layer as a mask, ion implantation is conducted to determine the impurity concentration of the channel region. In the circuit of the embodiment, the ion implantation can be achieved for the memory array and peripheral sections in one process. Thanks to the ion implantation, the n-channel MOSFETs have a low threshold voltage of about 0.65 V.

In FIG. 35B, there are manufactured a first polycrystalline silicon layer FG, FG caps, and sidewalls. In FIG. 35C, an ion implantation (NM implantation) is carried out to form n⁻ source and drain regions having a low impurity concentration for operation with a high voltage or the like. In this embodiment, since the n-channel MOSFETs constituting the circuit blocks fabricated in the semiconductor integrated circuit can be fabricated in almost the same process as for the memory array section, peripheral section, and dynamic RAM as described above, the circuit manufacturing process is quite simplified.

FIGS. 36A to 36E are cross-sectional views to explain the production process of another embodiment of the semiconductor integrated circuit according to the present invention. In these drawings, p-channel well domains are not shown. FIGS. 36A to 36E representatively show n-channel MOSFETS of the memory array section and n-channel MOSFETs of the peripheral circuit. The processes respectively of FIGS. 36A and 36C are almost the same as the process above excepting a portion thereof. That is, in FIG. 36A, a field insulator film is fabricated on a surface of the substrate except for the device region. Using the film as a mask, an ion implantation is conducted to determine the impurity concentration in the channel region. In the circuit of the embodiment, the memory array and peripheral sections are fabricated in one process. The n-channel MOSFETs have a low threshold value of about 0.65 due to the ion implantation.

In FIG. 36B, there are formed a first polycrystalline silicon layer FG and FG caps. In FIG. 36C, an ion implantation (NM implantation) is carried out to form n⁻ source and drain regions having a low impurity concentration for an operation with a high voltage or the like. In FIG. 36D, there are manufactured sidewalls in the gate electrode regions. In FIG. 36E, on the gate side, an ion implantation (NH implantation) is effected using the sidewalls as a mask to form n⁻ source and drain region regions having a high impurity concentration. According to the embodiment, since the n-channel MOSFETs of the circuit blocks fabricated in the semiconductor integrated circuit can be fabricated in almost the same process as for the memory array section, peripheral section, and dynamic RAM as described above, the circuit manufacturing process is quite simplified as described above.

Figure 37:
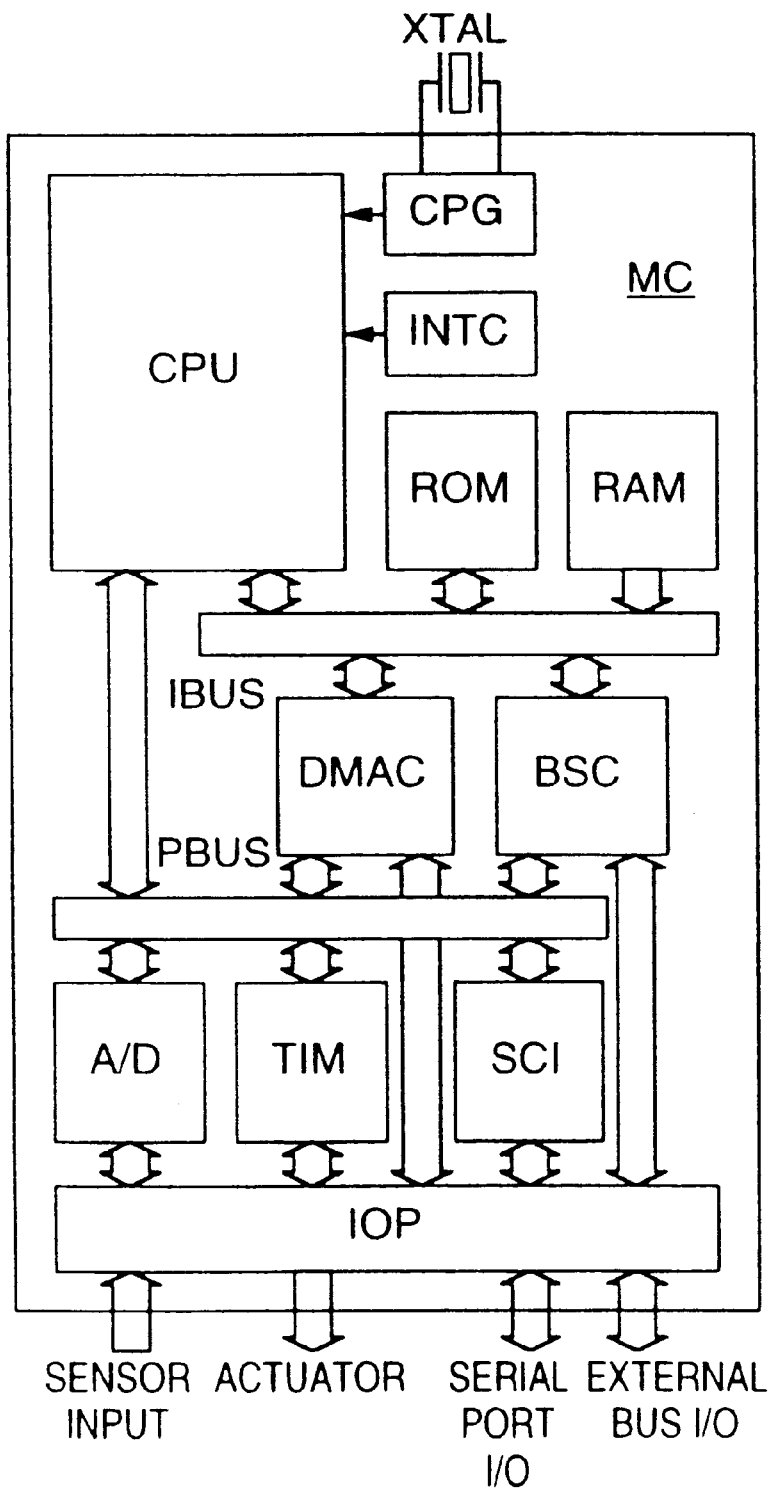
FIG. 37 is a block diagram showing an embodiment of a microcomputer to which the present invention is applied.

FIG. 37 is a block diagram of an embodiment of a microcomputer MC (digital processing device) according to the present invention. In the microcomputer of the embodiment, a central processing unit (CPU) of a stored program system is employed as its basic constituent element. Connected to the unit CPU are a clock generator CPG, an interruption controller INTC, an internal bus (IBUS), and a peripheral bus (PBUS). While the clock generator CPG is linked via a pair of external terminals with a crystal oscillator XTAL having a predetermined frequency of normal mode of vibration, the internal bus IBUS is coupled with a ROM, a RAM, a DMA controller DMAC, and a bus state controller BSC. Additionally, the peripheral bus PBUS is linked with the DMA controller DMAC, bus state controller BSC, an analog-to-digital converter A/D, a timer circuit TIM, and a serial communication interface SCI.

The microcomputer MC of the embodiment includes an input/output port IOP. When the I/O port IOP is used in a system mounted on an automobile, one side of the I/O port IOP is connected to the DMA controller DMAC, bus state controller BSC, analog-to-digital converter A/D, timer TIM, and serial communication interface SCI and the other side thereof is linked with a sense input terminal, an actuator output terminal, a serial port input/output terminal, and an external bus input/output terminal. When the microcomputer MC is set to a RAM write monitor state, the sensor input terminal is connected to various sensors to measure, for example, the temperature of water in the engine and the flow rate of air. Moreover, the actuator terminal is linked with a controller to adjust the fuel injection rate, whereas the serial port input/output terminal is connected to a predetermined monitor tool.

The clock generator CPG generates a clock signal having a frequency corresponding to the characteristic frequency of the crystal oscillator XTAL to supply the signal to the respective constituent components such as the central processing unit CPU of the microcomputer MC. The processing unit CPU operates in synchronism with the clock signal from the clock generator CPG to achieve a step-by-step operation according to a control program stored in the ROM to execute predetermined logical and arithmetic processing. Moreover, the CPU controls and supervises operations of the constituent components of the microcomputer MC. In addition, the ROM includes a mask ROM or flash memory to store therein a control program and fixed data necessary for the operation of the CPU. The RAM includes a high-speed rewritable memory such as a dynamic RAM to temporarily store therein data resultant from operations of the CPU and sensor data inputted from external sensors. The interruption controller INTC receives an interruption request from each component of the microcomputer MC to accept the request according to a predetermined priority order and then sends the interruption request to the CPU.

The DMA controller CMAC supports data communications between, for example, the internal RAM and an external memory linked with the microcomputer MC without any intervention of the CPU, whereas the bus state controller BSC supports accesses to, for example, a memory linked with an external bus. The analog-to-digital converter A/D converts analog signals from various external sensors into digital signals, each signal including a predetermined bit. The serial communication interface SCI supports data communications for the operation of external serial input/output apparatuses according to the start stop synchronization or clock synchronization. The timer circuit TIM measures time according to clock signals to selectively generate at a predetermined timing, for example, a control pulse to drive an external actuator.

Like the circuit blocks described above, the dynamic RAM according to the present invention does not require a substrate back bias. Namely, the substrate is supplied with the circuit ground potential VSS. Therefore, the dynamic RAM satisfactorily matches the other circuits constituting, for example, the CPU and hence can be mounted on such circuits. This removes the restriction of the use of the dynamic RAM that the RAM cannot be mounted on the semiconductor integrated circuit together with the circuits described above due to the relationship with respect to the substrate back bias. This consequently leads to an increase and expansion of the fields of utilization of the dynamic RAM.

Figure 38:
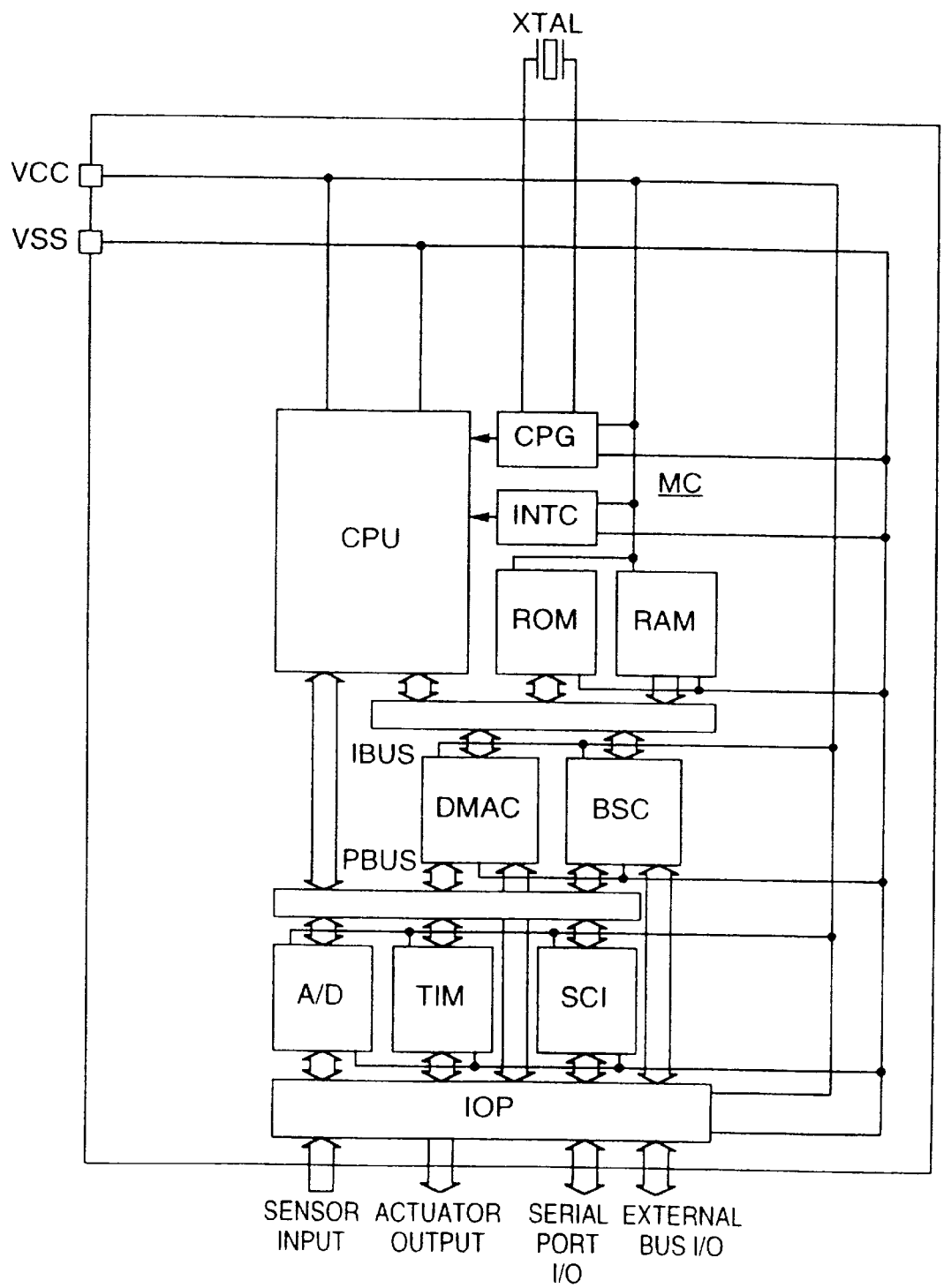
FIG. 38 is a block diagram showing the voltage supply system of the microcomputer system of FIG. 37.

FIG. 38 is a block diagram to explain the voltage supply of the microcomputer (digital processing device) of FIG. 37. In operation, the ground potential VSS and power supply voltage VCC are supplied to the CPU, clock generator CPG, interruption controller INTC, real-only memory ROM, random access memory RAM, DMA controller DMAC, bus state controller BSC, analog-to-digital converter A/D, timer circuit TIM, serial communication interface SCI and input/output port IOP. The present invention is applicable to a random access memory RAM. In conjunction with FIGS. 37 and 38, description has been given of an embodiment of a microcomputer MC (digital processor). The present invention is also applicable to a one-chip microcomputer fabricated on one semiconductor substrate.

Figure 39:
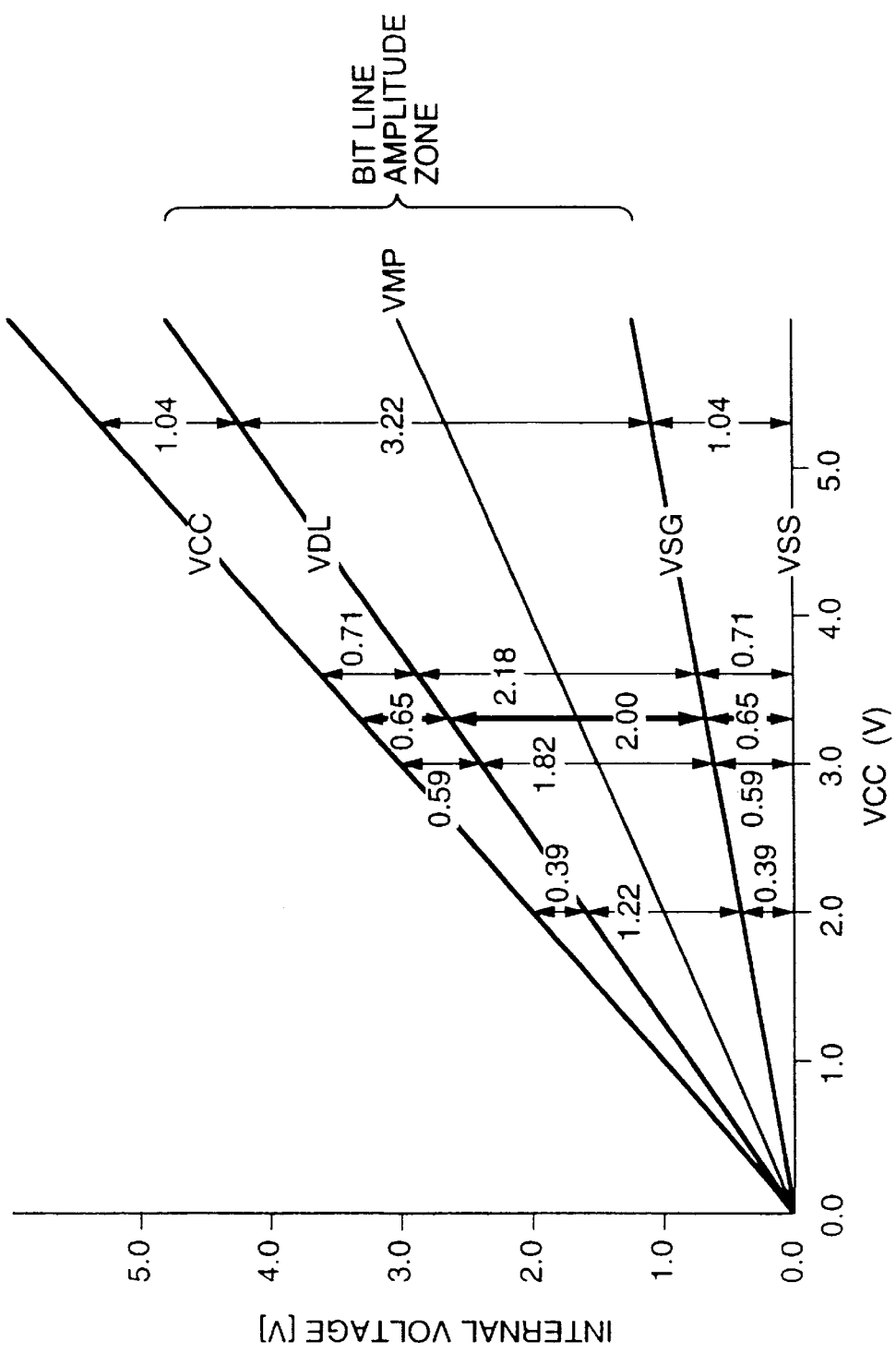
FIG. 39 is a graph showing a characteristic of main voltage levels of the semiconductor device according to the present invention.

FIG. 39 is a graph showing a characteristic of the primary voltage levels according to the present invention. When the precharge voltage VMP is equal to one half of the power supply voltage VCC, the internal voltage VDL is set to an intermediate value between the word selection level (equal to the power supply voltage VCC) and the precharge voltage VMP and the internal voltage VSG is set to an intermediate value between the precharge level VMP and the ground potential VSS. In other words, the relationship between the word selection level, internal voltage VDL, internal voltage VSG, precharge voltage VMP, and ground potential VSS is represented as Word selection level>Internal voltage VDL>precharge voltage VMP>Internal voltage VSG>Ground potential VSS.

The embodiment above leads to the following advantages.

(1) There is generated a first internal voltage having a difference from the power supply voltage, the difference being substantially equal to the threshold voltage of the address selection MOSFET of the dynamic memory cell. The first internal voltage is supplied as an operating voltage of the sense amplifier on the high-level side. The system generates a second internal voltage having a difference from the circuit ground potential, the difference being substantially equal to a predetermined value. The second internal voltage is delivered as an operating voltage of the sense amplifier on the low-level side. A write signal having a high level corresponding to the first internal voltage and a write signal having a low level associated with the second internal voltage are generated by the write amplifier to supply the signals to the complementary bit lines to which the dynamic memory cell is connected. Supplied to the word line connected to the dynamic memory cell are a selection level which is a high level such as the power source voltage and a non-selection level which is a low level such as the circuit ground potential. In this way, the substrate back bias voltage generator and the booster circuit to generate the selection level of the word line can be dispensed with. Consequently, there is attained an advantageous feature in that the circuit is simplified and the power consumption is minimized.

(2) Thanks to the feature (1) above, the substrate back bias voltage is unnecessary and hence the operation speed of the peripheral circuit is advantageously increased. Moreover, since the well need not be constructed in a three-layer structure to attain the high-speed feature, the production process can be simplified.

(3) The differential voltage between the second internal voltage and the circuit ground potential is set to be equal to that between the power supply voltage and the first internal voltage and the bit line precharge voltage is set to an intermediate voltage between the first and second internal voltages such that a circuit is established between the complementary bit lines through an amplifying operation. As a result, the precharge voltage can be advantageously generated without any substantial current consumption.

(4) The write amplifier receives the operating voltage on the high-level side from the first internal voltage decreasing circuit and the operating voltage on the low-level side from the second internal voltage decreasing circuit. Resultantly, the circuit can be simplified and there can be attained a satisfactory matching with the write level.

(5) There are employed p-channel and n-channel switching MOSFETs which are kept in the on state for a predetermined period of time from when the sense amplifier starts its operation to when the amplified signals of the complementary bit lines reaches the first and second internal voltages. Thanks to the switching MOSFETs, the power supply voltage and circuit ground potential are supplied thereto to achieve an overdrive operation, which leads to the advantage of high-speed amplification.

(6) The pulse which turns on the switching MOSFET achieving the overdrive operation is generated by a logical product or AND gate circuit receiving an operation timing signal of the sense amplifier and a signal obtained by inverting and delaying the timing signal. The delay circuit to delay the signal includes a CMOS inverter circuit. The CMOS inverter includes a plurality of series connected MOSFETs to cause a current to flow for the creation of the delay signal. Thanks to this configuration, a desired overdrive pulse can be advantageously obtained by a reduced number of constituent elements.

(7) Between two sets of complementary bit lines disposed on the right and left sides of the sense amplifier, there is disposed a MOSFET to selectively establish a connection between the sense amplifier and either one of the complementary bit lines, the MOSFET undergoing a switch control operation by a low-level selection signal of which the high and levels respectively correspond to the power supply voltage and circuit ground potential. The input/output node of the sense amplifier coupled via the read amplifier with a read line. The output signal from the write amplifier is linked via the write line to the input/output node. This leads to an advantage that the circuit configuration is simplified and the operation speed thereof is increased.

(8) The address selection MOSFETs of the dynamic memory cell and the n-channel MOSFETs other than the address selection MOSFETs are fabricated with mutually different p-type well regions. This advantageously prevents the drawback in which the minority carriers generated in the peripheral circuit reach the accumulation node of the dynamic memory cell to reduce the information retention time of the memory cell.

(9) There is manufactured a dynamic RAM in which there is generated a first internal voltage having a difference from the power voltage, the difference being substantially equal to the threshold voltage of the address selection MOSFET of the dynamic memory cell. The first internal voltage is supplied as an operating voltage of the sense amplifier on the high-level side. The system generates a second internal voltage having a difference from the circuit ground potential, the difference being substantially equal to a predetermined value. The second internal voltage is delivered as an operating voltage of the sense amplifier on the low-level side. A write signal having a high level corresponding to the first internal voltage and a write signal having a low level associated with the second internal voltage are generated by the write amplifier to supply the signals to the complementary bit lines to which the dynamic memory cell is connected. Supplied to the word line connected to the dynamic memory cell are a selection level which is a high level such as the power source voltage and a non-selection level which is a low level such as the circuit ground potential. When the dynamic RAM and at least one memory control circuit for controlling a memory access to the dynamic RAM are mounted on one semiconductor integrated circuit, there is advantageously attained a semiconductor IC device having a novel function.

The present invention has been specifically described with reference to various embodiments. However, the present invention is not restricted by the embodiments. It is to be appreciated that the embodiments can be modified and changed in various ways within the scope and spirit of the present invention. For example, the input/output lines may be shared between the write and read operations. In this case, like the embodiment of FIG. 12, the internal voltage generators VDLG and VSGG generating the operating voltage of the sense amplifier SA may be used to generate the operating voltage of the write amplifier. Alternatively, it may also be possible for the write amplifier to supply a write signal which has a level less than the high and low levels of the complementary bit lines and which performs a function to invert the operation of the sense amplifier. Thereafter, the voltages VDL and VSG are generated through the amplifying operation of the sense amplifier to achieve the write operation in the memory cell. The other constituent components of the dynamic memory RAM may be constructed in various configurations.

In addition to the structure including the operational amplifier and an output MOSFET, the voltage generator circuit to create the internal voltages VDL and VSG may be configured to have various constructions, for example, in a structure in which according to the threshold voltage of the MOSFET in a simple diode configuration, the power supply voltage VCC is shifted to create VDL and the ground potential VSS is shifted to obtain VSG. Additionally, the differential voltage between VCC and VDL need not necessarily be equal to that between VSG and VSS. To full-write operation of the memory cell, the differential voltage between VCC and VDL is required to be equal to or more than the threshold voltage of the address selection MOSFET Qm. The voltage difference between VSS and MSG need only satisfy the off characteristic of the address selection MOSFET Qm when the low level is to be sustained.

The dynamic RAM according to the present invention need only be configured with dynamic memory cells. Namely, the dynamic memory may be, for example a synchronous RAM, a protocol control RAM, a quasi-static RAM having an interface compatible with a static RAM, and a two-port memory having random and serial input/output ports.

The semiconductor IC device according to the present invention may be, in addition to the one-chip microcomputer of the embodiment, a semiconductor IC device including the various types of dynamic RAM and a memory controller to control the memory access to the RAM, the device having various circuit functions.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor storage device formed on a semiconductor substrate, the substrate including:
    a memory array including at least one word line, at least one pair of complementary data lines, and memory cells disposed in association with crosspoints between the word line and the complementary data lines;
    a sense amplifier coupled with the paired complementary data lines, a first voltage line, and a second voltage line;
    a word line driver linked with the word line;
    a first voltage terminal;
    a second voltage terminal;
    a first voltage generator circuit;
    a second voltage generator circuit; and
    a write circuit,
    wherein:
    the memory cell includes a MOSFET and a capacitor including a pair of electrodes,
    the MOSFET includes a gate connected to the word line and two source-drain routes, one of the source-drain routes being coupled with one of the paired data lines;
    one of the paired electrodes of the capacitor is linked with a remaining one of the source-drain routes of the MOSFET;
    the first voltage terminal is supplied with a first voltage from an external device;
    the second voltage terminal is supplied with a second voltage from an external device;
    the first voltage generator circuit receives the first and second voltages and outputs to the first voltage line a third voltage higher than the first voltage and lower than the second voltage;
    the second voltage generator circuit receives the first and second voltages and outputs to the second voltage line a fourth voltage higher than the third voltage and lower than the second voltage;
    the word line driver supplies the first or second voltage to the word line, and
    wherein the write circuit provides the complementary data lines with a write signal having a high level corresponding to the fourth voltage and a low level corresponding to the third voltage.

2. A semiconductor storage device according to claim 1, wherein the second voltage is higher than a voltage obtained by adding the fourth voltage to a threshold voltage of the MOSFET.

3. A semiconductor storage device according to claim 2, wherein the third voltage is higher than a voltage obtained by adding the first voltage to the threshold voltage of the MOSFET.

4. A semiconductor storage device according to claim 1, wherein the first voltage is applied to a region in which a channel of the MOSFET is fabricated.

5. A semiconductor storage device according to claim 1, wherein:
    the MOSFET is manufactured in a p-type well region; and
    the first voltage is applied to the p-type well region.

6. A semiconductor storage device according to claim 1, wherein:
    the first voltage is a ground potential; and
    the second voltage is a power supply voltage.

7. A semiconductor storage device according to claim 1, wherein:
    the sense amplifier includes:
        a first p-channel MOSFET including a source coupled with the first voltage line;
        a second p-channel MOSFET including a source coupled with the first voltage line;
        a first n-channel MOSFET including a source coupled with the second voltage line;
        a second n-channel MOSFET including a source coupled with the second voltage line;
    the first p-channel and n-channel MOSFETs include gates linked with one of the paired complementary data lines;
    the second p-channel and n-channel MOSFETs include gates linked with a remaining one of the paired complementary data lines;
    the first p-channel and n-channel MOSFETs include drains linked with the gate of the second p-channel MOSFET; and
    the second p-channel and n-channel MOSFETs include drains linked with the gate of the first p-channel MOSFET.

8. A semiconductor storage device according to claim 7, wherein the first voltage is applied to a region in which a channel of the MOSFET is fabricated.

9. A semiconductor storage device according to claim 7, wherein:
    the MOSFET is manufactured in a p-type well region; and
    the first voltage is applied to the p-type well region.

10. A semiconductor storage device formed on a semiconductor substrate, the substrate including:
    a memory array including a plurality of word lines, a plurality of pairs of complementary data lines, and a plurality of dynamic memory cells disposed in association with crosspoints between the plural word lines and the plural pairs of complementary data lines;

a plurality of sense amplifier coupled with the plural paired complementary data lines, a first common source line, and a second common source line;

a word line driver linked with the plural word lines;

a first voltage terminal;

a second voltage terminal;

a first voltage generator circuit;

a second voltage generator circuit; and a write circuit;

wherein:

the plural memory cells include an address selection MOSFET and an information storage capacitor including a pair of electrodes, the first voltage terminal is supplied with a first voltage from an external device;

the second voltage terminal is supplied with a second voltage from an external device;

the first voltage generator circuit receives the first and second voltages and outputs to the first common source line a third voltage higher than the first voltage and lower than the second voltage;

the second voltage generator circuit receives the first and second voltages and outputs to the second common source line a fourth voltage higher than the third voltage and lower than the second voltage;

the word line driver supplies the second voltage to one of the word lines and the first voltage to the other of the word lines; and wherein the write circuit provides the complementary data lines with a write signal having a high level corresponding to the fourth voltage and a low level corresponding to the third voltage.

11. A semiconductor storage device according to claim 10, wherein the second voltage is higher than a voltage obtained by adding the fourth voltage to a threshold voltage of the address selection MOSFET.

12. A semiconductor storage device according to claim 11, wherein the third voltage is higher than a voltage obtained by adding the first voltage to the threshold voltage of the address selection MOSFET.

13. A semiconductor storage device according to claim 10, wherein the first voltage is applied to a region in which a channel of the address selection MOSFET is fabricated.

14. A semiconductor storage device according to claim 10, wherein:

the address selection MOSFET is manufactured in a p-type well region; and the first voltage is applied to the p-type well region.

15. A semiconductor storage device according to claim 10, wherein:

the first voltage is a ground potential; and the second voltage is a power supply voltage.

16. A semiconductor storage device according to claim 10, wherein:

each of the plural sense amplifiers includes:

a first p-channel MOSFET including a source coupled with the first common source line;

a second p-channel MOSFET including a source coupled with the first common source line;

a first n-channel MOSFET including a source coupled with the second common source line;

a second n-channel MOSFET including a source coupled with the second common source line;

the first p-channel and n-channel MOSFETs include gates linked with one of the paired complementary data lines;

the second p-channel and n-channel MOSFETs include gates linked with the remaining one of the paired complementary data lines;

the first p-channel and n-channel MOSFETs include drains linked with the gate of the second p-channel MOSFET; and the second p-channel and n-channel MOSFETs include drains linked with the gate of the first p-channel MOSFET.

17. A semiconductor storage device according to claim 16, wherein the first voltage is applied to a region in which a channel of the address selection MOSFET is fabricated.

18. A semiconductor storage device according to claim 16, wherein:

the address selection MOSFET is manufactured in a p-type well region; and the first voltage is applied to the p-type well region.

* * * * *